(12) United States Patent
Lee et al.

(10) Patent No.: US 10,243,022 B2
(45) Date of Patent: Mar. 26, 2019

(54) IMAGE SENSORS AND METHODS OF FORMING IMAGE SENSORS

(71) Applicant: Samsung Electronics Co., Ltd., Suwon-si, Gyeonggi-do (KR)

(72) Inventors: Kwang-min Lee, Seoul (KR); Kyoung-won Na, Seoul (KR); Dong-mo Im, Seoul (KR); Jung-wook Lim, Gunpo-si (KR); Seok-jin Kwon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/350,201

(22) Filed: Nov. 14, 2016

(65) Prior Publication Data

US 2017/0170238 A1   Jun. 15, 2017

(30) Foreign Application Priority Data

Dec. 15, 2015   (KR) ........................ 10-2015-0179205

(51) Int. Cl.
*H01L 27/30* (2006.01)
*H01L 27/146* (2006.01)
*H01L 51/44* (2006.01)

(52) U.S. Cl.
CPC ........ *H01L 27/307* (2013.01); *H01L 27/1463* (2013.01); *H01L 27/1464* (2013.01); *H01L 27/14612* (2013.01); *H01L 27/14621* (2013.01); *H01L 27/14627* (2013.01); *H01L 27/14643* (2013.01); *H01L 27/14665* (2013.01); *H01L 27/14685* (2013.01); *H01L 27/14687* (2013.01); *H01L 51/442* (2013.01); *H01L 51/447* (2013.01); *H01L 2251/301* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 8,541,858 B2 | 9/2013 | Kokubun | |
| 8,836,839 B2 | 9/2014 | Choo et al. | |
| 8,933,527 B2 | 1/2015 | Chu et al. | |
| 2011/0298074 A1* | 12/2011 | Funao | H01L 27/14629 257/432 |
| 2014/0001454 A1 | 1/2014 | Miyanami et al. | |
| 2014/0375826 A1 | 12/2014 | Lee et al. | |
| 2015/0001663 A1 | 1/2015 | Lee et al. | |
| 2015/0060774 A1 | 3/2015 | Liang et al. | |
| 2015/0188064 A1 | 7/2015 | Kim et al. | |
| 2015/0255498 A1 | 9/2015 | Sugiura | |

FOREIGN PATENT DOCUMENTS

JP   2014-067948   4/2014

* cited by examiner

*Primary Examiner* — Fernando L Toledo
*Assistant Examiner* — Valerie N Newton
(74) *Attorney, Agent, or Firm* — Myers Bigel, P.A.

(57) ABSTRACT

Image sensors are provided. An image sensor includes a color filter layer. The image sensor includes a metal structure adjacent a sidewall of the color filter layer. The image sensor includes an insulating layer on the color filter layer. Moreover, the image sensor includes an electrode layer on the insulating layer. Methods of forming image sensors are also provided.

20 Claims, 53 Drawing Sheets

IMAGE SENSORS AND METHODS OF FORMING IMAGE SENSORS

CROSS-REFERENCE TO RELATED APPLICATION

This U.S. non-provisional patent application claims the benefit of Korean Patent Application No. 10-2015-0179205, filed on Dec. 15, 2015, in the Korean Intellectual Property Office, the disclosure of which is hereby incorporated herein by reference in its entirety.

BACKGROUND

The present disclosure relates to image sensors. Image sensors that take and convert images into electrical signals are used not only in electronic devices for general consumers such as a digital camera, a camera for a cellular phone, and a portable camcorder, but also in cameras mounted in an automobile, a security system, and a robot. It may be beneficial for an image sensor that includes a photodiode to provide miniaturization and high resolution.

SUMMARY

Provided are methods and image sensors using an organic photoelectric layer.

According to some embodiments of present inventive concepts, an image sensor may include a semiconductor substrate including a photoelectric transducer. The image sensor may include a color filter layer on the semiconductor substrate. The image sensor may include a metal structure on the semiconductor substrate and adjacent a sidewall of the color filter layer. The image sensor may include an insulating layer on the color filter layer. Moreover, the image sensor may include a transparent electrode layer on the insulating layer and connected to the metal structure through an opening of the insulating layer.

In some embodiments, the image sensor may include a transparent layer on the color filter layer. The insulating layer may be between respective portions of the transparent layer and the transparent electrode layer. Moreover, the respective portion of the transparent layer may be a first portion, and the transparent electrode layer may contact a second portion of the transparent layer through the opening of the insulating layer.

According to some embodiments, the image sensor may include an organic photoelectric layer on the transparent electrode layer. The insulating layer may include a protruding portion thereof that protrudes toward the organic photoelectric layer. The protruding portion of the insulating layer may include an uppermost surface that is coplanar with an uppermost surface of the transparent electrode layer. Moreover, the protruding portion of the insulating layer may overlap the color filter layer.

In some embodiments, the metal structure may include a tungsten portion and an aluminum portion on the tungsten portion. The transparent electrode layer may contact the aluminum portion. Moreover, sidewalls of the aluminum portion of the metal structure may be tapered toward the transparent electrode layer.

According to some embodiments, the metal structure may include tungsten that contacts the transparent electrode layer. Additionally or alternatively, the insulating layer may extend onto a portion of the metal structure, and a first width of the metal structure may be wider than a second width of the opening through which the transparent electrode layer connects to the metal structure.

In some embodiments, the image sensor may include a metal contact in the semiconductor substrate. The metal structure may contact the metal contact and may include different first and second metallic materials. The first metallic material may contact the metal contact. Moreover, the second metallic material may be on the first metallic material, may contact the transparent electrode layer, and may be wider than the first metallic material.

According to some embodiments, the second metallic material may be on opposing first and second sidewalls of the first metallic material. The metal contact and/or the metal structure may include a tapered width.

In some embodiments, the color filter layer and the photoelectric transducer may include a first color filter layer and a first photoelectric transducer, respectively. Moreover, the image sensor may include a second color filter layer on a second photoelectric transducer. The metal structure may be between the first and second color filter layers. The image sensor may include a transparent organic layer between the first color filter layer and a first portion of the insulating layer and between the second color filter layer and a second portion of the insulating layer.

According to some embodiments, a surface of the transparent organic layer may be coplanar with a surface of the metal structure that contacts the transparent electrode layer. Additionally or alternatively, the image sensor may include an organic photoelectric layer on the transparent electrode layer. The second portion of the insulating layer may include a protruding portion thereof that protrudes toward the organic photoelectric layer and isolates a first portion of the transparent electrode layer that is on the first color filter layer from a second portion of the transparent electrode layer that is on the second color filter layer.

In some embodiments, the transparent electrode layer may contact a portion of the transparent organic layer through the opening of the insulating layer. Additionally or alternatively, the insulating layer may overlap opposing first and second sidewalls of the metal structure.

An image sensor, according to some embodiments, may include a color filter layer. The image sensor may include a metal structure adjacent a sidewall of the color filter layer. The image sensor may include a transparent layer on the color filter layer. The image sensor may include an insulating layer on the transparent layer. Moreover, the image sensor may include an electrode layer on the insulating layer. The insulating layer may be between respective portions of the transparent layer and the electrode layer.

In some embodiments, the image sensor may include an organic photoelectric layer on the electrode layer. The insulating layer may be on a portion of the metal structure. The electrode layer may be connected to the metal structure through an opening of the insulating layer. Moreover, a first width of the metal structure may be wider than a second width of the opening through which the electrode layer connects to the metal structure.

An image sensor, according to some embodiments, may include first and second color filter layers. The image sensor may include a metal structure between respective sidewalls of the first and second color filter layers. The image sensor may include an insulating layer on the first and second color filter layers. The image sensor may include an electrode layer on the insulating layer. Moreover, the image sensor may include an organic photoelectric layer on the electrode layer. The insulating layer may include a protruding portion thereof that protrudes toward the organic photoelectric layer.

In some embodiments, the image sensor may include a transparent organic layer between the first color filter layer and the insulating layer and between the second color filter layer and the insulating layer. The insulating layer may be on a portion of the metal structure. The protruding portion of the insulating layer may isolate a first portion of the electrode layer that is on the first color filter layer from a second portion of the electrode layer that is on the second color filter layer. The electrode layer may be connected to the metal structure through an opening of the insulating layer. A first width of the metal structure may be wider than a second width of the opening through which the electrode layer connects to the metal structure. Moreover, a continuous portion of the electrode layer may contact the organic photoelectric layer, a sidewall of the protruding portion of the insulating layer, and the metal structure.

A method of forming an image sensor, according to some embodiments, may include forming an insulating layer on a color filter layer. The method may include etching the insulating layer to form an opening that at least partially exposes a metal structure that is adjacent a sidewall of the color filter layer. Moreover, the method may include forming an electrode layer in the opening of the insulating layer.

In some embodiments, the method may include, before forming the insulating layer, forming a transparent layer on the color filter layer. Additionally or alternatively, forming the electrode layer may include simultaneously forming an electrode material in the opening of the insulating layer and on a portion of the insulating layer that is outside of the opening. Moreover, forming the electrode layer may include forming the electrode layer to contact a portion of the transparent layer through the opening. Additionally or alternatively, forming the transparent layer on the color filter layer may include forming the transparent layer on a red first color filter layer and a blue second color filter layer. Forming the insulating layer may include forming an oxide layer on the transparent layer. Forming the electrode layer may include forming an indium tin oxide (ITO) layer on the oxide layer and on the metal structure.

According to some embodiments, the method may include forming a photoresist material on a portion of the insulating layer, and performing an etch of the insulating layer while the photoresist material is on the portion of the insulating layer. Performing the etch of the insulating layer while the photoresist material is on the portion of the insulating layer may include performing a first etch of the insulating layer. The method may include performing a second etch of the insulating layer to form a recess that overlaps the metal structure, without exposing the metal structure. Etching the insulating layer to form the opening that at least partially exposes the metal structure may include performing a third etch of the insulating layer.

In some embodiments, the photoresist material may be a first photoresist layer. The method may include removing the first photoresist layer and forming a second photoresist layer on the insulating layer, before performing the second etch of the insulating layer. Moreover the method may include removing the second photoresist layer, before performing the third etch that forms the opening that at least partially exposes the metal structure.

According to some embodiments, performing the etch may include forming a protruding portion of the insulating layer. Moreover, forming the electrode layer may include forming the electrode layer on the protruding portion of the insulating layer.

In some embodiments, forming the electrode layer may include depositing an electrode material on the insulating layer, and performing a chemical mechanical polishing (CMP) process on the electrode material until a portion of the insulating layer is exposed. The portion of the insulating layer that is exposed by the CMP process may overlap the color filter layer. Moreover, the method may include forming an organic photoelectric layer on the electrode layer and on the portion of the insulating layer that is exposed by the CMP process.

A method of forming an image sensor, according to some embodiments, may include forming a transparent layer on a color filter layer. The method may include forming an insulating layer on the transparent layer. The method may include forming an electrode layer on the insulating layer. Moreover, the method may include forming an organic photoelectric layer on the electrode layer. In some embodiments, the method may include etching the insulating layer to form an opening that exposes a portion of a metal structure. The metal structure may be adjacent a sidewall of the color filter layer.

In some embodiments, forming the electrode layer may include forming the electrode layer in the opening of the insulating layer. Additionally or alternatively, the method may include forming a photoresist material on a portion of the insulating layer. Moreover, the method may include performing an etch of the insulating layer while the photoresist material is on the portion of the insulating layer, to form a protruding portion of the insulating layer. Forming the electrode layer may include forming the electrode layer on the protruding portion of the insulating layer.

According to some embodiments, forming the transparent layer on the color filter layer may include forming the transparent layer on a red first color filter layer and a blue second color filter layer. Forming the insulating layer may include forming an oxide layer on the transparent layer. Moreover, forming the electrode layer may include forming an indium tin oxide (ITO) layer on the oxide layer.

A method of forming an image sensor, according to some embodiments, may include forming an insulating layer on a color filter layer. The method may include forming a photoresist material on a portion of the insulating layer. The method may include etching the insulating layer while the photoresist material is on the portion of the insulating layer. Moreover, the method may include removing the photoresist material to expose a protruding portion of the insulating layer.

In some embodiments, etching the insulating layer may include performing a first etch of the insulating layer. The method may include performing a second etch of the insulating layer to form an opening that at least partially exposes a metal structure that is adjacent a sidewall of the color filter layer. Moreover, the method may include forming an electrode layer in the opening of the insulating layer.

According to some embodiments, the method may include performing a third etch of the insulating layer to form a recess that overlaps the metal structure, without exposing the metal structure, before performing the second etch of the insulating layer. Additionally or alternatively, forming the electrode layer may include forming the electrode layer on the protruding portion of the insulating layer.

In some embodiments, the protruding portion of the insulating layer may overlap the color filter layer. Forming the electrode layer may include depositing an electrode material on the insulating layer, and performing a chemical mechanical polishing (CMP) process on the electrode material until a surface of the protruding portion of the insulating layer is exposed. Moreover, the method may include forming an organic photoelectric layer on the electrode layer and on the surface of the protruding portion of the insulating layer that is exposed by the CMP process.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1:
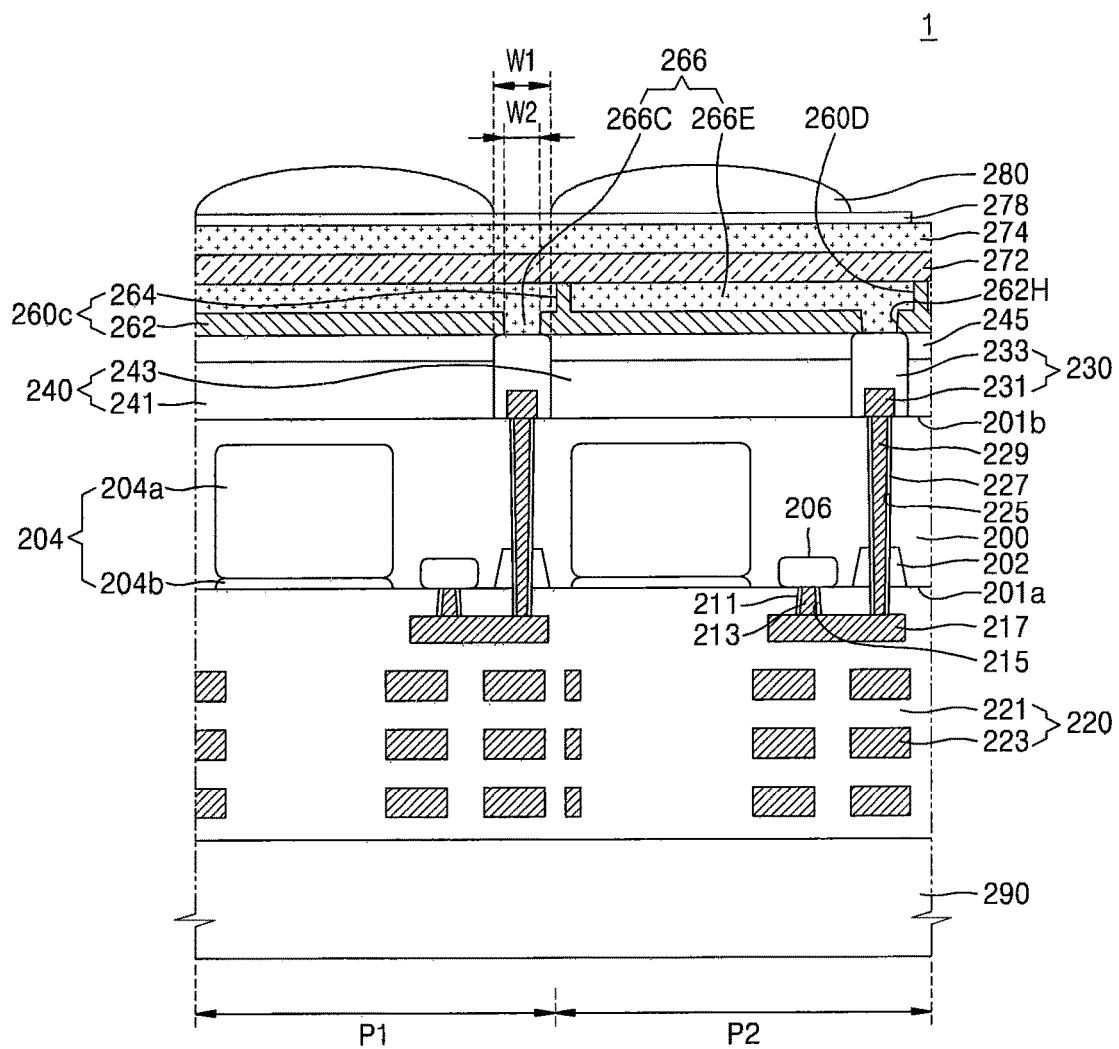
FIG. 1 is a cross-sectional view illustrating a main portion of an image sensor according to some embodiments of present inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or image sensor structures, memory cell structures, gate structures, etc., as appropriate to the case) thereon, as would be illustrated by a plan view of the device/structure.

FIG. 1 is a cross-sectional view illustrating a main portion of an image sensor 1 according to some embodiments of present inventive concepts.

Referring to FIG. 1, the image sensor 1 includes a semiconductor substrate 200 including a first pixel area P1 and a second pixel area P2. A device isolation layer 202 may be disposed on the semiconductor substrate 200. The device isolation layer 202 may define the first pixel area P1 and the second pixel area P2.

The semiconductor substrate 200 may be, for example, one of a bulk substrate, an epitaxial substrate, and a silicon on insulator (SOI) substrate. The semiconductor substrate 200 may include, for example, silicon. Also, the semiconductor substrate 200 may include a semiconductor element such as germanium (Ge) or a compound semiconductor such as silicon carbide (SiC), gallium arsenide (GaAs), indium arsenide (InAs), and indium phosphide (InP). The semiconductor substrate 200 may be formed based on a first conductivity-type semiconductor substrate. The semiconductor substrate 200 may be, for example, a P-type semiconductor substrate.

A photoelectric transducer 204 may be disposed in the semiconductor substrate 200 to correspond to each of the first and second pixel areas P1 and P2. The photoelectric transducer 204 may be a photodiode. The photoelectric transducer 204 may include a first impurity area 204a and a second impurity area 204b. The first impurity area 204a may be formed deeply from a surface of the semiconductor substrate 200. The second impurity area 204b may be formed shallowly in the surface of the semiconductor substrate 200. The first impurity area 204a and the second impurity area 204b may include different conductivity types. For example, the first impurity area 204a may be doped with N-type impurities, and the second impurity area 204b may be doped with P-type impurities.

The photoelectric transducer 204 may include pixels which sense red light and blue light. For example, a pixel which senses red light may be in the first pixel area P1 and a pixel which senses blue light may be in the second pixel area P2. A storage node area 206 may be disposed in the semiconductor substrate 200 to correspond to each of the first and second pixel areas P1 and P2 while being spaced apart from the photoelectric transducer 204. The storage node area 206 may be, for example, doped with N-type impurities. The storage node area 206 may be formed as a single doped area and may have a smaller area than that of the photoelectric transducer 204.

A wiring structure 220 is disposed on a first side 201a of the semiconductor substrate 200. A first contact hole 215 may be formed in the wiring structure 220. A first side insulating layer 211 may be formed on a side of the first contact hole 215. A first contact via 213 may completely fill the first contact hole 215 and may be in contact with the first side insulating layer 211. A width of the first contact hole 215 may gradually increase as it gets farther from the surface of the semiconductor substrate 200. The first side insulating layer 211 may be formed of an oxide or a nitride. The first contact via 213 may be formed of, for example, a metallic material such as copper, aluminum, and tungsten.

The wiring structure 220 may include a buffer area 217 which is in contact with the first contact via 213. The buffer area 217 may be electrically connected to the storage node area 206 formed on the semiconductor substrate 200 through the first contact via 213. The buffer area 217 may be formed of, for example, a metallic material such as copper, aluminum, and tungsten or carbon nanotubes.

The wiring structure 220 may include a front interlayer dielectric 221 and a plurality of front wires 223. The front interlayer dielectric 221 may use a high density plasma (HDP) oxide film, a tetraethyl orthosilicate (TEOS) oxide film, tonen silazene (TOSZ), spin on glass (SOG), undoped silica glass (USG), a low-k dielectric layer, etc. The plurality of front wires 223 may be formed of, for example, a metallic material such as copper, aluminum, and tungsten.

A supporting layer 290 may be adhered to the wiring structure 220. The supporting layer 290 may be used to provide strength to the semiconductor substrate 200 which is thinned through a polishing process. In some embodiments, the supporting layer 290 may be formed of a silicon oxide, a silicon nitride, and/or a semiconductor material.

The image sensor 1 may include a second contact hole 225 which penetrates and extends through the semiconductor substrate 200 from a second side 201b of the semiconductor substrate 200 to the buffer area 217. A width of the second contact hole 225 may gradually increase as it approaches the second side 201b of the semiconductor substrate 200 from the buffer area 217. In some embodiments, the second contact hole 225 may be formed to penetrate the device isolation layer 202.

A second side insulating layer 227 may be formed on a side of the second contact hole 225. The second side insulating layer 227 may be formed of an oxide or a nitride. The second contact hole 225 may be filled with a second contact via 229. The second contact via 229 may completely fill the second contact hole 225 to be in contact with the second side insulating layer 227. Accordingly, the second contact via 229 may penetrate the semiconductor substrate 200. The second contact via 229 may be, for example, formed of a metallic material such as copper, aluminum, and tungsten.

A stud layer 230 electrically connected to the second contact via 229 may be formed on the second side 201b of the semiconductor substrate 200. The stud layer 230 may include a first stud layer 231 formed on the second side 201b of the semiconductor substrate 200 and a second stud layer 233 formed on the first stud layer 231. The second stud layer 233 may be formed to surround side and top surfaces of the first stud layer 231, thereby having a larger width than that of the first stud layer 231. The first stud layer 231 and the second stud layer 233 may be formed of different metallic materials. In some embodiments, the first stud layer 231 may be formed of tungsten and the second stud layer 233 may be formed of aluminum. The stud layer 230 may have a first width W1. When the second stud layer 233 has a larger width than that of the first stud layer 231, the second stud layer 233 may have the first width W1.

Although the first width W1 of the second stud layer 233 is illustrated in FIG. 1 as being substantially constant throughout the height of the second stud layer 233, the second stud layer 233 may alternatively be sloped/tapered toward an overlying lower transparent electrode layer 266. For example, sidewalls of the second stud layer 233 may be tapered toward (i.e., a distance between the sidewalls may narrow as the sidewalls are closer to) the lower transparent electrode layer 266. Additionally or alternatively, the stud layer 230 may be referred to herein as a "metal structure" or a "metal region" and is not limited to the term "stud."

A color filter layer 240 may be formed on the second side 201b of the semiconductor substrate 200. The color filter layer 240 may allow light incident through a micro lens 280 to pass, thereby allowing only light with a necessary wavelength to be incident on the photoelectric transducer 204 through the second side 201b. In some embodiments, an anti-reflection layer may be formed between the second side 201b and the color filter layer 240 of the semiconductor substrate 200 to allow light to be incident on the photoelectric transducer 204 by reducing/preventing the reflection of light. The anti-reflection layer may be formed of, for example, silicon oxynitride (SiON), silicon carbide (SiC), silicon carbon nitride (SiCN), silicon oxycarbide (SiCO), etc.

The color filter layer 240 may include a first color filter layer 241 and a second color filter layer 243. The first color filter layer 241 and the second color filter layer 243 may be disposed in the first pixel area P1 and the second pixel area P2 to correspond to the photoelectric transducers 204 formed therein, respectively. In some embodiments, the first color filter layer 241 disposed in the first pixel area P1 may be a red (R) color filter and the second color filter layer 243 disposed in the second pixel area P2 may be a blue (B) color filter. Accordingly, the first pixel area P1 transmits light with a red wavelength to allow the red wavelength to arrive at the photoelectric transducer 204. Also, the second pixel area P2 transmits light with a blue wavelength to allow the blue wavelength to arrive at the photoelectric transducer 204.

The color filter layer 240 may be formed to have a top surface with a lower level than that of the stud layer 230. That is, a height of the color filter layer 240 may be formed to have a smaller value than that of the stud layer 230.

A coating layer 245, which covers the color filter layer 240, may be formed on the second side 201b of the semiconductor substrate 200. The coating layer 245 may be formed by forming a coating material layer which covers a top of the semiconductor substrate 200 on which the stud layer 230 and the color filter layer 240 are formed and performing a planarization process. The coating layer 245 may expose a top surface of the stud layer 230. The coating layer 245 and the stud layer 230 may have top surfaces with the same level. That is, the top surfaces of the coating layer 245 and the stud layer 230 may form planes with the same level (i.e., the top surfaces may be coplanar). The coating layer 245 may be formed by forming the coating material layer and then removing a part of the coating material layer until the top surface of the stud layer 230 is exposed. The coating layer 245 may be formed of a transparent organic material. In some embodiments, the coating layer 245 may be formed of resin. The coating layer 245 may be on top of (e.g., may directly contact top surfaces of) a plurality of color filter layers 240.

The coating layer 245 may be referred to herein as a "transparent layer" and is not limited to the term "coating." Additionally or alternatively, the coating layer 245 may be a silicon oxide layer.

An isolation-insulating layer 260c having a plurality of openings 262H is formed on the coating layer 245. The plurality of openings 262H may pass through the isolation-insulating layer 260c.

The isolation-insulating layer 260c may be formed of, for example, an oxide. The isolation-insulating layer 260c may include a base layer 262 and an isolation layer 264 formed on the base layer 262. The base layer 262 may have the opening 262H which exposes at least a part of the stud layer 230. An isolation space 260D defined by the isolation-insulating layer 260c, that is, the base layer 262 and the isolation layer 264, may be formed. A plurality of such isolation spaces 260D may be formed to correspond to a plurality of pixel areas P1 and P2.

The isolation space 260D refers to a portion/region/area between a bottom surface level and a top surface level of the isolation-insulating layer 260c where the isolation-insulating layer 260c is not formed. That is, the isolation space 260D may include a space surrounded by the isolation layer 264 between levels of a top surface of the base layer 262 and a top surface of the isolation layer 264 and a space in the opening 262H. The plurality of isolation spaces 260D which are isolated from each other may be formed to correspond to the plurality of pixel areas P1 and P2. That is, each of the plurality of isolation spaces 260D may be formed to correspond to a respective one of the plurality of photoelectric transducers 204.

A second width W2, which is a width of the opening 262H, may have a smaller value than that of the first width W1 of the stud layer 230. The coating layer 245 may not be exposed and a top surface thereof may be completely covered due to the isolation-insulating layer 260c having the openings 262H. That is, the top surface of the coating layer 245 may be totally covered by the isolation-insulating layer 260c so as not to be exposed at a bottom of the opening 262H. However, in some embodiments, a part of the coating layer 245 may be exposed at/via the bottom of the opening 262H.

A lower transparent electrode layer 266 which fills the isolation space 260D is formed on the isolation-insulating layer 260c. The lower transparent electrode layer 266 may include a lower contact 266C, which fills an inside of the opening 262H, and a lower electrode 266E, which is connected to the lower contact 266C and disposed on the top surface of the base layer 262.

That is, the lower transparent electrode layer 266 may be formed to fill the isolation space 260D using a dual damascene method. Accordingly, the lower contact 266C and the lower electrode 266E may be simultaneously/integrally formed. A top surface of the lower transparent electrode layer 266 and a topmost end of the isolation-insulating layer 260c may have the same level. The top surface of the lower transparent electrode layer 266 and the top surface of the isolation layer 264 may have the same level. That is, the top surface of the lower transparent electrode layer 266 and the top surface of the isolation layer 264 may form planes with the same level (i.e., the top surfaces may be coplanar).

Due to the isolation layer 264, the lower transparent electrode layer 266 may be separated so as to correspond to each of the first pixel area P1 and the second pixel area P2. That is, a plurality of such lower transparent electrode layers 266 may be formed to correspond to the plurality of pixel areas P1 and P2. In detail, the lower contact 266C and the lower electrode 266E, which form the lower transparent electrode layer 266 filling a single isolation space 260D, may be integrally formed.

The coating layer 245 may not be exposed at the bottom of the opening 262H. In this case, the coating layer 245 may be spaced apart to not be in contact with the lower transparent electrode layer 266. However, in some embodiments, a part of the coating layer 245 may be in contact with the lower transparent electrode layer 266.

An organic photoelectric layer 272 is formed on the lower transparent electrode layer 266. The organic photoelectric layer 272 may be integrally formed on a plurality of lower transparent electrode layers 266. The organic photoelectric layer 272 may be formed of an organic material which causes a photoelectric change only in light with a particular wavelength. For example, the organic photoelectric layer 272 may cause the photoelectric change only at a wavelength of green light. For example, the organic photoelectric layer 272 may show a maximum absorption wavelength λmax from about 500 nanometers (nm) to about 600 nm in both of the first and second pixel areas P1 and P2.

The organic photoelectric layer 272, in which a P-type semiconductor material and an N-type semiconductor material form a PN flat junction or a bulk heterojunction, may be formed of a single layer or multiple layers, and is a layer which receives incident light, generates an exciton, and then separates the generated exciton into a positive hole and an electron.

The P-type semiconductor material and the N-type semiconductor material may each absorb light of a green wavelength area and may each show a maximum absorption peak in a wavelength area of from about 500 nm to about 600 nm.

The P-type semiconductor material and the N-type semiconductor material may each have, for example, a bandgap within the range of about 1.5 eV to about 3.5 eV and, within this range, may each have a bandgap within the range of about 2.0 eV to about 2.5 eV. The P-type semiconductor material and the N-type semiconductor material may absorb the light of the green wavelength area by having the bandgap within that range and particularly may each show the maximum absorption peak in a wavelength area of from about 500 nm to about 600 nm.

The P-type semiconductor material and the N-type semiconductor material may each have a full width at half maximum (FWHM) of from about 50 nm to about 150 nm in a light absorption curve. Here, the FWHM is a width of a wavelength corresponding to half of a maximum light absorption point. A small FWHM indicates that light in a narrow wavelength area is selectively absorbed in such a way that wavelength selectivity is high. With an FWHM within the range, selectivity for the green wavelength area may be high.

A difference between a lowest unoccupied molecular orbital (LUMO) energy level of the P-type semiconductor material and an LUMO energy level of the N-type semiconductor material may be from about 0.2 to about 0.7 eV. For example, within this range, the difference may be from about 0.3 to about 0.5 eV. As the P-type semiconductor material and the N-type semiconductor material of the organic photoelectric layer 272 have the difference within that range in the LUMO energy level, external quantum efficiency (EQE) may be improved and EQE may be effectively controlled according to applied bias.

The P-type semiconductor material may include, for example, a compound such as N,N'-dimethyl-quinacridone (DMQA) and derivatives thereof, diindenoperylene, and dibenzo{[f,f']-4,4',7,7'-tetraphenyl}diindeno[1,2,3-cd:1',2',3'-1m]perylene but is not limited thereto. The N-type semiconductor material may include, for example, a compound such as dicyanovinyl-terthiophene (DCV3T) and derivatives thereof, perylene diimide, phtalocyanine and derivatives thereof, subphtalocyanine and derivatives thereof, boron dipyrromethene (BODIPY) and derivatives thereof but is not limited thereto.

The organic photoelectric layer 272 may be a single layer and may be multiple layers. The organic photoelectric layer 272 may have, for example, various combinations such as an intrinsic layer (I-layer), a P-type layer/I-layer, an I-layer/N-type layer, a P-type layer/I-layer/N-type layer, a P-type layer/N-type layer, etc.

The I-layer may include the P-type semiconductor compound and the N-type semiconductor compound mixed at a ratio of from about 1:100 to about 100:1. Within this range, the ratio may be from about 1:50 to about 50:1. Within this range, the ratio may be from about 1:10 to about 10:1. For example, within this range, the ratio may be about 1:1. As a P-type semiconductor and an N-type semiconductor have a composition ratio within that ratio, an excitor) may be effectively generated and a PN-junction may be formed according to desired specifications.

A P-type layer may include the P-type semiconductor compound, and an N-type layer may include the N-type semiconductor compound.

The organic photoelectric layer 272 may have, for example, a thickness from about 1 nm to about 500 nm. In some embodiments, the organic photoelectric layer 272 may have a thickness from about 5 nm to about 300 nm. The organic photoelectric layer 272 may have a thickness capable of effectively improving photoelectric conversion efficiency by effectively absorbing light and effectively separating and transferring positive holes and electrons.

An upper transparent electrode layer 274 is formed on the organic photoelectric layer 272. The upper transparent electrode layer 274 may be formed of, for example, indium tin oxide (ITO), indium zinc oxide (IZO), zinc oxide (ZnO), stannic oxide ($SnO_2$), antimony-doped tin oxide (ATO), Aluminum-doped zinc oxide (AZO), gallium-doped zinc oxide (GZO), titanium dioxide ($TiO_2$), or fluorine-doped tin oxide (FTO). The upper transparent electrode layer 274 may be integrally formed across the first pixel area P1 and the second pixel area P2.

The micro lens 280 corresponding to the color filter layer 240 is formed on the upper transparent electrode layer 274. The micro lens 280 may be formed to overlap the corresponding color filter layer 240. A plurality of such micro lenses 280 may be formed to correspond to a plurality of respective color filter layers 240. The micro lens 280 may change a path of light incident on areas except (e.g., other than) the photoelectric transducer 204, and may concentrate the light on the photoelectric transducer 204.

In some embodiments, a protective layer 278 may be further formed between the micro lens 280 and the upper transparent electrode layer 274. The protective layer 278 may be formed of a transparent insulating material.

Figure 2:
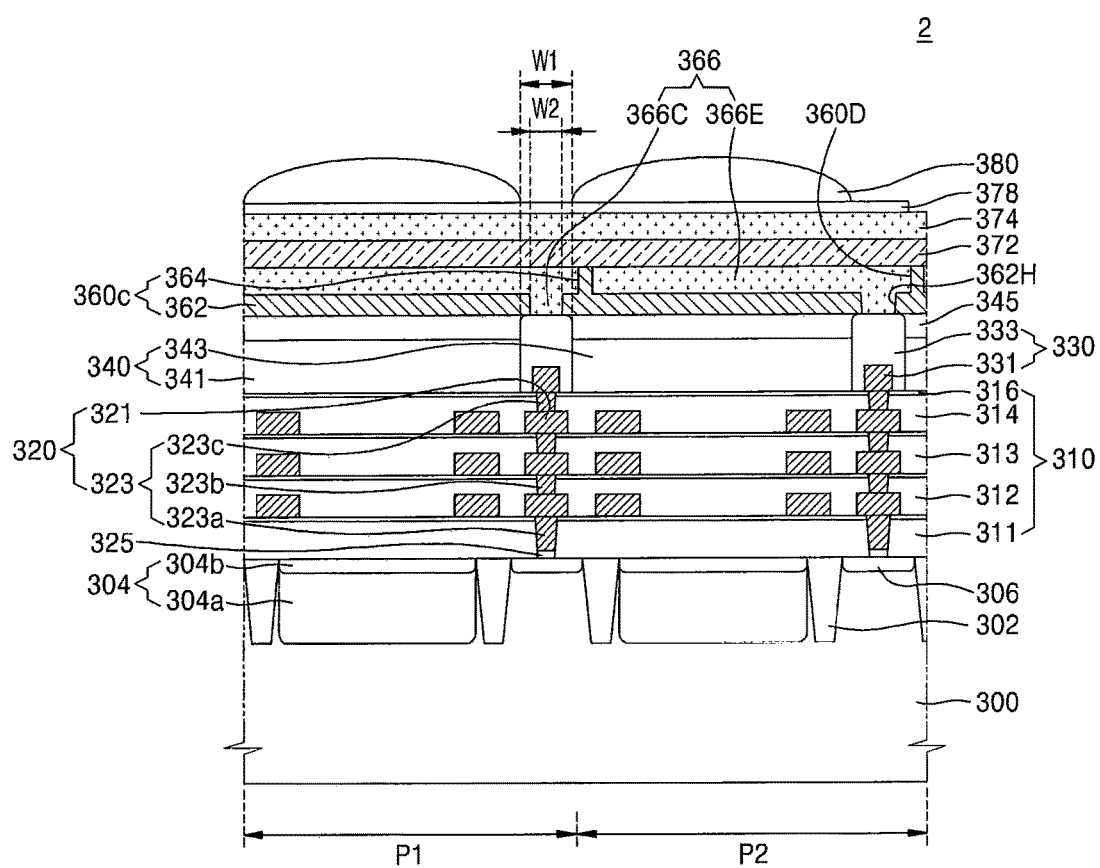
FIG. 2 is a cross-sectional view illustrating a main portion of an image sensor according to some embodiments of present inventive concepts.

FIG. 2 is a cross-sectional view illustrating a main portion of an image sensor 2 according to some embodiments of present inventive concepts. In the description of FIG. 2, content/descriptions duplicated with reference to FIG. 1 may be omitted.

Referring to FIG. 2, the image sensor 2 includes a semiconductor substrate 300 including a first pixel area P1 and a second pixel area P2. A device isolation layer 302 may be disposed on the semiconductor substrate 300. The device isolation layer 302 may define the first pixel area P1 and the second pixel area P2.

A photoelectric transducer 304 may be disposed in the semiconductor substrate 300 to correspond to each of the first and second pixel areas P1 and P2. The photoelectric transducer 304 may be a photodiode. The photoelectric transducer 304 may include a first impurity area 304a and a second impurity area 304b. The first impurity area 304a may be formed deeply from a top surface of the semiconductor substrate 300. The second impurity area 304b may be formed shallowly at the top surface of the semiconductor substrate 300. The first impurity area 304a and the second impurity area 304b may include different conductivity types. For example, the first impurity area 304a may be doped with N-type impurities, and the second impurity area 304b may be doped with P-type impurities.

The photoelectric transducer 304 may be disposed in pixels which sense red light and blue light. For example, a pixel which senses red light may be the first pixel area P1 and a pixel which senses blue light maybe the second pixel area P2. A storage node area 306 may be disposed in the semiconductor substrate 300 to correspond to each of the first and second pixel areas P1 and P2 while being spaced apart from the photoelectric transducer 304. The storage node area 306 may be, for example, doped with N-type impurities. The storage node area 306 may be formed as a single doped area and may have a smaller area than that of the photoelectric transducer 304.

An interlayer dielectric structure 310 may be disposed on the semiconductor substrate 300. The interlayer dielectric structure 310 may include a plurality of interlayer dielectrics 311, 312, 313, and 314 sequentially deposited on the semiconductor substrate 300 and an etching stopper 316 disposed on a top surface of the plurality of interlayer dielectrics (e.g., dielectric layers) 311, 312, 313, and 314. In some embodiments, the interlayer dielectric 314 at a topmost end of the plurality of interlayer dielectrics 311, 312, 313, and 314 may be formed thicker than the other interlayer dielectrics 311, 312, and 313. The plurality of interlayer dielectrics 311, 312, 313, and 314 may be formed of oxides. For example, the plurality of interlayer dielectrics 311, 312, 313, and 314 may be formed of an HDP oxide film, a TEOS oxide film, TOSZ, SOG, USG, a low-k dielectric layer, etc. The etching stopper 316 may be formed of a silicon nitride film or a silicon oxynitride film.

A wiring structure 320 is disposed in each of the first pixel area P1 and the second pixel area P2 on the semiconductor substrate 300. The wiring structure 320 may be formed of, for example, a metallic material such as copper, aluminum, and tungsten. For example, the wiring structure 320 may include interlayer wires 321 disposed in at least a part of the plurality of interlayer dielectrics 311, 312, 313, and 314 and contact vias 323 which pass through the plurality of interlayer dielectrics 311, 312, 313, and 314 and connect the interlayer wires 321. The contact vias 323 may include a bottommost contact via 323a, an intermediate contact via 323b, and a topmost contact via 323c. The bottommost contact via 323a may be in contact with the storage node area 306.

In some embodiments, a buffer via 325 may be provided between the bottommost contact via 323a and the storage node area 306. The buffer via 325 may include, for example, carbon nanotubes. The buffer via 325 may provide, for example, a material with a work function between a metal and silicon to reduce an energy barrier between the semiconductor substrate 300 and the wiring structure 320, thereby providing adequate ohmic contact. For example, a work function of silicon may be 4.05 eV in the semiconductor substrate 300, a work function of a metal (for example, copper) may be 4.70 eV in the wiring structure 320, and a work function of the buffer via 325 (for example, carbon nanotubes) may be from about 4.3 eV to about 4.8 eV. The buffer via 325 may reduce an energy barrier between the silicon and the metal to allow electrons and/or positive holes to be better transferred to the storage node area 306 through the wiring structure 320.

A stud layer 330 electrically connected with the topmost contact via 323c may be formed on the interlayer dielectric structure 310. The stud layer 330 may include a first stud layer 331 formed on the interlayer dielectric structure 310 and a second stud layer 333 formed on the first stud layer 331. The second stud layer 333 may have a larger width than that of the first stud layer 331 to surround side and top surfaces of the first stud layer 331. The first stud layer 331 and the second stud layer 333 may be formed of different metallic materials. In some embodiments, the first stud layer 331 may be formed of tungsten and the second stud layer 333 may be formed of aluminum. The stud layer 330 may have a first width W1. When the second stud layer 333 has a larger width than that of the first stud layer 331, the second stud layer 333 may have the first width W1.

A color filter layer 340 may be formed on the interlayer dielectric structure 310. The color filter layer 340 may transmit light incident through a micro lens 380 to allow only light with a necessary wavelength to be incident on the photoelectric transducer 304. In some embodiments, an anti-reflection layer may be formed between the interlayer dielectric structure 310 and the color filter layer 340 to allow light to be incident on the photoelectric transducer 304 by reducing/preventing the reflection of light. The anti-reflection layer may be formed of, for example, SiON, SiC, SiCN, SiCO, etc.

The color filter layer 340 may include a first color filter layer 341 and a second color filter layer 343. The first color filter layer 341 and the second color filter layer 343 may be disposed in the pixel area P1 and the second pixel area P2, respectively. In some embodiments, the first color filter layer 341 disposed in the first pixel area P1 may be a red (R) color filter and the second color filter layer 343 disposed in the second pixel area P2 may be a blue (B) color filter. Accordingly, the first pixel area P1 transmits light with a red wavelength to allow the red wavelength to arrive at the photoelectric transducer 304. Also, the second pixel area P2 transmits light with a blue wavelength to allow the blue wavelength to arrive at the photoelectric transducer 304.

The color filter layer 340 may have a top surface with a lower level than that of the stud layer 330. That is, a height of the color filter layer 340 may be a smaller value than that of the stud layer 330.

A coating layer 345 may be formed on the interlayer dielectric structure 310. The coating layer 345 may cover the color filter layer 340. The coating layer 345 may be formed by forming a coating material layer which covers a top of the interlayer dielectric structure 310 on which the stud layer 330 and the color filter layer 340 are formed and performing a planarization process. The coating layer 345 may expose a top surface of the stud layer 330. The coating layer 345 and the stud layer 330 may have top surfaces with the same level. That is, the top surfaces of the coating layer 345 and the stud layer 330 may form planes with the same level (i.e., the top surfaces may be coplanar). The coating layer 345 may be formed by forming the coating material layer and then removing a part of the coating material layer until the top surface of the stud layer 330 is exposed. The coating layer 345 may be on top of (e.g., may directly contact top surfaces of) a plurality of color filter layers 340.

An isolation-insulating layer 360c may be formed on the interlayer dielectric structure 310 on which the coating layer 345 is formed. The isolation-insulating layer 360c may be formed of, for example, an oxide. The isolation-insulating layer 360c may include a base layer 362 and an isolation layer 364 formed on the base layer 362. The base layer 362 may have an opening 362H which exposes at least a part of the stud layer 330. An isolation space 360D defined by the isolation-insulating layer 360c, that is, the base layer 362 and the isolation layer 364, may be formed. A plurality of such isolation spaces 360D may be formed to correspond to the plurality of pixel areas P1 and P2.

The isolation space 360D refers to a portion/region/area between a bottom surface level and a top surface level of the isolation-insulating layer 360c where the isolation-insulating layer 360c is not formed. That is, the isolation space 360D may include a space surrounded by the isolation layer 364 between levels of a top surface of the base layer 362 and a top surface of the isolation layer 364 and a space in the opening 362H. The plurality of isolation spaces 360D which are isolated from each other may be formed to correspond to the plurality of pixel areas P1 and P2. That is, each of the plurality of isolation spaces 360D may be formed to correspond to a respective one of the plurality of photoelectric transducers 304.

A second width W2, which is the width of the opening 362H, may have a smaller value than that of the first width W1 of the stud layer 330. The coating layer 345 may not be exposed and a top surface thereof may be completely covered due to the isolation-insulating layer 360c having the opening 362H. That is, the top surface of the coating layer 345 may be totally covered by the isolation-insulating layer 360c so as not to be exposed at a bottom of the opening 362H. However, in some embodiments, a part of the coating layer 345 may be exposed at the bottom of the opening 362H, which will be described below in detail with reference to FIG. 8.

A lower transparent electrode layer 366, which fills the isolation space 360D, may be formed on the isolation-insulating layer 360c. The lower transparent electrode layer 366 may be formed of, for example, ITO, IZO, ZnO, $SnO_2$, ATO, AZO, GZO, $TiO_2$, or FTO. That is, the lower transparent electrode layer 366 may be formed to fill the isolation space 360D using a dual damascene method. The lower transparent electrode layer 366 may be formed by forming a lower transparent material layer which covers a top of the isolation-insulating layer 360c to fill the isolation space 360D and then performing a planarization process until the isolation-insulating layer 360c, that is, the isolation layer 364, is exposed. The planarization process for forming the lower transparent electrode layer 366 may be performed by a chemical-mechanical planarization (CMP) process.

Accordingly, the lower transparent electrode layer 366 may include a lower contact 366C, which fills an inside of the opening 362H, and a lower electrode 366E, which is connected to the lower contact 366C and disposed on the top surface of the base layer 362. The lower contact 366C and the lower electrode 366E may be integrally formed. A top surface of the lower transparent electrode layer 366 and a topmost end of the isolation-insulating layer 360c may have the same level. In particular, the top surface of the lower transparent electrode layer 366 and the top surface of the isolation layer 364 may have the same level. That is, the top surface of the lower transparent electrode layer 366 and the top surface of the isolation layer 364 may form planes with the same level (i.e., the top surfaces may be coplanar).

Due to the isolation layer 364, the lower transparent electrode layer 366 may be separated to correspond to each of the first pixel area P1 and the second pixel area P2. That is, a plurality of such separated lower transparent electrode layers 366 may be formed to correspond to the plurality of pixel areas P1 and P2. In detail, the lower contact 366C and the lower electrode 366E, which form the lower transparent electrode layer 366 filling a single isolation space 360D, may be integrally formed.

When the coating layer 345 is not exposed at the bottom of the opening 362H, the coating layer 345 may be spaced apart to not be in contact with the lower transparent electrode layer 366. However, in some embodiments, a part of the coating layer 345 may be in contact with the lower transparent electrode layer 366, which will be described below in detail with reference to FIG. 8.

An organic photoelectric layer 372 and an upper transparent electrode layer 374 are sequentially disposed on the lower transparent electrode layer 366. The organic photoelectric layer 372 may be integrally formed on the plurality of lower transparent electrode layers 366. The organic photoelectric layer 372 may be an organic material which causes a photoelectric change only in light with a particular wavelength. For example, the organic photoelectric layer 372 may cause the photoelectric change only at a wavelength of green light. For example, the organic photoelectric layer 372 may show a maximum absorption wavelength λmax from about 500 nm to about 600 nm in both of the first and second pixel areas P1 and P2.

The upper transparent electrode layer 374 may be integrally (e.g., continuously) formed across the first pixel area P1 and the second pixel area P2. The micro lens 380 corresponding to the color filter layer 340 is disposed on the upper transparent electrode layer 374. In some embodiments, a protective layer 378 may be further formed between the micro lens 380 and the upper transparent electrode layer 374. The protective layer 378 may be formed of a transparent insulating material. The micro lens 380 may be formed to overlap with the corresponding color filter layer 340. A plurality of such micro lenses 380 may be formed corresponding to respective ones of the plurality of color filter layers 340.

The micro lens 380 may change a path of light incident on areas except (e.g., other than) the photoelectric transducer 304, and may concentrate the light on the photoelectric transducer 304.

Figure 3A:
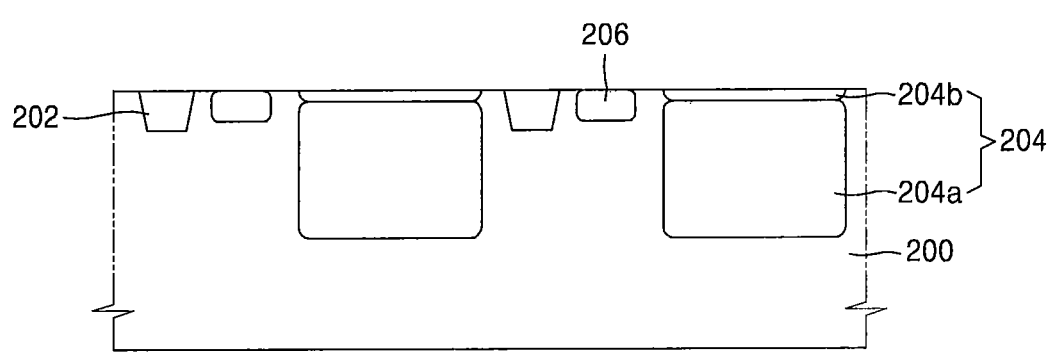
FIGS. 3A to 3R are cross-sectional views illustrating a process of manufacturing an image sensor according to some embodiments of present inventive concepts.
Figure 3B:
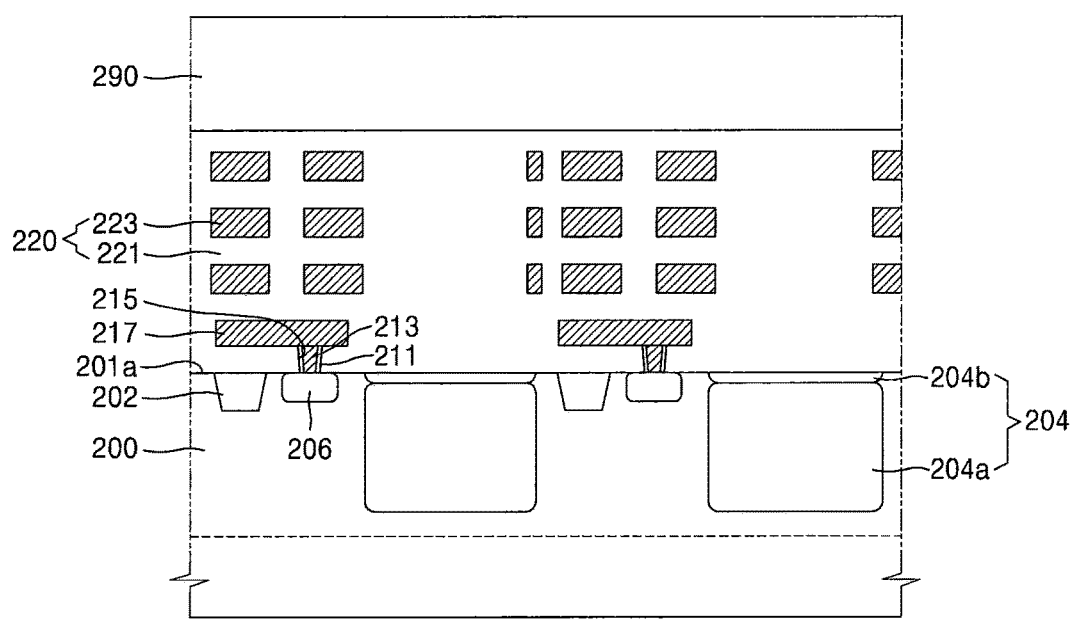
Figure 3C:
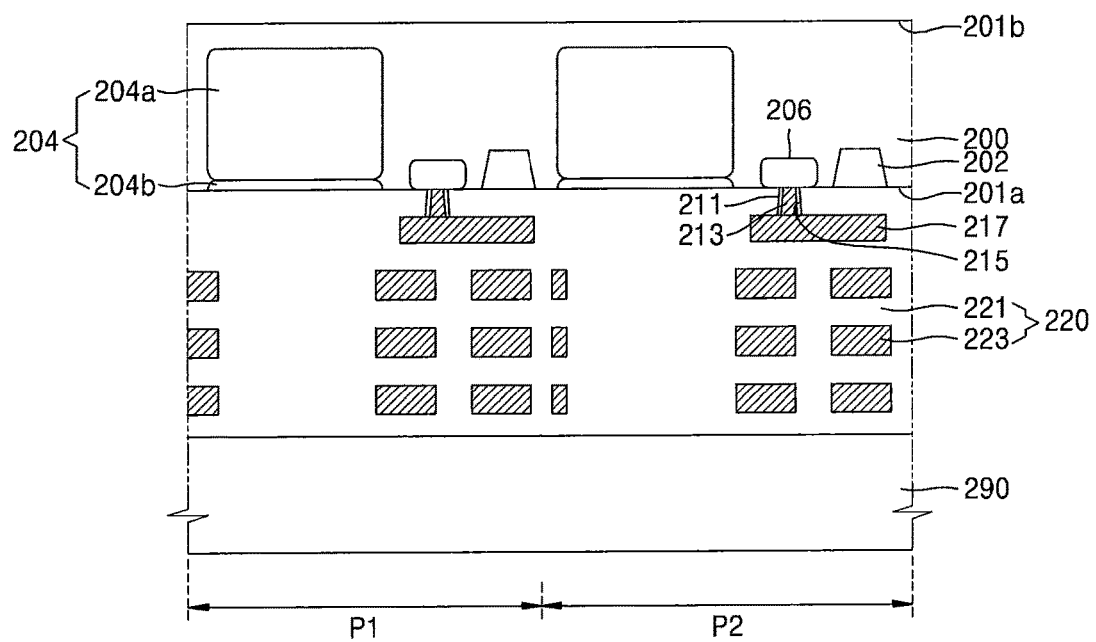
Figure 3D:
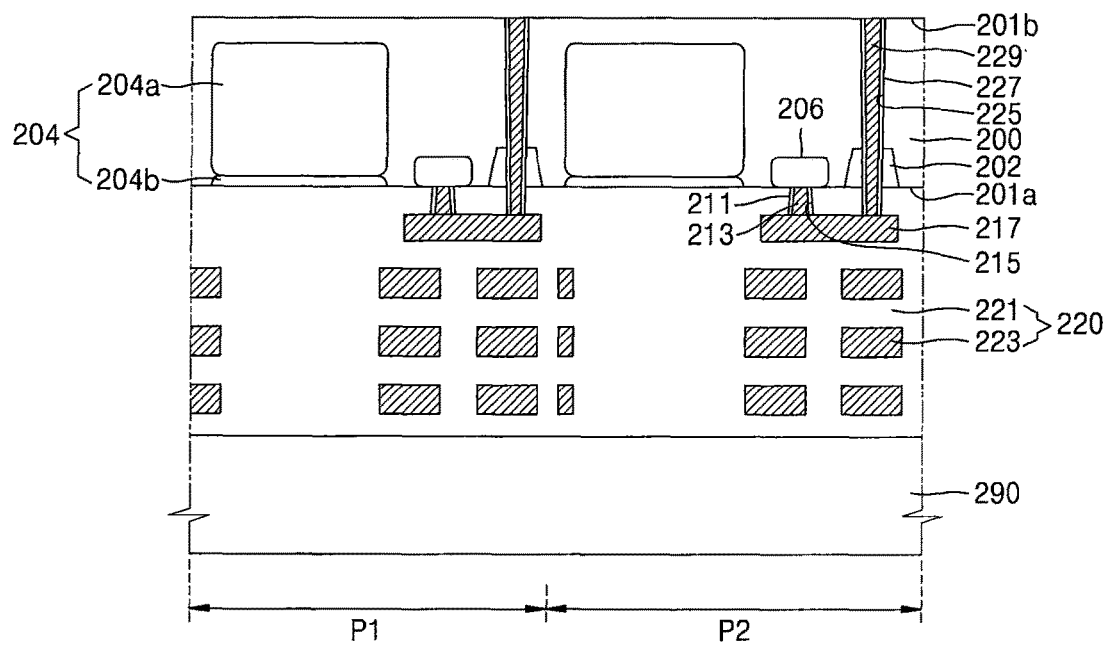
Figure 3E:
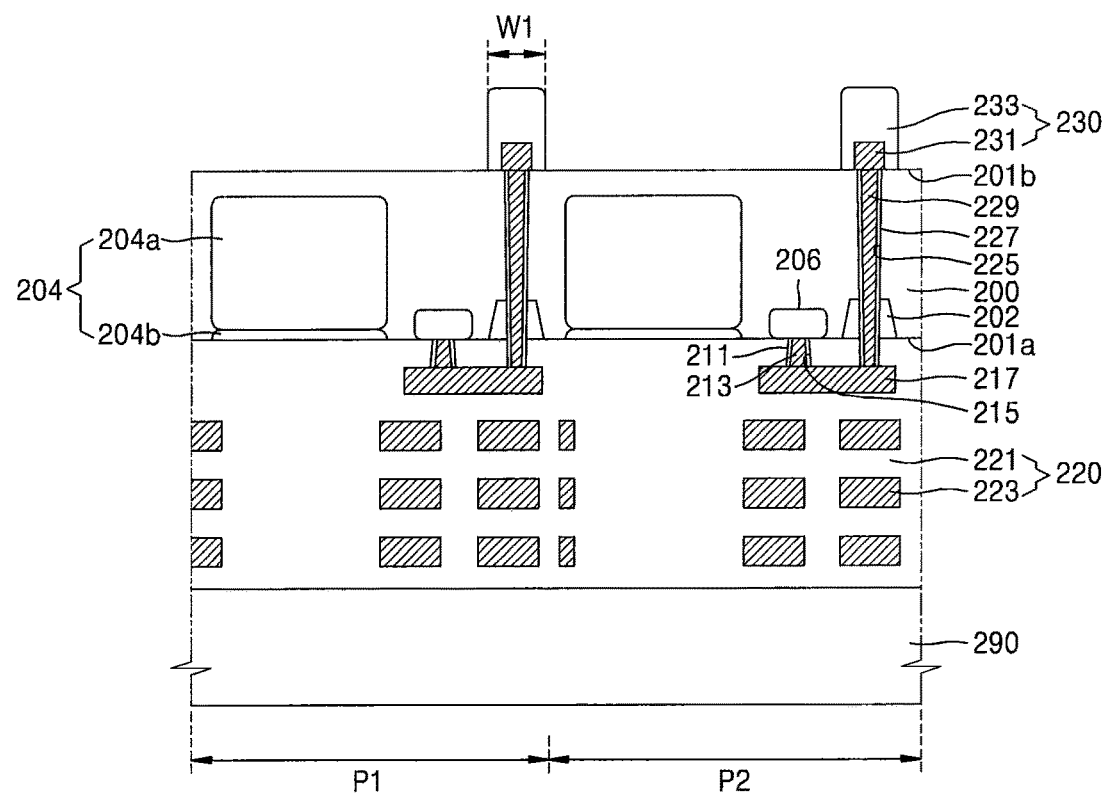
Figure 3F:
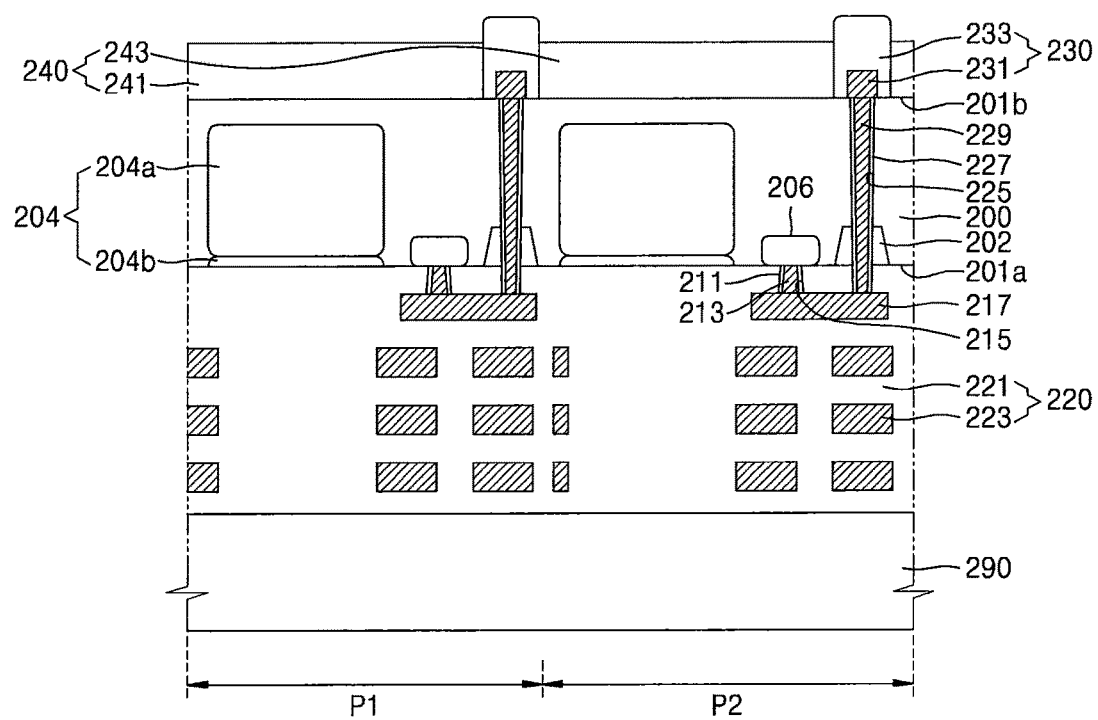
Figure 3G:
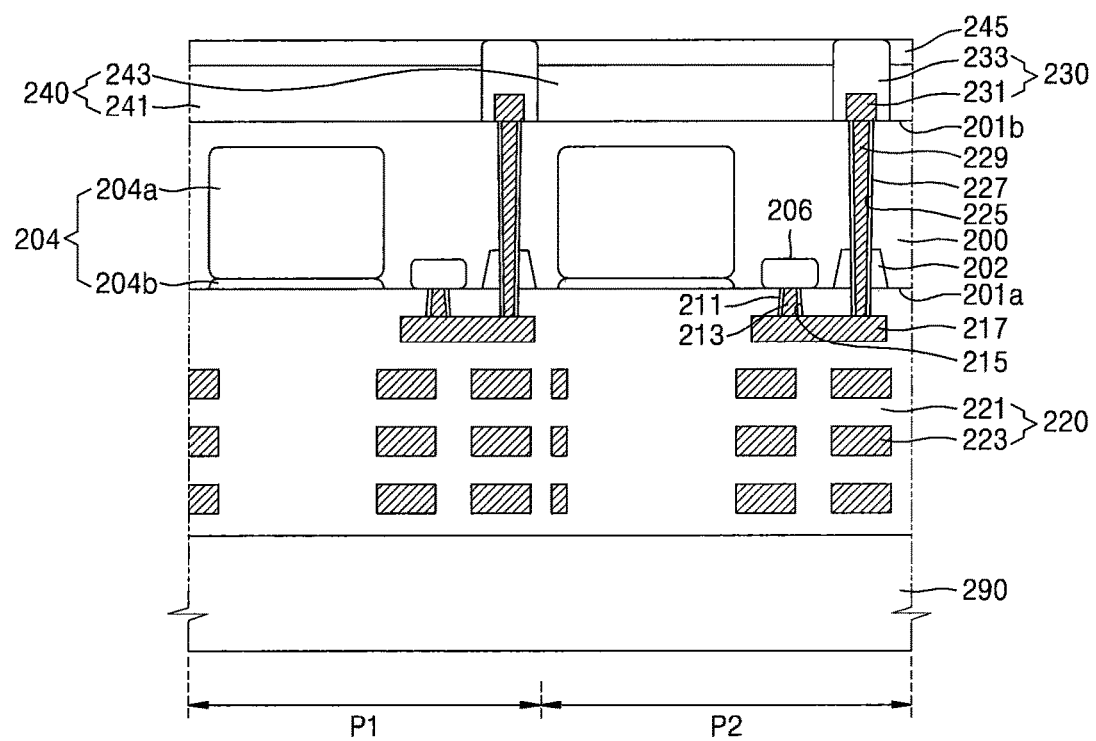
Figure 3H:
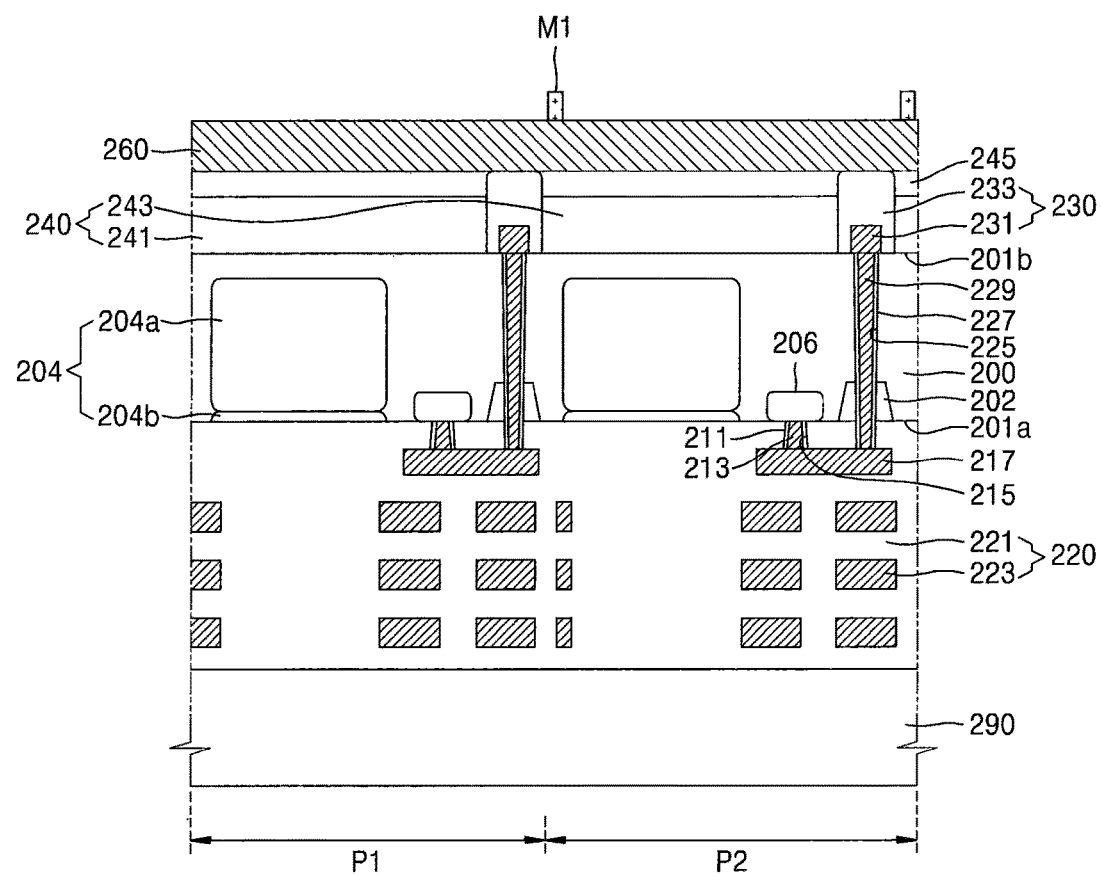
Figure 3I:
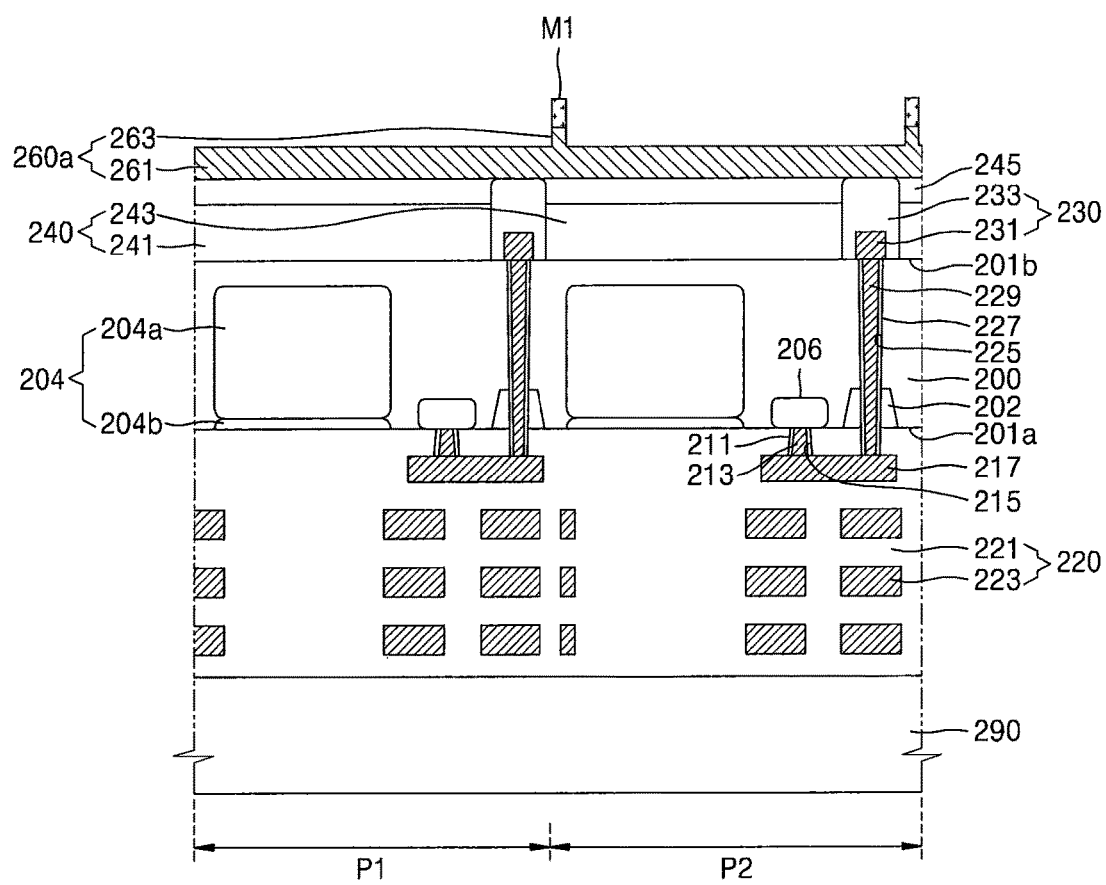
Figure 3J:
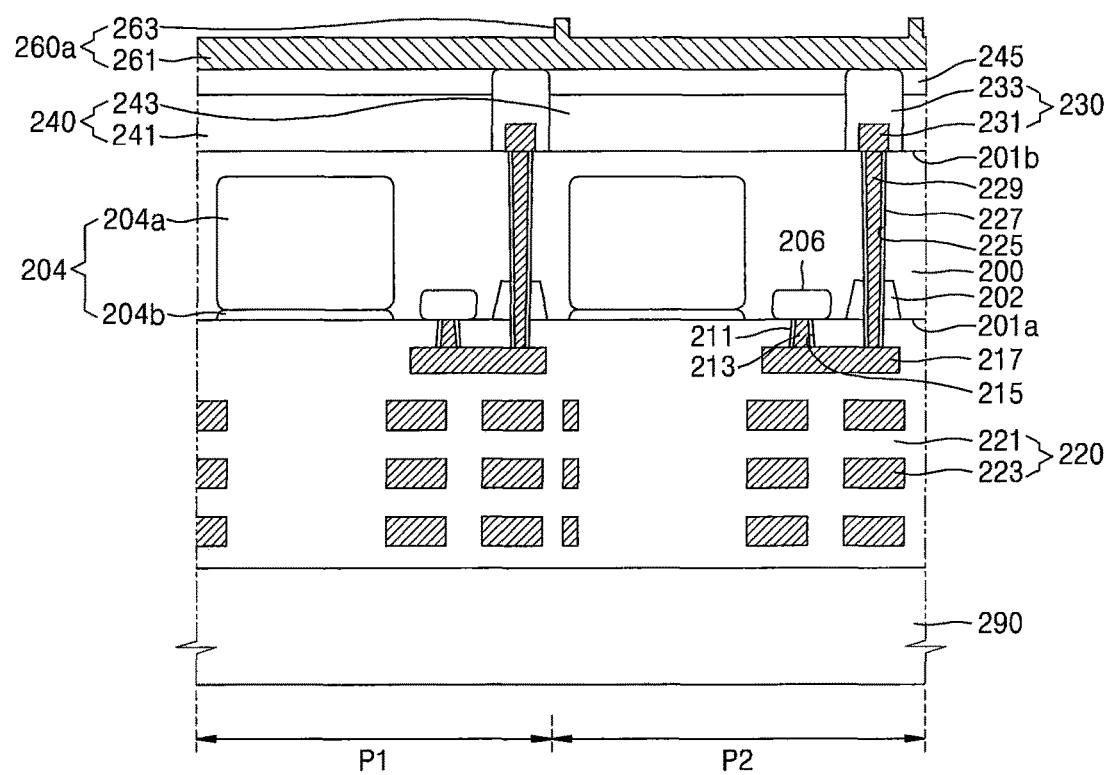
Figure 3K:
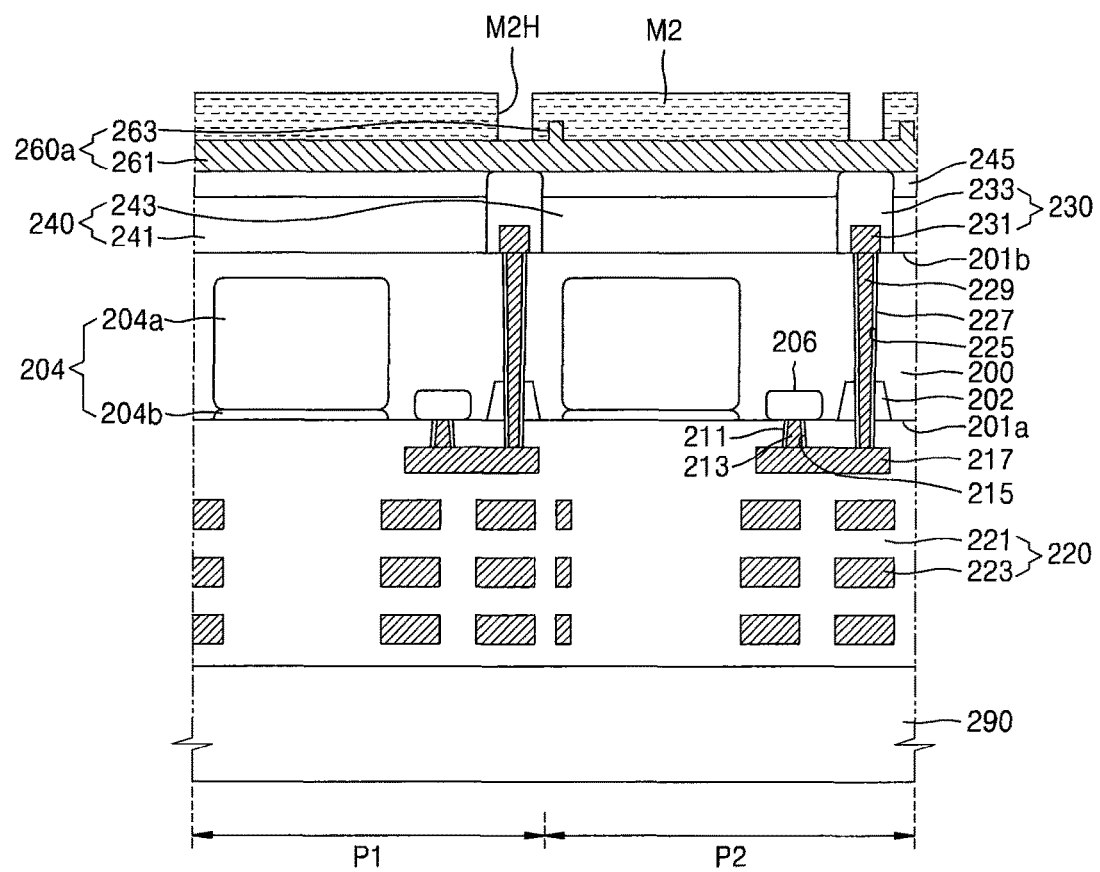
Figure 3L:
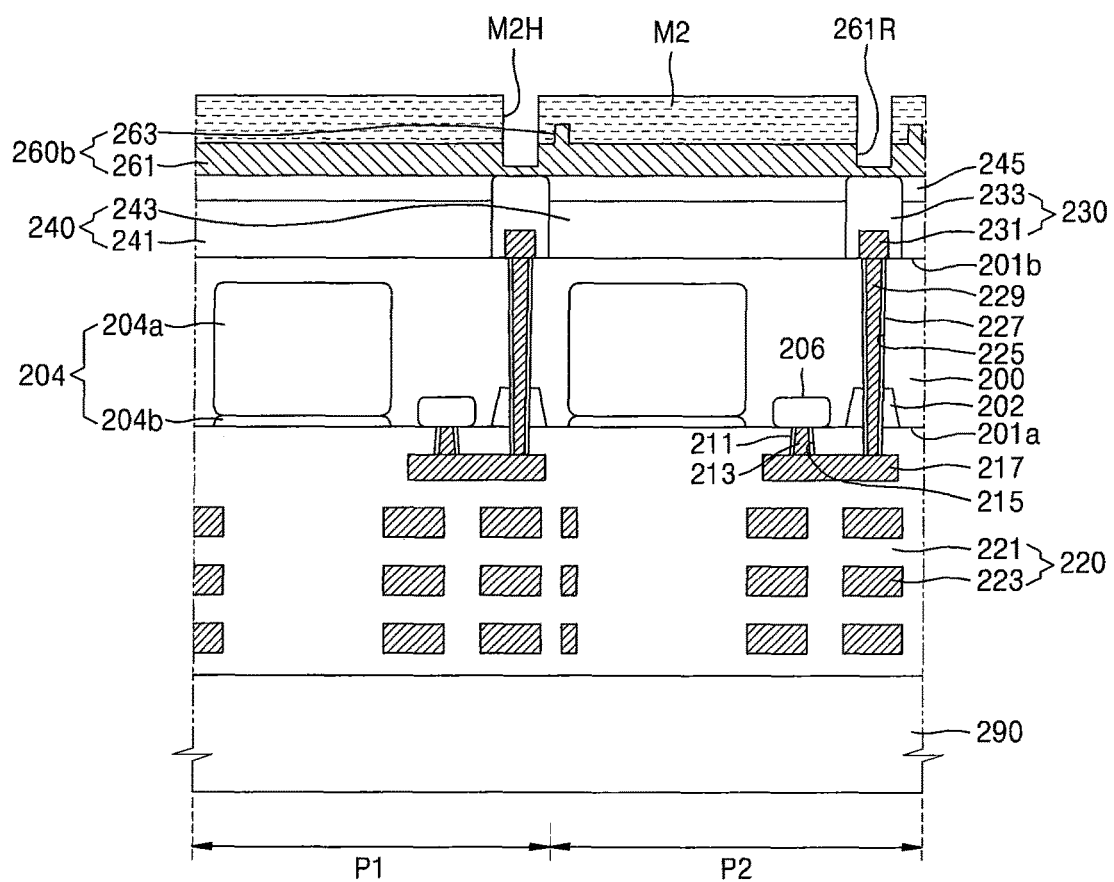
Figure 3M:
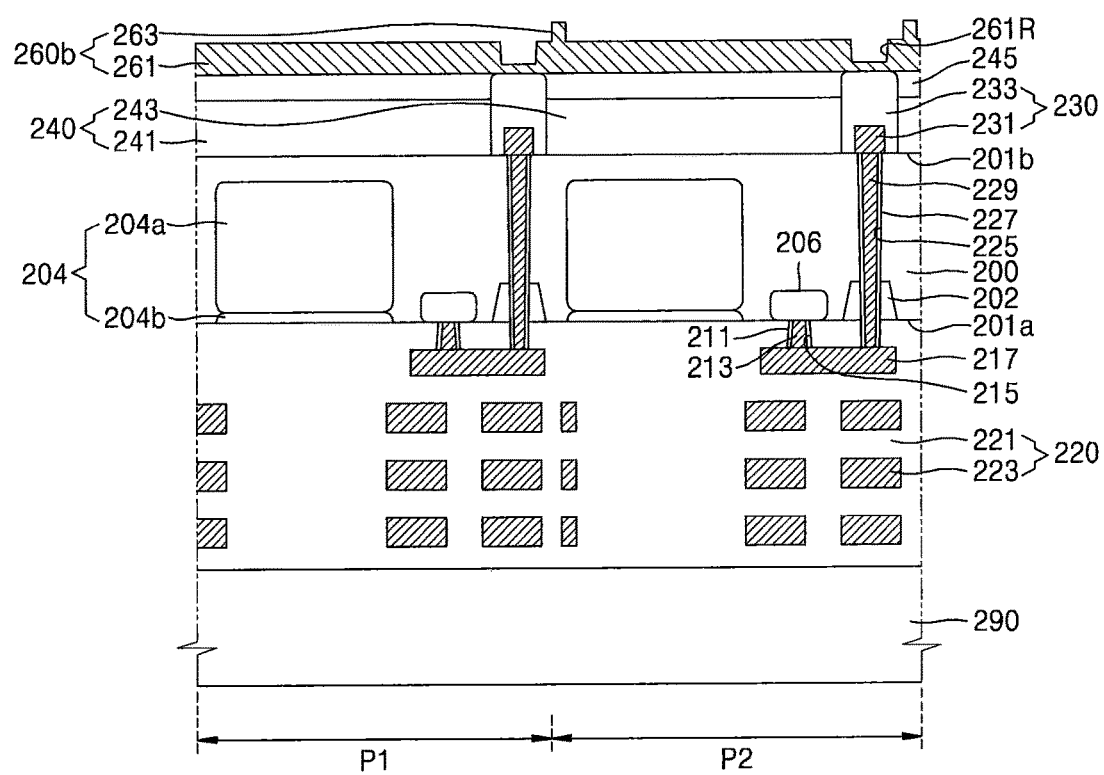
Figure 3N:
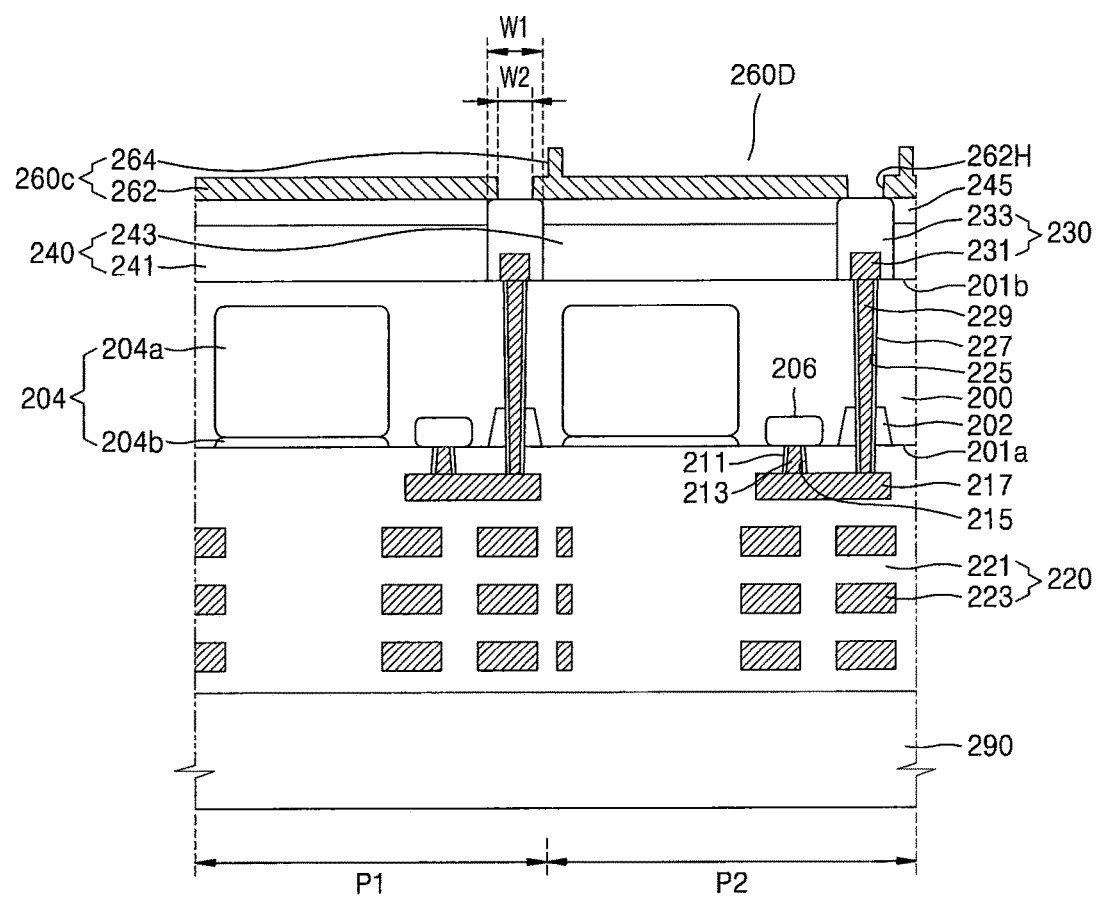
Figure 30:
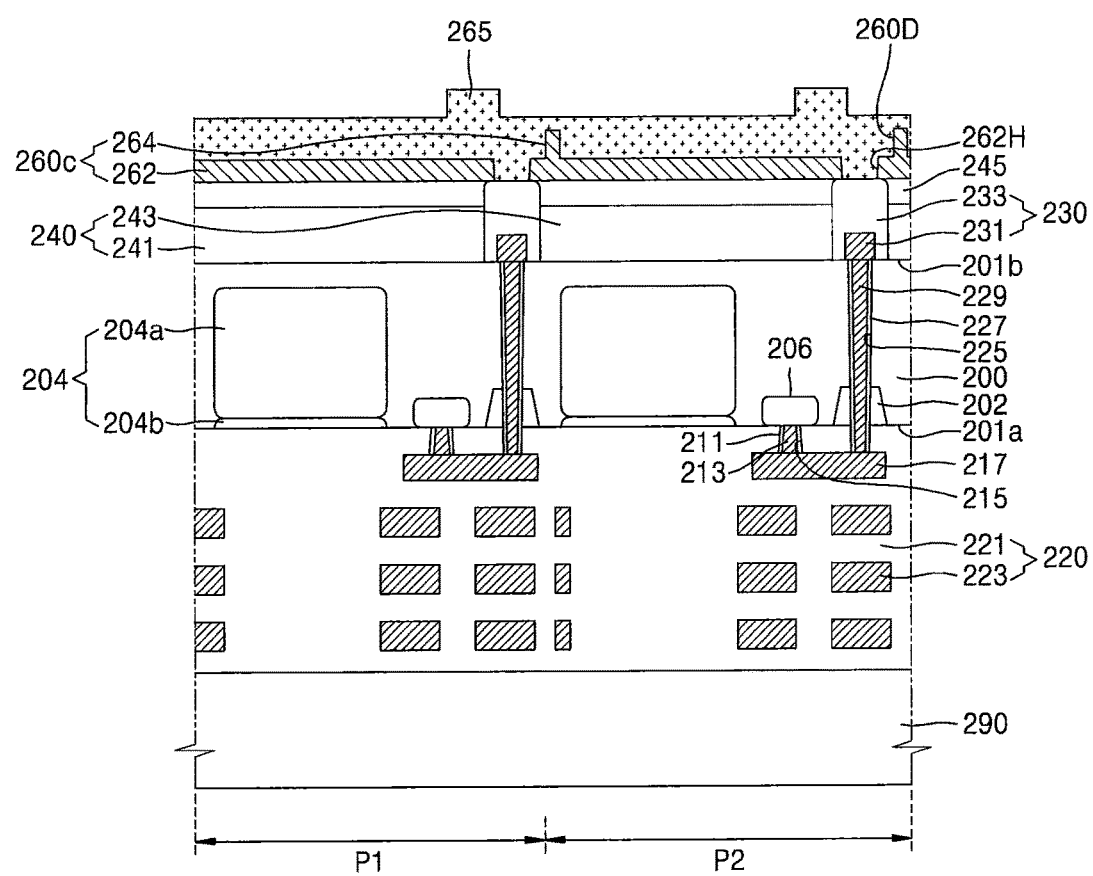
Figure 3P:
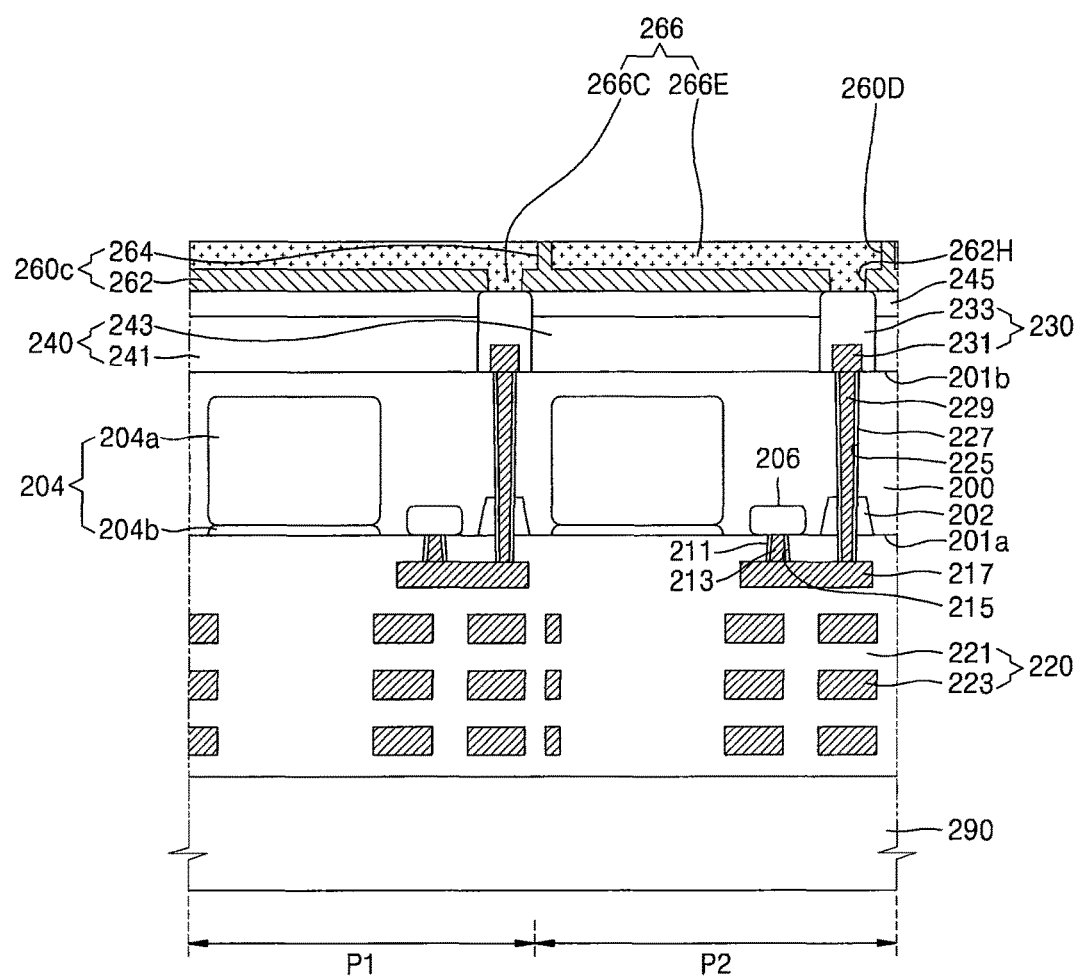
Figure 3Q:
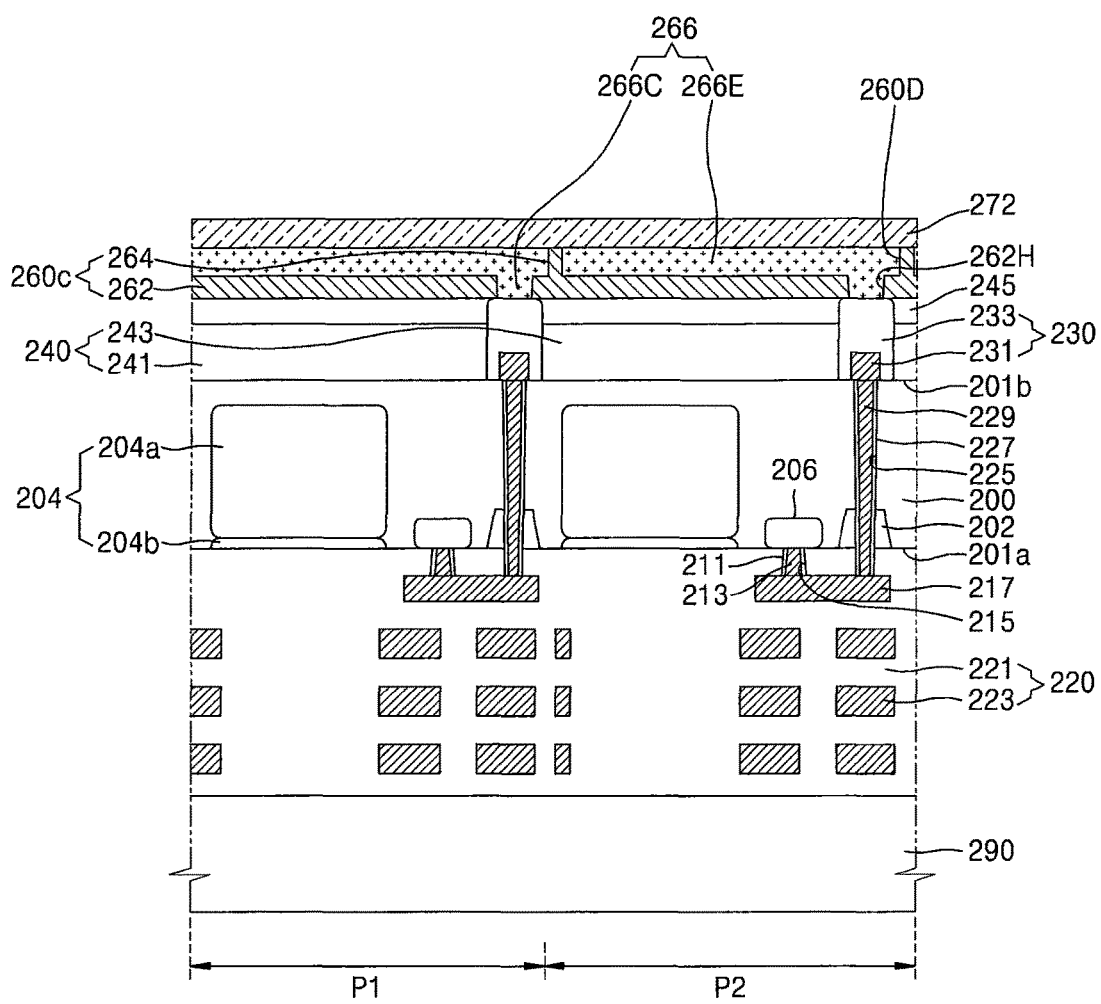
Figure 3R:
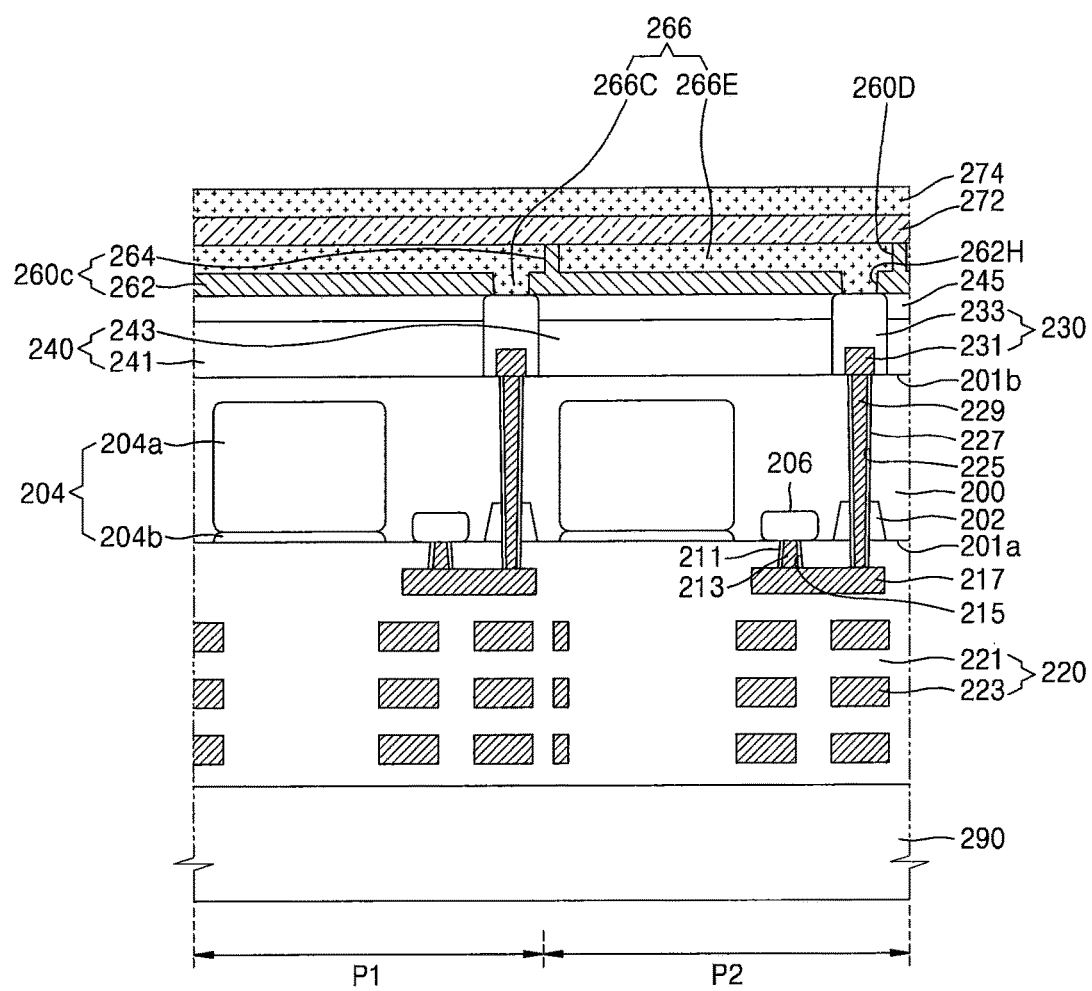

FIGS. 3A to 3R are cross-sectional views illustrating a process of manufacturing an image sensor according to some embodiments of present inventive concepts. In detail, FIGS. 3A to 3R are cross-sectional views illustrating a process of manufacturing the image sensor 1 shown in FIG.

1. In the description of FIGS. 3A to 3R, content/descriptions duplicated with reference to FIG. 1 may be omitted.

Referring to FIG. 3A, the semiconductor substrate 200 having a plurality of pixel areas defined by the device isolation layer 202 is prepared. The plurality of photoelectric transducers 204 and the plurality of storage node areas 206 spaced apart from the plurality of photoelectric transducers 204 are formed in the plurality of pixel areas of the semiconductor substrate 200, respectively.

The semiconductor substrate 200 may be, for example, any one of a bulk substrate, an epitaxial substrate, and an SOI substrate. The semiconductor substrate 200 may include, for example, silicon. Also, the semiconductor substrate 200 may include a semiconductor element such as Ge or a compound semiconductor such as SiC, GaAs, InAs, and InP. The semiconductor substrate 200 may be formed based on a first conductivity-type semiconductor substrate. The semiconductor substrate 200 may be, for example, a P-type semiconductor substrate.

The plurality of photoelectric transducers 204 may be formed to be arranged in the semiconductor substrate 200. Each of the plurality of photoelectric transducers 204 may be disposed in the semiconductor substrate 200 to correspond to each of the plurality of pixel areas. The photoelectric transducer 204 may be formed deeply from a surface of the semiconductor substrate 200. The photoelectric transducer 204 may include the first impurity area 204a and the second impurity area 204b. The first impurity area 204a may be formed deeply from a surface of the semiconductor substrate 200, and the second impurity area 204b may be formed shallowly from the surface. The first impurity area 204a and the second impurity area 204b may have different conductivity types. For example, the first impurity area 204a may be an area doped with N-type impurities, and the second impurity area 204b may be an area doped with P-type impurities.

The plurality of storage node areas 206 spaced apart from the plurality of photoelectric transducers 204 and in contact with or adjacent to the surface of the semiconductor substrate 200 are formed in the plurality of pixel areas of the semiconductor substrate 200, respectively. The storage node area 206 may be an impurity area doped with N-type impurities. The storage node area 206 may be formed as a single doped area, and may have a smaller area than that of the photoelectric transducer 204.

Referring to FIG. 3B, the wiring structure 220 is disposed on the first side 201a of the semiconductor substrate 200.

In the wiring structure 220, the first contact hole 215 is formed, the first side insulating layer 211 is formed on a side of the first contact hole 215, the first contact hole 215 is completely filled, and the first contact via 213 in contact with the first side insulating layer 211 is formed. A width of the first contact hole 215 may gradually increase as it moves upward from the surface of the semiconductor substrate 200. The first side insulating layer 211 may be formed of an oxide or a nitride. The first contact via 213 may be formed of, for example, a metallic material such as copper, aluminum, and tungsten.

After that, the buffer area 217 adjacent to the semiconductor substrate 200 and in contact with the first contact via 213 is formed.

The buffer area 217 may be electrically connected to the storage node area 206 formed on the semiconductor substrate 200 through the first contact via 213. The buffer area 217 may include, for example, a metallic material such as copper, aluminum, and tungsten or carbon nanotubes.

The wiring structure 220 may include the front interlayer dielectric 221 and the plurality of front wires 223. The front interlayer dielectric 221 may include an HDP oxide film, a TEOS oxide film, TOSZ, SOG, USG, a low-k dielectric layer, etc. The plurality of front wires 223 may include, for example, a metallic material such as copper, aluminum, and tungsten.

The supporting layer 290 may be adhered to the wiring structure 220. The supporting layer 290 may be used to provide strength to the semiconductor substrate 200 which is thinned through a polishing process. In some embodiments, the supporting layer 290 may be formed of a silicon oxide, a silicon nitride, and/or a semiconductor material.

Referring to FIG. 3C, the semiconductor substrate 200 is turned over (e.g., flipped/rotated) to allow the wiring structure 220 to be disposed below the semiconductor substrate 200. After that, a part of a top of the semiconductor substrate 200, that is, a bottom of the semiconductor substrate 200 shown in FIG. 3B distinguished by a dotted/broken line, is removed Referring to FIG. 3D, the second contact hole 225 which penetrates and extends through the semiconductor substrate 200 from the second side 201b of the semiconductor substrate 200 to the buffer area 217 is formed. A width of the second contact hole 225 may gradually increase as it approaches the second side 201b of the semiconductor substrate 200 from the buffer area 217. In some embodiments, the second contact hole 225 may be formed to penetrate the device isolation layer 202.

The second side insulating layer 227 may be formed on a side of the second contact hole 225. The second side insulating layer 227 may be formed of an oxide or a nitride. The second contact hole 225 may be filled with the second contact via 229. The second contact via 229 may completely fill the second contact hole 225 to be in contact with the second side insulating layer 227. Accordingly, the second contact via 229 may penetrate the semiconductor substrate 200. The second contact via 229 may be formed of, for example, a metallic material such as copper, aluminum, and tungsten.

Referring to FIG. 3E, the stud layer 230 electrically connected with the second contact via 229 may be formed on the second side 201b of the semiconductor substrate 200. The stud layer 230 may include the first stud layer 231 formed on the second side 201b of the semiconductor substrate 200 and the second stud layer 233 formed on the first stud layer 231. The second stud layer 233 may be formed to surround side and top surfaces of the first stud layer 231, thereby having a larger width than that of the first stud layer 231. The first stud layer 231 and the second stud layer 233 may be formed of different metallic materials. In some embodiments, the first stud layer 231 may be formed of tungsten and the second stud layer 233 may be formed of aluminum. The stud layer 230 may have the first width W1. When the second stud layer 233 has a larger width than that of the first stud layer 231, the second stud layer 233 may have the first width W1.

Referring to FIG. 3F, the color filter layer 240 may be formed on the second side 201b of the semiconductor substrate 200. The color filter layer 240 may allow light incident through the micro lens 280 to pass, thereby allowing only light with a necessary wavelength to be incident on the photoelectric transducer 204 through the second side 201b. In some embodiments, an anti-reflection layer may be formed between the second side 201b and the color filter layer 240 of the semiconductor substrate 200 to allow light to be incident on the photoelectric transducer 204 by reducing/preventing the reflection of light. The anti-reflection layer may be formed of, for example, SiON, SiC, SiCN, SiCO, etc.

The color filter layer 240 may include the first color filter layer 241 and the second color filter layer 243. The first color filter layer 241 and the second color filter layer 243 may be disposed in the pixel area P1 and the second pixel area P2 to correspond to the photoelectric transducers 204 formed therein, respectively. In some embodiments, the first color filter layer 241 disposed in the first pixel area P1 may be a red (R) color filter and the second color filter layer 243 disposed in the second pixel area P2 may be a blue (B) color filter. Accordingly, the first pixel area P1 transmits light with a red wavelength to allow the red wavelength to arrive at the photoelectric transducer 204. Also, the second pixel area P2 transmits light with a blue wavelength to allow the blue wavelength to arrive at the photoelectric transducer 204.

The color filter layer 240 may be formed to have a top surface with a lower level than that of the stud layer 230. That is, a height of the color filter layer 240 may be formed to have a smaller value than that of the stud layer 230.

Referring to FIG. 3G, the coating layer 245 may be formed on the second side 201b of the semiconductor substrate 200. The coating layer 245 may cover the color filter layer 240. The coating layer 245 may be formed by forming a coating material layer which covers a top of the semiconductor substrate 200 on which the stud layer 230 and the color filter layer 240 are formed and performing a planarization process. The coating layer 245 may expose a top surface of the stud layer 230. The coating layer 245 and the stud layer 230 may have top surfaces with the same level. That is, the top surfaces of the coating layer 245 and the stud layer 230 may form planes with the same level (i.e., the top surfaces may be coplanar). The coating layer 245 may be formed by forming the coating material layer and then removing a part of the coating material layer until the top surface of the stud layer 230 is exposed. The coating layer 245 may be formed of a transparent organic material. In some embodiments, the coating layer 245 may be formed of a resin. The coating layer 245 may be on top of (e.g., may directly contact top surfaces of) the plurality of color filter layers 240.

Referring to FIG. 3H, a preliminary insulating layer 260 which covers the coating layer 245 and the stud layer 230 is formed. After that, a first photoresist layer M1 is formed on the preliminary insulating layer 260. The first photoresist layer M1 may be formed at a position corresponding to the isolation layer 264 shown in FIG. 1.

Referring to FIG. 3I, with the first photoresist layer M1 as an etching mask, a preliminary insulating layer 260a with a protruding portion 263 formed on a top thereof is formed by removing a part from a top surface of the preliminary insulating layer 260 in FIG. 3H. The preliminary insulating layer 260a may include a base portion 261, which covers the coating layer 245 and the stud layer 230, and the protruding portion 263, which protrudes from the base portion 261.

Referring to FIG. 3J, the first photoresist layer M1 in FIG. 3I is removed. The first photoresist layer M1 may be removed by an ashing process.

Referring to FIG. 3K, a second photoresist layer M2 with a resist hole M2H which exposes a part of the preliminary insulating layer 260a having the protruding portion 263 is formed. The resist hole M2H may be disposed at a position corresponding to the opening 262H shown in FIG. 1. The second photoresist layer M2 may cover the entire protruding portion 263.

Referring to FIG. 3L, with the second photoresist layer M2 as an etching mask, a preliminary insulating layer 260b with a plurality of recessed portions 261R is formed by removing a part of the preliminary insulating layer 260a in FIG. 3K. The plurality of recessed portions 261R may be disposed at positions corresponding to the openings 262H shown in FIG. 1.

The plurality of recessed portions 261R may be formed to not completely pass through the preliminary insulating layer 260b. Accordingly, even when a misalignment occurs during a process of forming the second photoresist layer M2, the coating layer 245 may not be exposed at bottoms of the plurality of recessed portions 261R.

Referring to FIG. 3M, the second photoresist layer M2 in FIG. 3L is removed. The second photoresist layer M2 may be removed by an ashing process.

The coating layer 245 may have properties similar to those of the second photoresist layer M2, for example, a property of being removed by the ashing process. Accordingly, when the coating layer 245 is exposed at the bottoms of the plurality of recessed portions 261R, at least a part of the coating layer 245 may be removed during a process of removing the second photoresist layer M2. However, since the plurality of recessed portions 261R may be formed to not completely pass through the preliminary insulating layer 260b in such a way that the coating layer 245 is not exposed at the bottoms of the plurality of recessed portions 261R, it is possible to protect/prevent at least a portion of the coating layer 245 from being removed during the process of removing the second photoresist layer M2.

Referring to FIG. 3N, the isolation-insulating layer 260c with the plurality of openings 262H is formed by removing a portion from a top of the preliminary insulating layer 260b in FIG. 3M having the plurality of recessed portions 261R in FIG. 3M and the protruding portion 263. The plurality of openings 262H may be formed by removing a portion of the preliminary insulating layer 260b from the bottoms of the plurality of recessed portions 261R. The plurality of openings 262H may pass through the isolation-insulating layer 260c.

The isolation-insulating layer 260c may be formed of, for example, an oxide. The isolation-insulating layer 260c may include the base layer 262 and the isolation layer 264 formed on the base layer 262. The base layer 262 may have the opening 262H which exposes at least a part of the stud layer 230. The isolation space 260D defined by the isolation-insulating layer 260c, that is, the base layer 262 and the isolation layer 264, may be formed. A plurality of isolation spaces 260D may be formed to correspond to the plurality of pixel areas P1 and P2.

The isolation space 260D refers to a portion/region/area between a bottom surface level and a top surface level of the isolation-insulating layer 260c where the isolation-insulating layer 260c is not formed. That is, the isolation space 260D may include a space surrounded by the isolation layer 264 between levels of a top surface of the base layer 262 and a top surface of the isolation layer 264 and a space in the opening 262H. The plurality of isolation spaces 260D which are isolated from each other may be formed to correspond to the plurality of pixel areas P1 and P2. That is, each of the plurality of isolation spaces 260D may be formed to correspond to each of the plurality of photoelectric transducers 204.

The second width W2, which is the width of the opening 262H, may have a smaller value than that of the first width W1 of the stud layer 230. The coating layer 245 may not be exposed and the top surface thereof may be completely covered due to the isolation-insulating layer 260c with the openings 262H. That is, the top surface of the coating layer 245 may be totally covered by the isolation-insulating layer 260c so as to not be exposed at a bottom of the opening 262H. However, in some embodiments, when a misalignment occurs during the process of forming the second photoresist layer M2 of FIG. 3K, a portion of the coating layer 245 may be exposed at the bottom of the opening 262H.

Referring to FIG. 3O, a lower transparent material layer 265 which covers a top of the isolation-insulating layer 260c to fill the isolation space 260D is formed. The lower transparent material layer 265 may be formed of, for example, ITO, IZO, ZnO, $SnO_2$, ATO, AZO, GZO, $TiO_2$, or FTO.

Referring to FIG. 3P, the lower transparent electrode layer 266 which fills the isolation space 260D may be formed on the isolation-insulating layer 260c by performing a planarization process on the lower transparent material layer 265 in FIG. 3O until the isolation-insulating layer 260c, that is, the isolation layer 264, is exposed. The planarization process for forming the lower transparent electrode layer 266 may be performed by a CMP process.

The lower transparent electrode layer 266 may include the lower contact 266C, which fills an inside of the opening 262H, and the lower electrode 266E, which is connected with the lower contact 266C and disposed on the top surface of the base layer 262.

That is, the lower transparent electrode layer 266 may be formed to fill the isolation space 260D using a dual damascene method. Accordingly, the lower contact 266C and the lower electrode 266E may be integrally formed. A top surface of the lower transparent electrode layer 266 and a topmost end of the isolation-insulating layer 260c may have the same level. In particular, the top surface of the lower transparent electrode layer 266 and a top end of the isolation layer 264 may have the same level. That is, the top surface of the lower transparent electrode layer 266 and the top surface of the isolation layer 264 may form planes with the same level (i.e., the top surfaces may be coplanar).

Due to the isolation layer 264, the lower transparent electrode layer 266 may be separated to correspond to each of the first pixel area P1 and the second pixel area P2. That is, a plurality of such separated lower transparent electrode layers 266 may be formed to correspond to the plurality of pixel areas P1 and P2. In detail, the lower contact 266C and the lower electrode 266E, which form the lower transparent electrode layer 266 filling a single isolation space 260D, may be integrally formed.

When the coating layer 245 is not exposed at the bottom of the opening 262H, the coating layer 245 may be spaced apart to not be in contact with the lower transparent electrode layer 266. However, in some embodiments, when a misalignment occurs during the process of forming the second photoresist layer M2 of FIG. 3K, a portion of the coating layer 245 may be in contact with the lower transparent electrode layer 266.

Referring to FIG. 3Q, the organic photoelectric layer 272 is formed on the lower transparent electrode layer 266. The organic photoelectric layer 272 may be integrally formed on the plurality of lower transparent electrode layers 266. The organic photoelectric layer 272 may be an organic material which causes a photoelectric change only in light with a particular wavelength. For example, the organic photoelectric layer 272 may cause the photoelectric change only at a wavelength of green light. For example, the organic photoelectric layer 272 may show a maximum absorption wavelength λmax from about 500 nm to about 600 nm in both of the first and second pixel areas P1 and P2.

The organic photoelectric layer 272 may have, for example, a thickness from about 1 nm to about 500 nm. In some embodiments, the organic photoelectric layer 272 may have a thickness from about 5 nm to about 300 nm. The organic photoelectric layer 272 may have a thickness capable of effectively improving photoelectric conversion efficiency by effectively absorbing light and effectively separating and transferring positive holes and electrons.

Referring to FIG. 3R, the upper transparent electrode layer 274 is formed on the organic photoelectric layer 272. The upper transparent electrode layer 274 may be formed of, for example, ITO, IZO, ZnO, $SnO_2$, ATO, AZO, GZO, $TiO_2$, or FTO. The upper transparent electrode layer 274 may be integrally (e.g., continuously) formed across the first pixel area P1 and the second pixel area P2.

After that, as shown in FIG. 1, the micro lens 280 corresponding to the color filter layer 240 is formed on the upper transparent electrode layer 274, thereby forming the image sensor 1. The micro lens 280 may be formed to overlap the corresponding color filter layer 240. A plurality of such micro lenses 280 may be formed to correspond to respective ones of the plurality of color filter layers 240. The micro lens 280 may change a path of light incident on areas except (other than) the photoelectric transducer 204, and may concentrate the light on the photoelectric transducer 204.

In some embodiments, the protective layer 278 may be further formed between the micro lens 280 and the upper transparent electrode layer 274. The protective layer 278 may be formed of a transparent insulating material.

According to the method(s) of manufacturing the image sensor according to FIGS. 3A-3R, even when a misalignment occurs during the process of forming the second photoresist layer M2 in FIG. 3K, it is possible to protect/prevent the coating layer 245 from being damaged, and thereby a reliable image sensor may be formed.

FIGS. 4A to 4E are cross-sectional views illustrating a process of manufacturing the image sensor 1 of FIG. 1 according to some embodiments of present inventive concepts. In the description of FIGS. 4A to 4E, content/descriptions duplicated with reference to FIGS. 1 and 3A to 3R may be omitted. In detail, FIGS. 4A to 4E are cross-sectional views illustrating a process after the operation(s) shown in FIG. 3G.

Figure 4A:
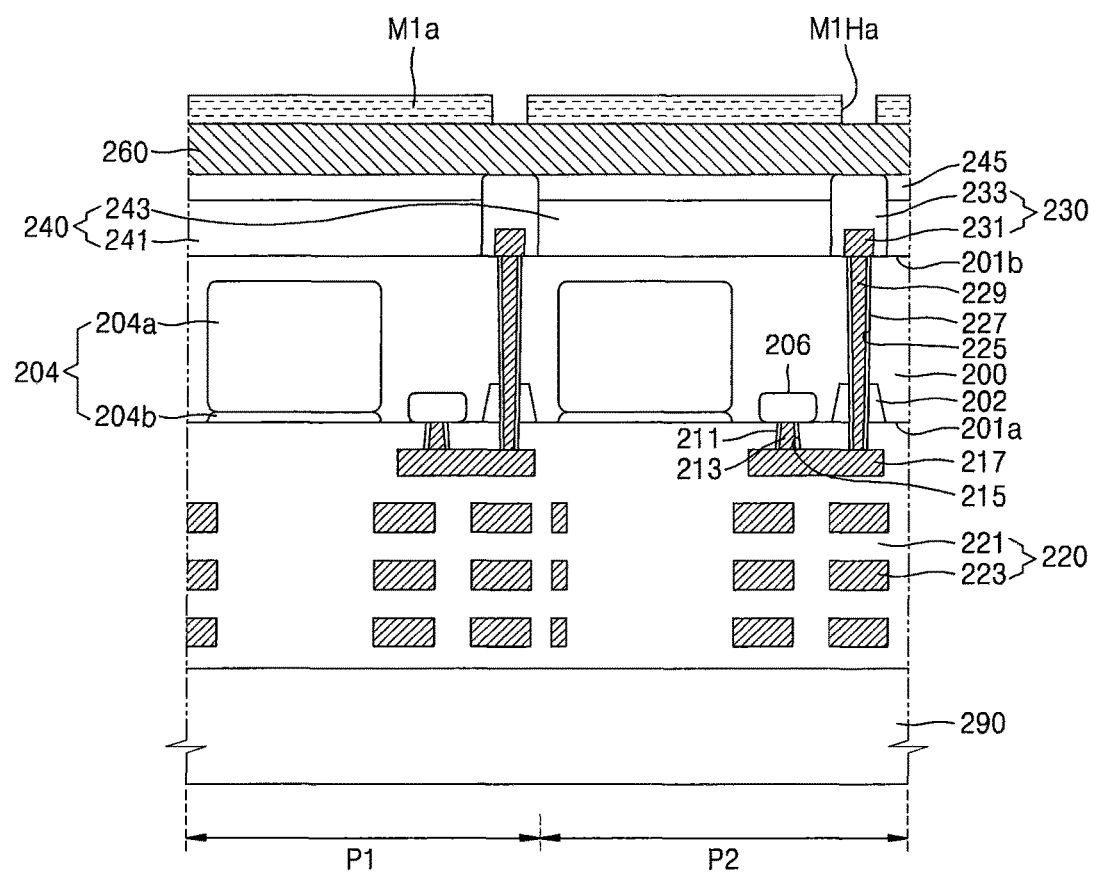
FIGS. 4A to 4E are cross-sectional views illustrating a process of manufacturing the image sensor according to some embodiments of present inventive concepts.

Referring to FIG. 4A, a first photoresist layer M1a with a resist hole M1Ha which exposes a part of the preliminary insulating layer 260 is formed on the preliminary insulating layer 260. The resist hole M1Ha may be disposed at a position corresponding to the opening 262H shown in FIG. 1.

Figure 4B:
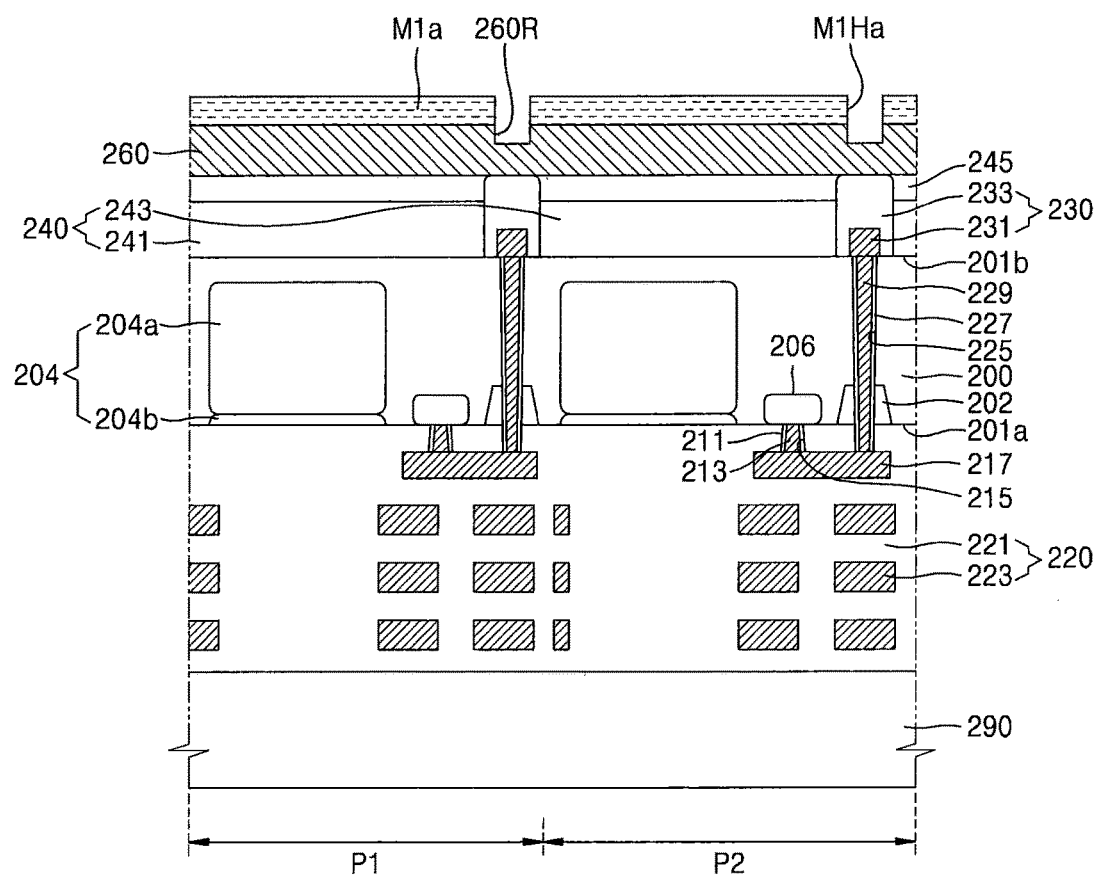

Referring to FIG. 4B, with the first photoresist layer M1a as an etching mask, a plurality of recessed portions 260R are formed by removing a portion of the preliminary insulating layer 260. The plurality of recessed portions 260R may be disposed at positions corresponding to the openings 262H shown in FIG. 1.

The plurality of recessed portions 260R may be formed to not completely pass through the preliminary insulating layer 260.

Figure 4C:
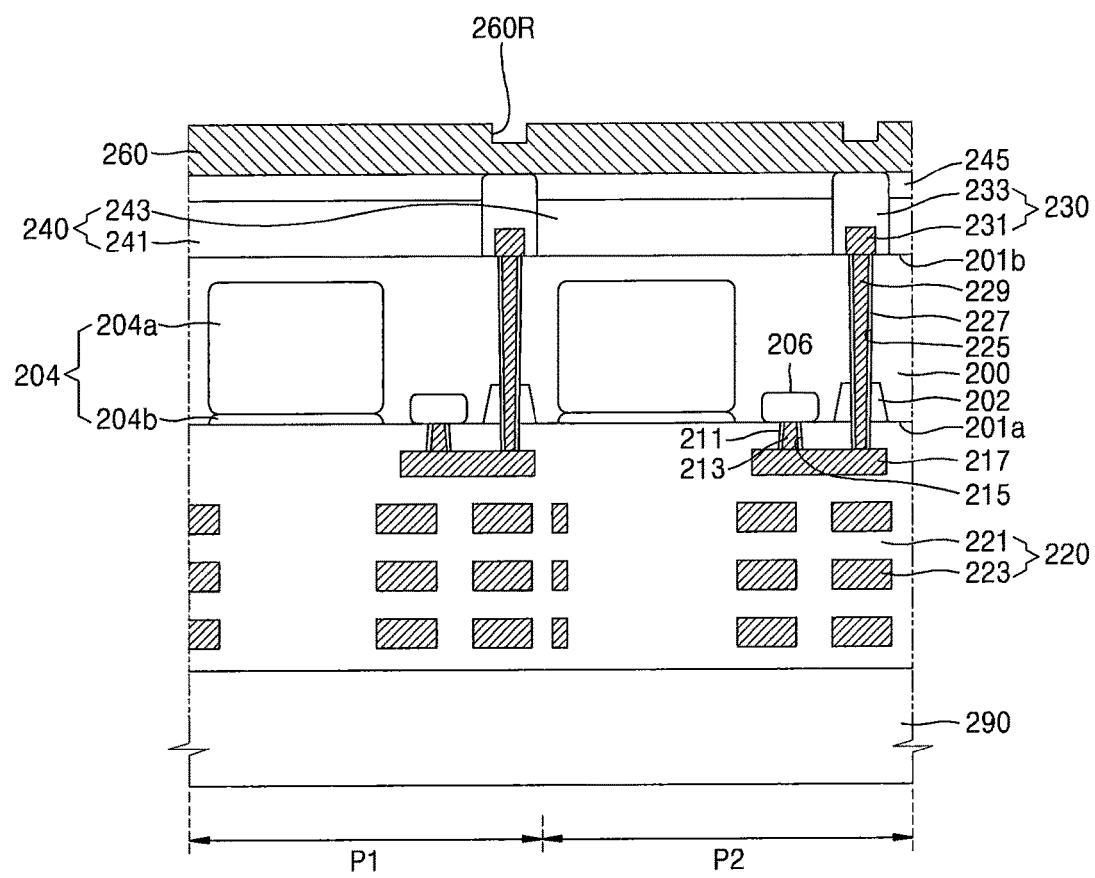

Referring to FIG. 4C, the first photoresist layer M1a in FIG. 4B is removed. The first photoresist layer M1a may be removed by an ashing process.

Figure 4D:
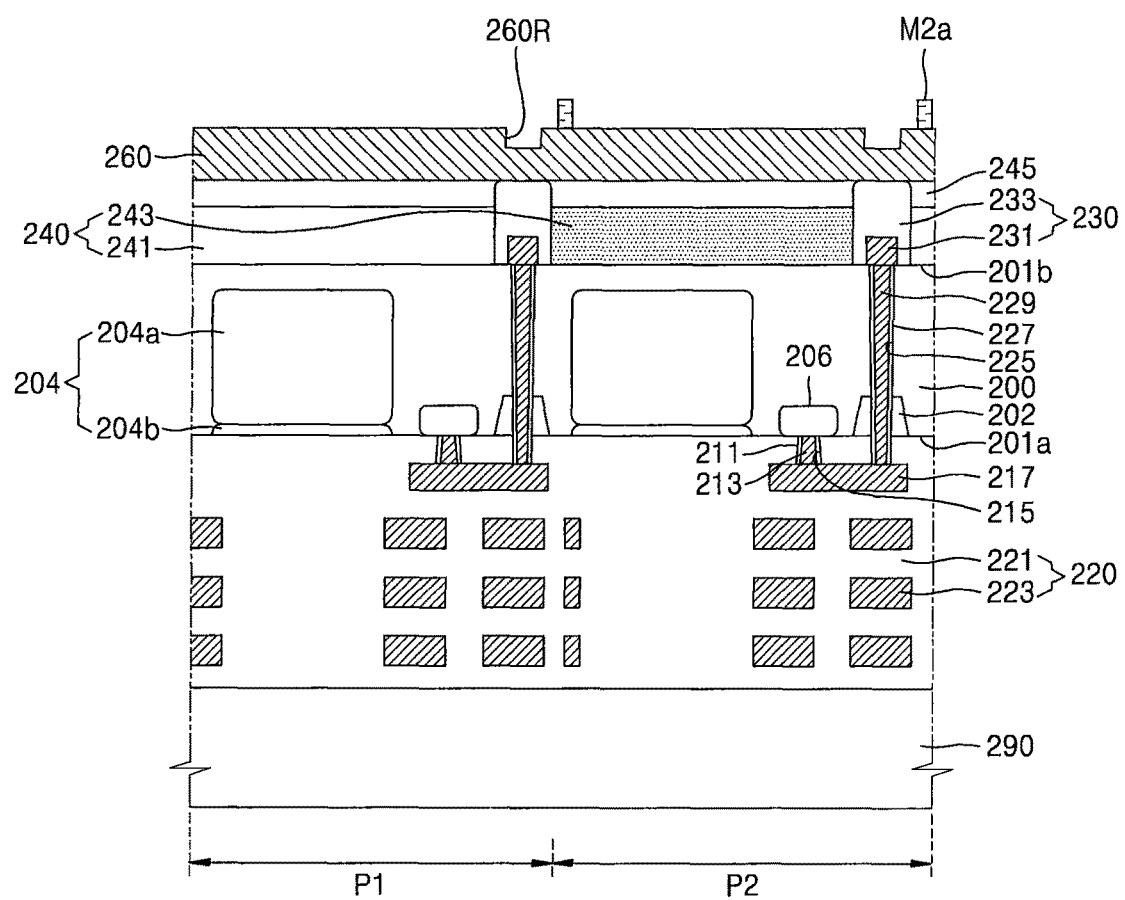

Referring to FIG. 4D, a second photoresist layer M2a is formed on the preliminary insulating layer 260. The second photoresist layer M2a may be formed at a position corresponding to the isolation layer 264 shown in FIG. 1.

Figure 4E:
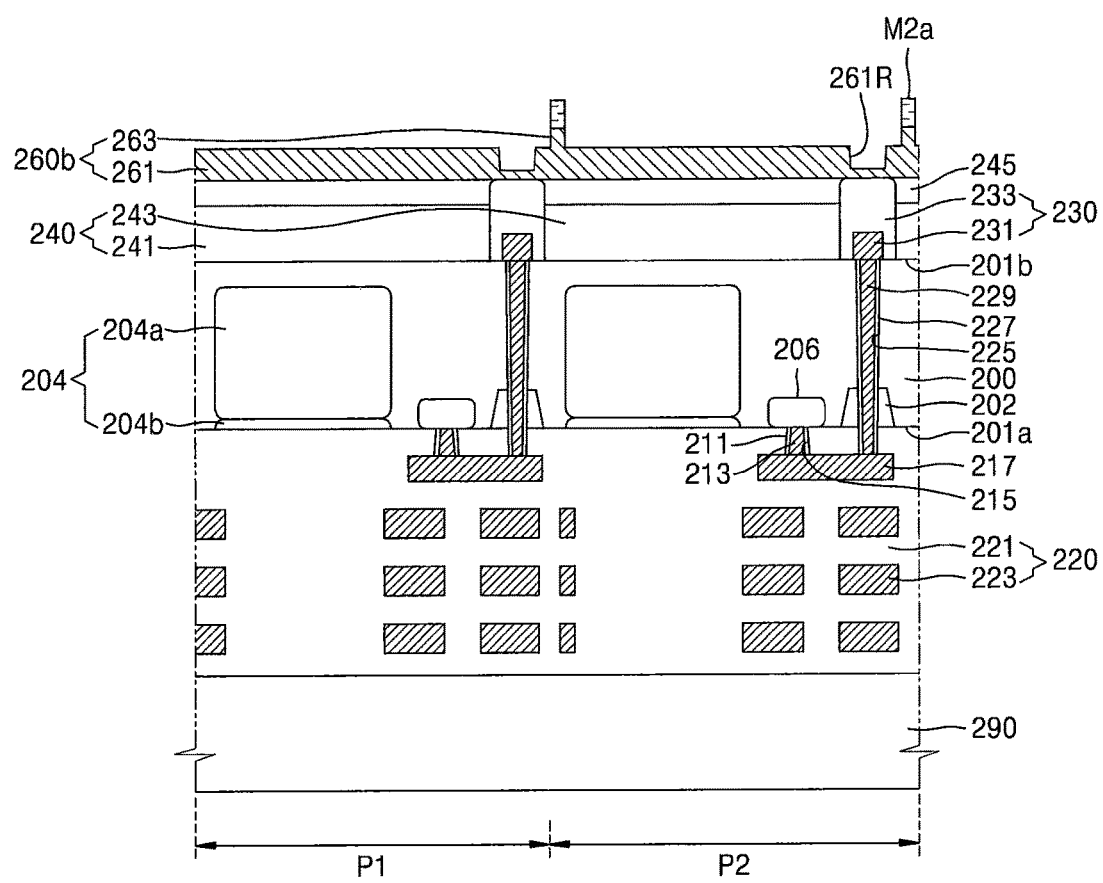

Referring to FIG. 4E, with the second photoresist layer M2a as an etching mask, the preliminary insulating layer 260b with the protruding portion 263 formed on/as a top thereof is formed by removing a portion from a top surface of the preliminary insulating layer 260 in FIG. 4D. The preliminary insulating layer 260b may include the base portion 261, which covers the coating layer 245 and the stud layer 230, and the protruding portion 263, which protrudes from the base portion 261. During a process of forming the protruding portion 263, the plurality of recessed portions 261R may increase in depth to be deeper than the plurality of recessed portions 260R shown in FIG. 4D.

After that, the second photoresist layer M2a is removed, and thereby the result shown in FIG. 3M may be obtained. A plurality of recessed portions 261R may be formed to not completely pass through the preliminary insulating layer 260b. Accordingly, even when a misalignment occurs during a process of forming the first photoresist layer M1a in FIG. 4A, the coating layer 245 may not be exposed at bottoms of the plurality of recessed portions 261R.

After that, the image sensor 1 shown in FIG. 1 may be formed through the processes shown in FIGS. 3N to 3R.

Figure 5A:
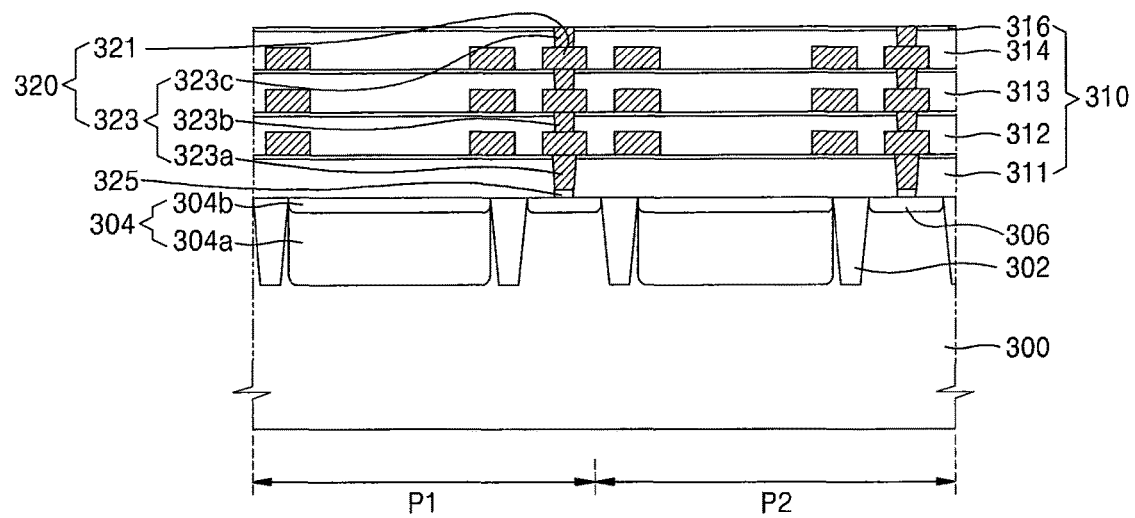
FIGS. 5A to 5O are cross-sectional views illustrating a process of manufacturing the image sensor according to some embodiments of present inventive concepts.

FIGS. 5A to 5O are cross-sectional views illustrating a process of manufacturing an image sensor according to some embodiments of present inventive concepts. In detail, FIGS. 5A to 5O are cross-sectional views illustrating the process of manufacturing the image sensor 2 shown in FIG. 2. In the description of FIGS. 5A to 5O, content/descriptions duplicated with reference to FIGS. 2 and 3A to 3R may be omitted.

Referring to FIG. 5A, the semiconductor substrate 300 with the plurality of pixel areas P1 and P2 defined by the device isolation layer 302 is prepared. A plurality of photoelectric transducers 304 and the plurality of storage node areas 306 spaced apart from the plurality of photoelectric transducers 304 are formed in the plurality of pixel areas P1 and P2 of the semiconductor substrate 300, respectively.

The photoelectric transducers 304 may be disposed in the semiconductor substrate 300 to correspond to each of the first and second pixel areas P1 and P2. Each photoelectric transducer 304 may be a photodiode. Each photoelectric transducer 304 may include the first impurity area 304a and the second impurity area 304b. The first impurity area 304a may be formed deeply from a top surface of the semiconductor substrate 300. The second impurity area 304b may be formed shallowly at the top surface of the semiconductor substrate 300. The first impurity area 304a and the second impurity area 304b may include different conductivity types. For example, the first impurity area 304a may be doped with N-type impurities, and the second impurity area 304b may be doped with P-type impurities.

The photoelectric transducer 304 may include pixels which sense red light and blue light. For example, a pixel which senses red light may be in the first pixel area P1, and a pixel which senses blue light may be in the second pixel area P2. The storage node area 306 may be disposed in the semiconductor substrate 300 to correspond to each of the first and second pixel areas P1 and P2 while being spaced apart from the photoelectric transducer 304. The storage node area 306 may be, for example, doped with N-type impurities. The storage node area 306 may be formed as a single doped area and may have a smaller area than that of the photoelectric transducer 304.

The interlayer dielectric structure 310 may be disposed on the semiconductor substrate 300. The interlayer dielectric structure 310 may include the plurality of interlayer dielectrics (e.g., dielectric layers) 311, 312, 313, and 314 sequentially deposited on the semiconductor substrate 300 and the etching stopper 316 disposed on a top surface of the plurality of interlayer dielectrics 311, 312, 313, and 314. In some embodiments, the interlayer dielectric 314 at a topmost end of the plurality of interlayer dielectrics 311, 312, 313, and 314 may be formed thicker than the other interlayer dielectrics 311, 312, and 313. The plurality of interlayer dielectrics 311, 312, 313, and 314 may be formed of oxides. For example, the plurality of interlayer dielectrics 311, 312, 313, and 314 may be formed of an HDP oxide film, a TEOS oxide film, TOSZ, SOG, USG, a low-k dielectric layer, etc. The etching stopper 316 may be formed of a silicon nitride film or a silicon oxynitride film.

The wiring structure 320 is disposed in each of the first pixel area P1 and the second pixel area P2 on the semiconductor substrate 300. The wiring structure 320 may be formed of, for example, a metallic material such as copper, aluminum, and tungsten. For example, the wiring structure 320 may include the interlayer wires 321 disposed in at least a portion of the plurality of interlayer dielectrics 311, 312, 313, and 314 and the contact vias 323 which pass through the plurality of interlayer dielectrics 311, 312, 313, and 314 and connect the interlayer wires 321. The contact vias 323 may include the bottommost contact via 323a, the intermediate contact via 323b, and the topmost contact via 323c. The bottommost contact via 323a may be in contact with the storage node area 306.

In some embodiments, the buffer via 325 may be provided between the bottommost contact via 323a and the storage node area 306. The buffer via 325 may include, for example, carbon nanotubes. The buffer via 325 may provide, for example, a material with a work function between a metal and silicon to reduce an energy barrier between the semiconductor substrate 300 and the wiring structure 320, thereby providing adequate ohmic contact. For example, a work function of silicon may be 4.05 eV in the semiconductor substrate 300, a work function of a metal (for example, copper) may be 4.70 eV in the wiring structure 320, and a work function of the buffer via 325 (for example, carbon nanotubes) may be from about 4.3 eV to about 4.8 eV. The buffer via 325 may reduce an energy barrier between the silicon and the metal to allow electrons and/or positive holes to be better transferred to the storage node area 306 through the wiring structure 320.

Figure 5B:
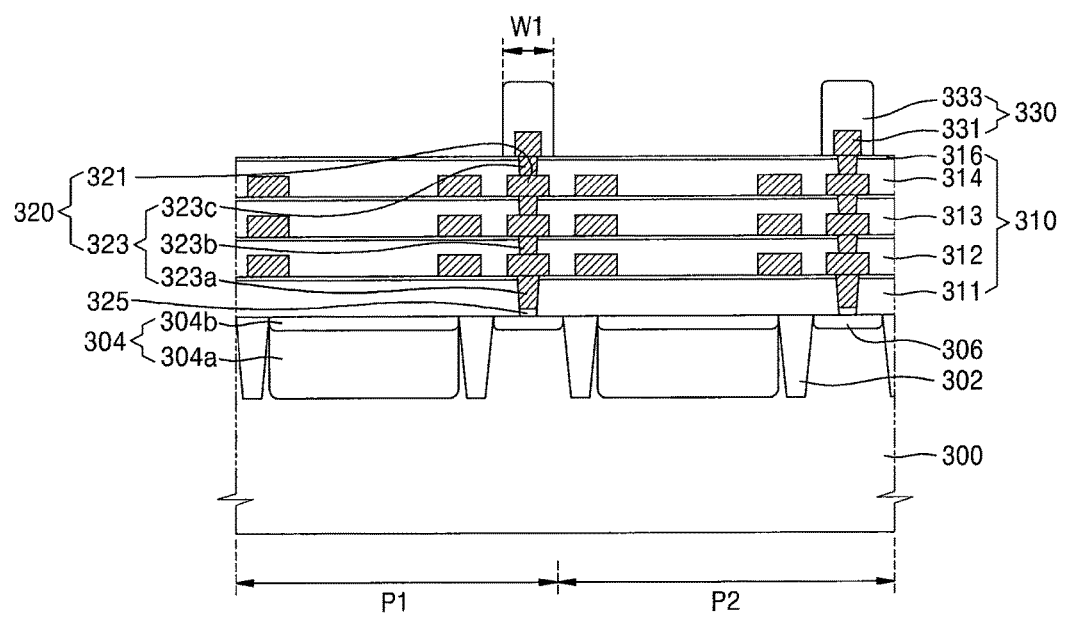

Referring to FIG. 5B, the stud layer 330 electrically connected with the contact vias 323 is formed on the wiring structure 320. The stud layer 330 may include the first stud layer 331 and the second stud layer 333 formed on the first stud layer 331. The second stud layer 333 may be formed to surround side and top surfaces of the first stud layer 331, thereby having a larger width than that of the first stud layer 331. The first stud layer 331 and the second stud layer 333 may be formed of different metallic materials. In some embodiments, the first stud layer 331 may be formed of tungsten, and the second stud layer 333 may be formed of aluminum. The stud layer 330 may have the first width W1. When the second stud layer 333 has a larger width than that of the first stud layer 331, the second stud layer 333 may have the first width W1.

Figure 5C:
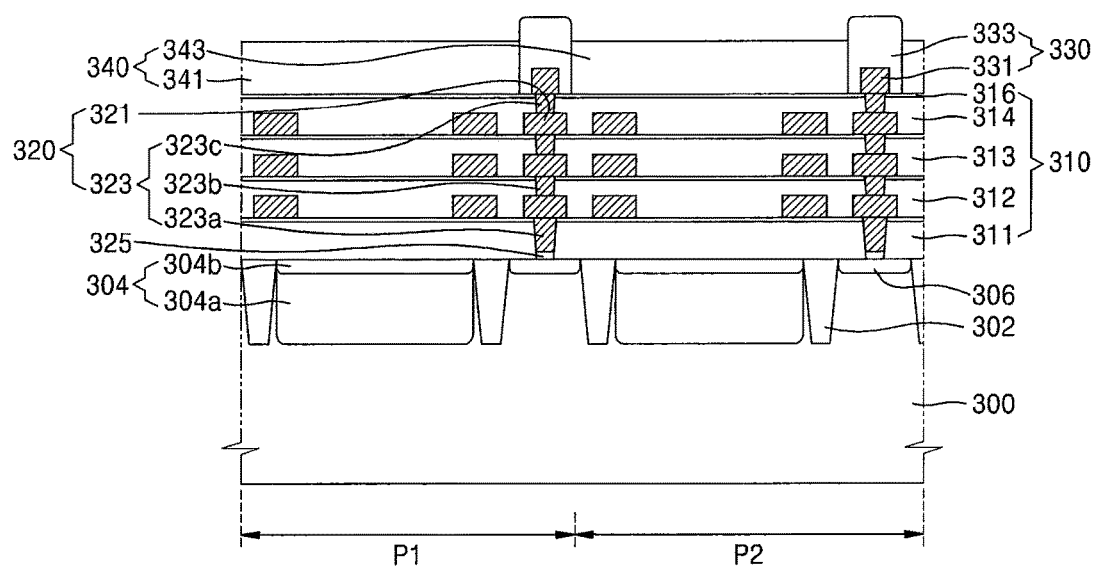

Referring to FIG. 5C, the color filter layer 340 may be formed on the wiring structure 320. The color filter layer 340 may allow light incident through the micro lens 380 to pass, thereby allowing only light with a necessary wavelength to be incident on the photoelectric transducer 304. In some embodiments, an anti-reflection layer may be formed between the color filter layer 340 and the semiconductor substrate 300 to allow the light to be incident onto the photoelectric transducer 304 by reducing/preventing the reflection of light. The anti-reflection layer may be formed of, for example, SiON, SiC, SiCN, SiCO, etc.

The color filter layer 340 may include the first color filter layer 341 and the second color filter layer 343. The first color filter layer 341 and the second color filter layer 343 may be disposed in the pixel area P1 and the second pixel area P2 to correspond to the photoelectric transducers 304 formed therein, respectively. In some embodiments, the first color filter layer 341 disposed in the first pixel area P1 may be a red (R) color filter and the second color filter layer 343 disposed in the second pixel area P2 may be a blue (B) color filter. Accordingly, the first pixel area P1 transmits light with a red wavelength to allow the red wavelength to arrive at the photoelectric transducer 304. Also, the second pixel area P2 transmits light with a blue wavelength to allow the blue wavelength to arrive at the photoelectric transducer 304.

The color filter layer 340 may be formed to have a top surface with a lower level than that of the stud layer 330. That is, a height of the color filter layer 340 may be formed to have a smaller value than that of the stud layer 330.

Figure 5D:
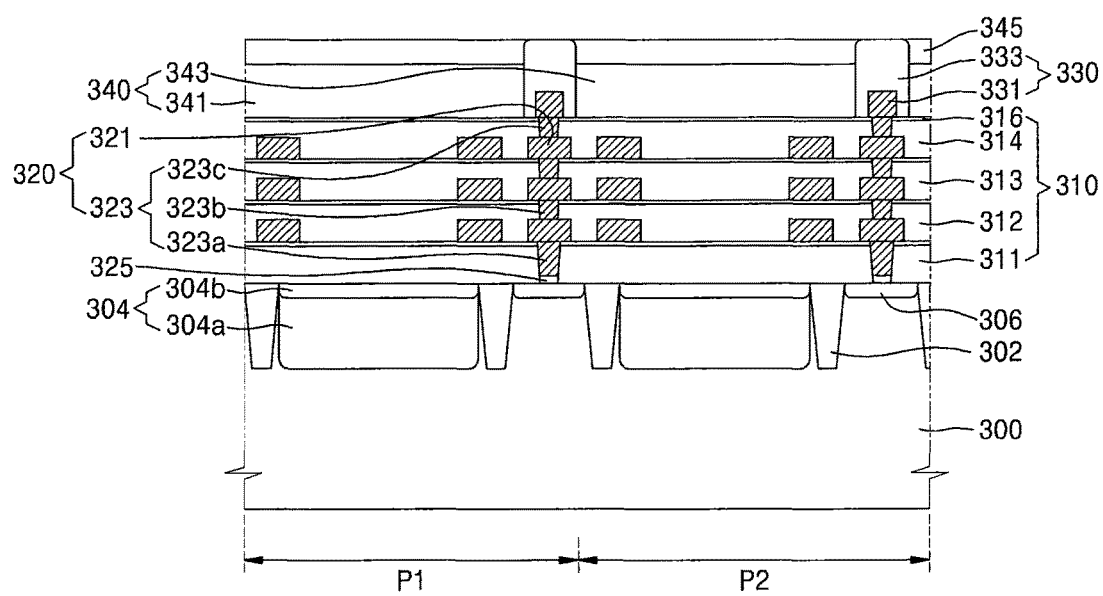

Referring to FIG. 5D, the coating layer 345 which covers the color filter layer 340 is formed. The coating layer 345 may be formed by forming a coating material layer which covers a top of the semiconductor substrate 300 on which the stud layer 330 and the color filter layer 340 are formed and performing a planarization process. The coating layer 345 may expose a top surface of the stud layer 330. The coating layer 345 and the stud layer 330 may have top surfaces with the same level. That is, the top surfaces of the coating layer 345 and the stud layer 330 may form planes with the same level (i.e., the surfaces may be coplanar). The coating layer 345 may be formed by forming the coating material layer and then partially removing the coating material layer until the top surface of the stud layer 330 is exposed. The coating layer 345 may be formed of a transparent organic material. In some embodiments, the coating layer 345 may be formed of resin. The coating layer 345 may be on top of (e.g., may directly contact top surfaces of) the plurality of color filter layers 340.

Figure 5E:
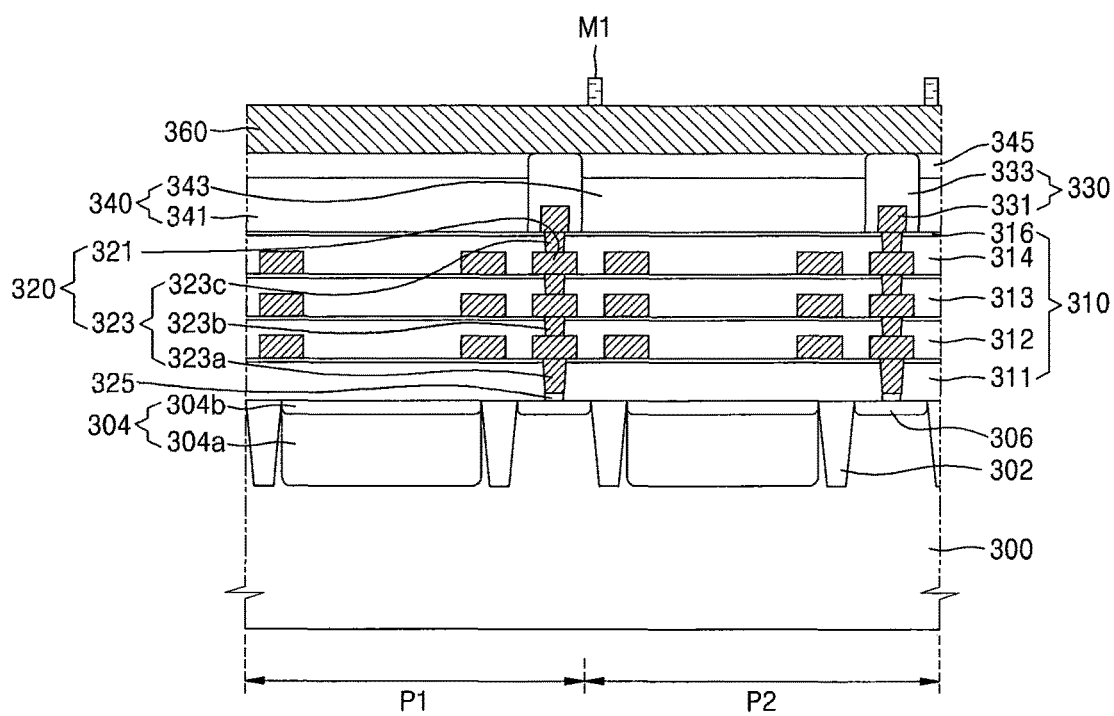

Referring to FIG. 5E, the preliminary insulating layer 360, which covers the coating layer 345 and the stud layer 330, is formed. After that, the first photoresist layer M1 is formed on the preliminary insulating layer 360. The first photoresist layer M1 may be formed at a position corresponding to the isolation layer 364 shown in FIG. 2.

Figure 5F:
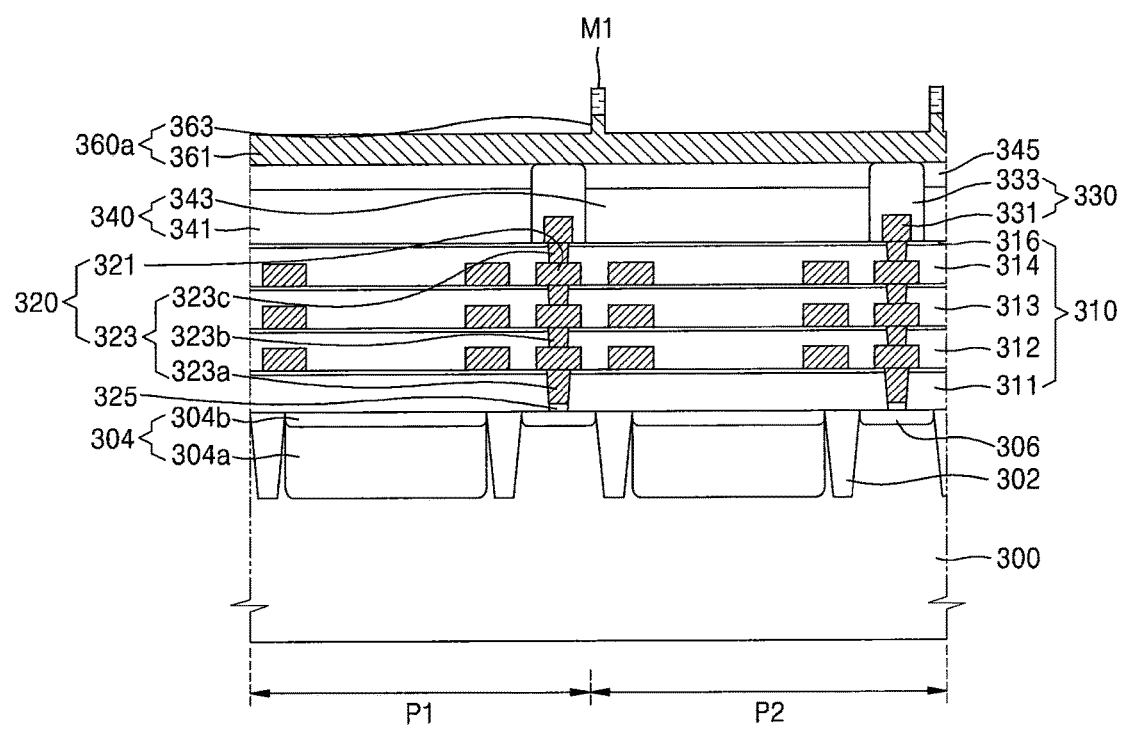

Referring to FIG. 5F, with the first photoresist layer M1 as an etching mask, a preliminary insulating layer 360a with a protruding portion 363 formed on a top thereof is formed by removing a part from a top surface of the preliminary insulating layer 360 in FIG. 5E. The preliminary insulating layer 360a may include a base portion 361 which covers the coating layer 345 and the stud layer 330 and the protruding portion 363 which protrudes from the base portion 361.

Figure 5G:
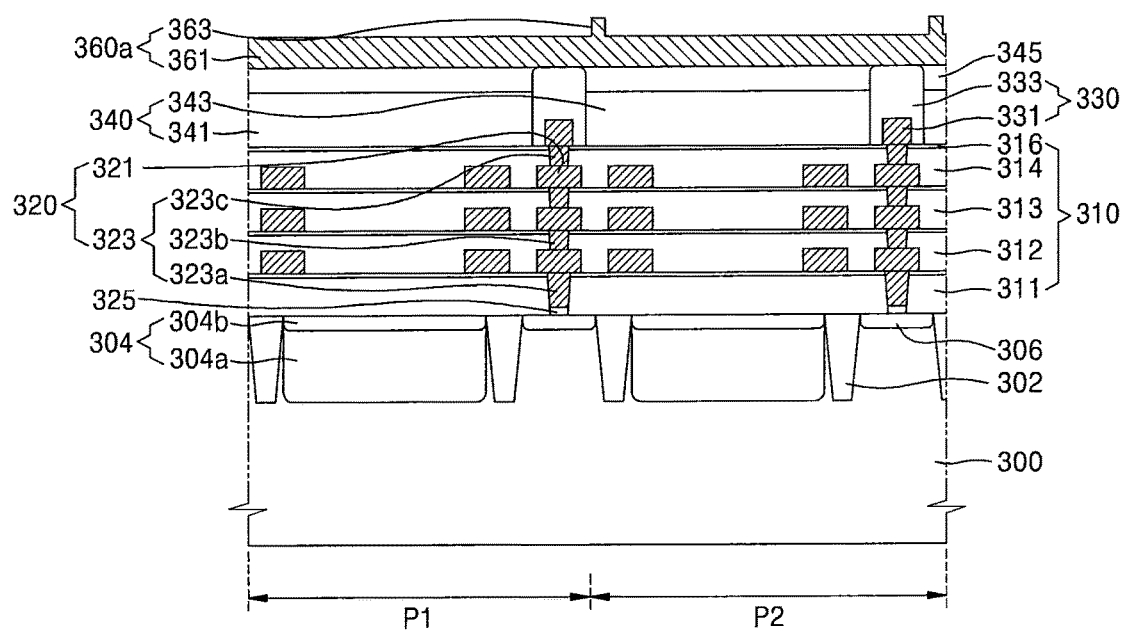

Referring to FIG. 5G, the first photoresist layer M1 in FIG. 5F is removed. The first photoresist layer M1 may be removed by an ashing process.

Figure 5H:
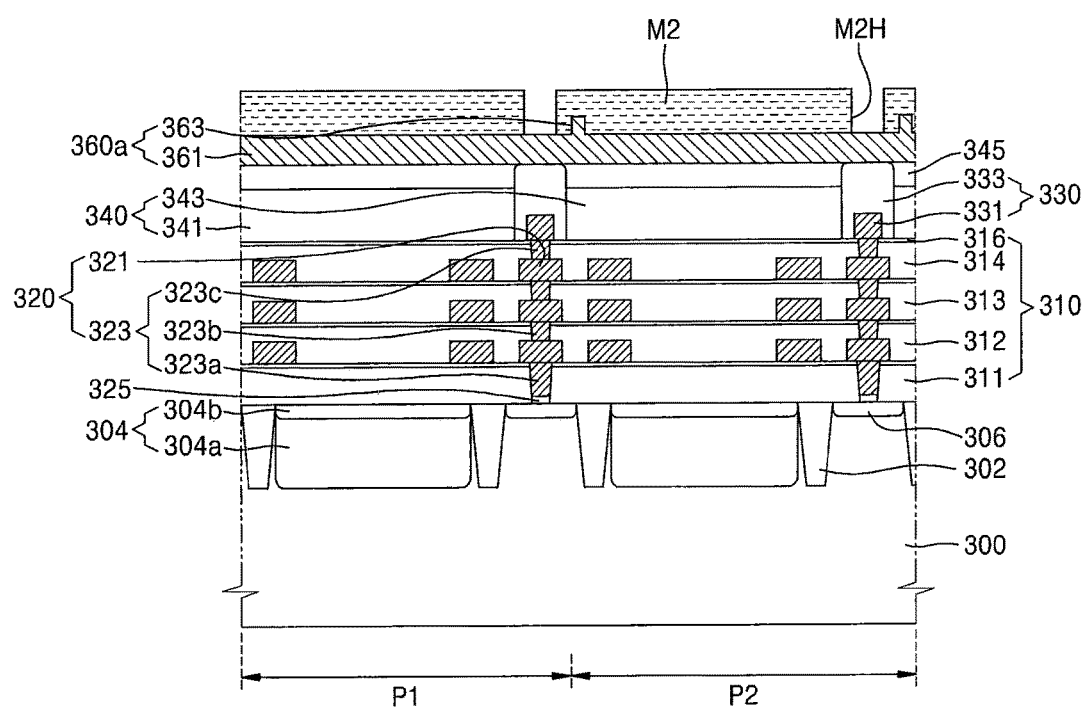

Referring to FIG. 5H, the second photoresist layer M2 with the resist hole M2H which exposes a part of the preliminary insulating layer 360a having the protruding portion 363 is formed. The resist hole M2H may be disposed at a position corresponding to the opening 362H shown in FIG. 2. The second photoresist layer M2 may cover the entire protruding portion 363.

Figure 5I:
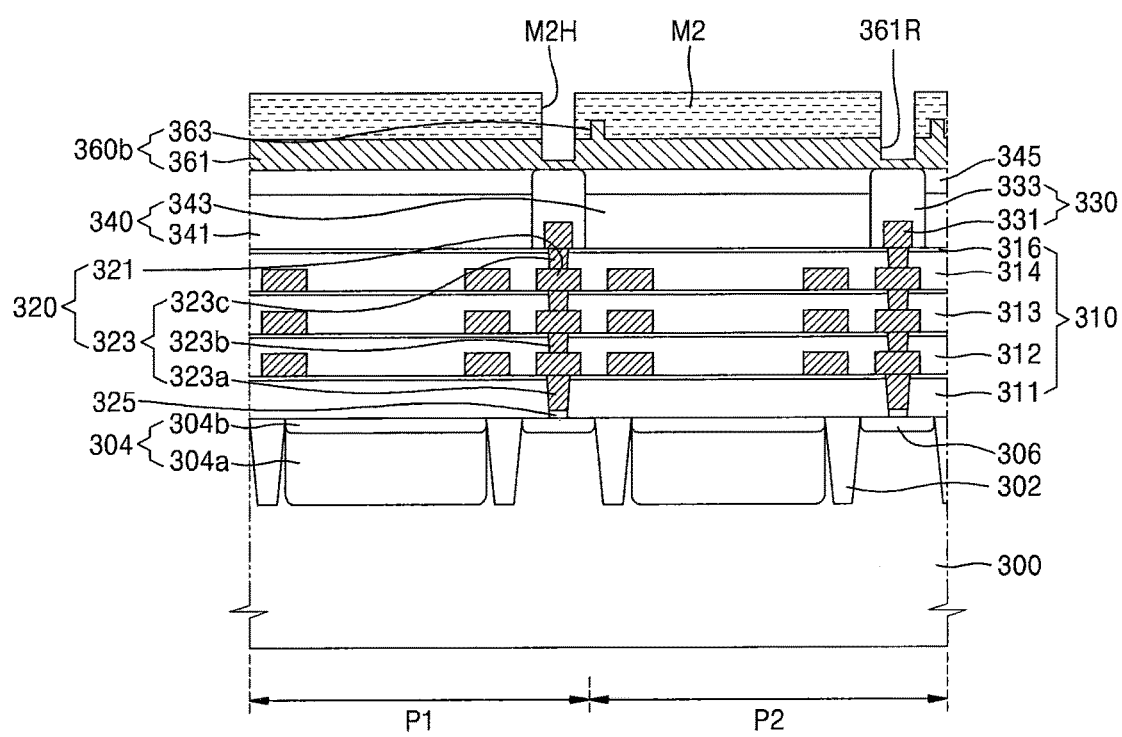

Referring to FIG. 5I, with the second photoresist layer M2 as an etching mask, a preliminary insulating layer 360b having a plurality of recessed portions 361R is formed by removing a part of the preliminary insulating layer 360a in FIG. 5H. The plurality of recessed portions 361R may be disposed at positions corresponding to the openings 362H shown in FIG. 2.

The plurality of recessed portions 361R may be formed to not completely pass through the preliminary insulating layer 360b. Accordingly, even when a misalignment occurs during a process of forming the second photoresist layer M2, the coating layer 345 may not be exposed at bottoms of the plurality of recessed portions 361R.

Figure 5J:
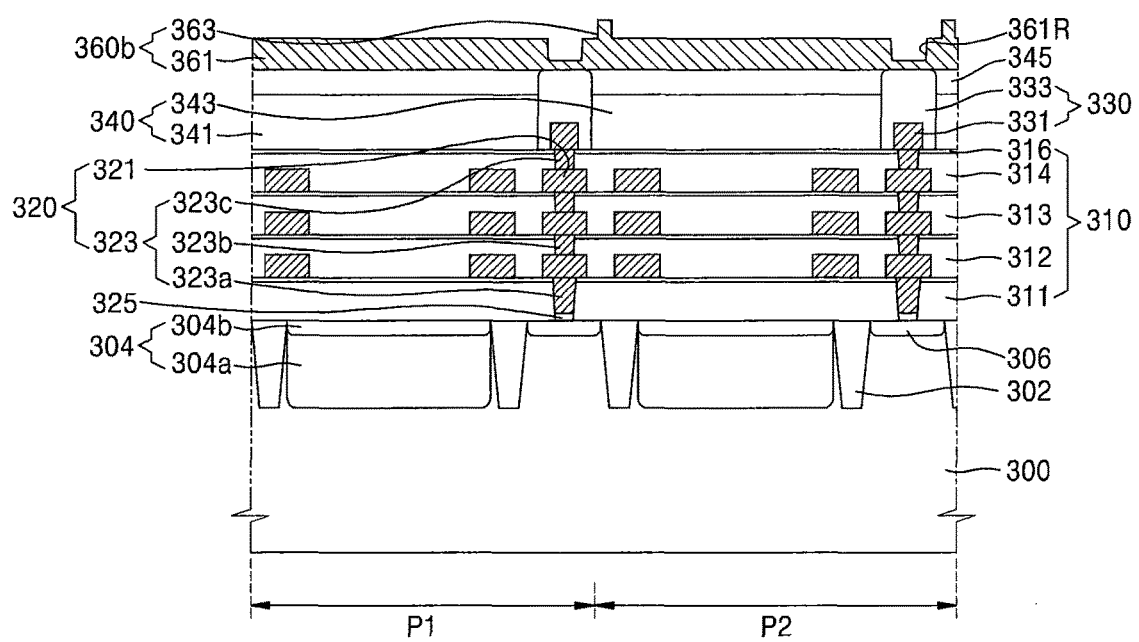

Referring to FIG. 5J, the second photoresist layer M2 in FIG. 5I is removed. The second photoresist layer M2 may be removed by an ashing process.

The coating layer 345 may have properties similar to those of the second photoresist layer M2, for example, a property of being removed by the ashing process. Accordingly, when the coating layer 345 is exposed at the bottoms of the plurality of recessed portions 361R, at least a part of the coating layer 345 may be removed during a process of removing the second photoresist layer M2. However, since the plurality of recessed portions 361R may be formed to not completely pass through the preliminary insulating layer 360b in such a way that the coating layer 345 is not exposed at the bottoms of the plurality of recessed portions 361R, it is possible to protect/prevent at least a portion of the coating layer 345 from being removed during the process of removing the second photoresist layer M2.

Figure 5K:
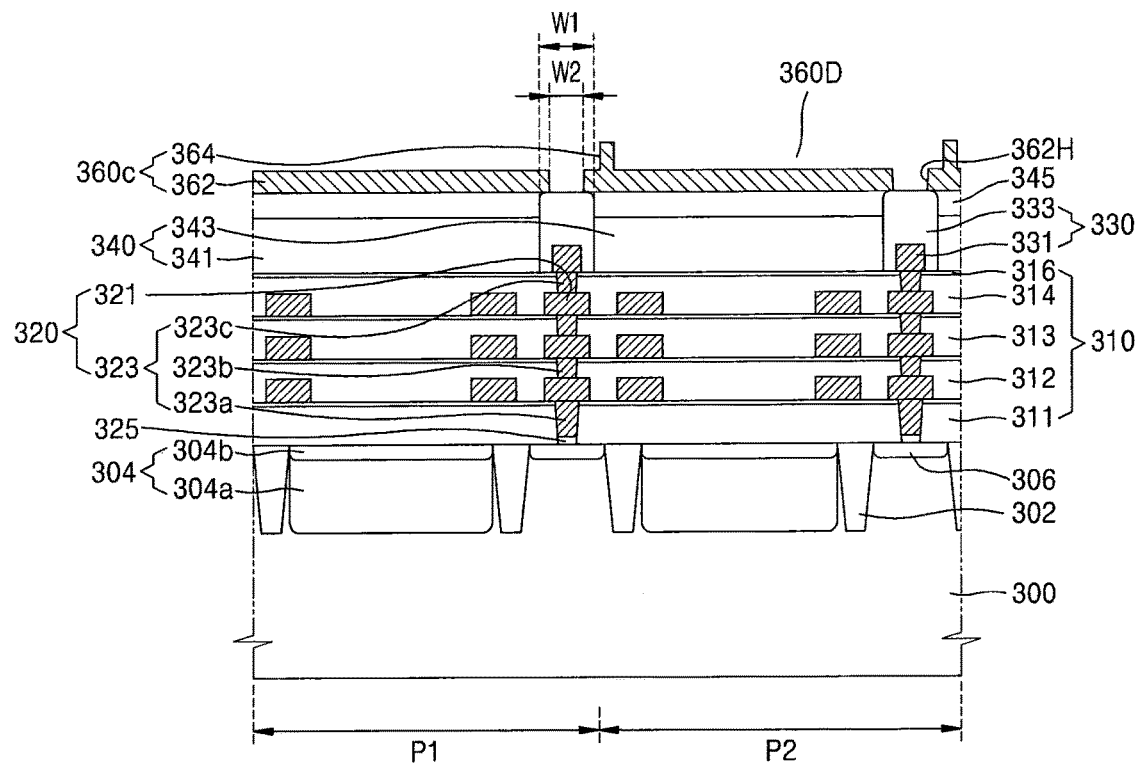

Referring to FIG. 5K, the isolation-insulating layer 360c with a plurality of openings 362H is formed by partially removing a top of the preliminary insulating layer 360b in FIG. 5J having the plurality of recessed portions 361R in FIG. 5J and the protruding portion 363. The plurality of openings 362H may be formed by removing the preliminary insulating layer 360b from the bottoms of the plurality of recessed portions 361R. The plurality of openings 362H may pass through the isolation-insulating layer 360c.

The isolation-insulating layer 360c may be formed of, for example, an oxide. The isolation-insulating layer 360c may include the base layer 362 and the isolation layer 364 formed on the base layer 362. The base layer 362 may have an opening 362H which exposes at least a portion of the stud layer 330. The isolation space 360D defined by the isolation-insulating layer 360c, that is, the base layer 362 and the isolation layer 364, may be formed. A plurality of such isolation spaces 360D may be formed to correspond to the plurality of pixel areas P1 and P2.

The isolation space 360D refers to a portion/region/area between a bottom surface level and a top surface level of the isolation-insulating layer 360c where the isolation-insulating layer 360c is not formed. That is, the isolation space 360D may include a space surrounded by the isolation layer 364 between levels of a top surface of the base layer 362 and a top surface of the isolation layer 364 and a space in the opening 362H. The plurality of isolation spaces 360D which are isolated from each other may be formed to correspond to the plurality of pixel areas P1 and P2. That is, each of the plurality of isolation spaces 360D may be formed to correspond to each of the plurality of photoelectric transducers 304.

The second width W2, which is the width of the opening 362H, may have a smaller value than that of the first width W1 of the stud layer 330. The coating layer 345 may not be exposed and a top surface thereof may be completely covered due to the isolation-insulating layer 360c having the opening 362H. That is, the top surface of the coating layer 345 may be totally covered by the isolation-insulating layer 360c so as not to exposed at a bottom of the opening 362H. However, in some embodiments, when a misalignment occurs during the process of forming the second photoresist layer M2 of FIG. 5H, a part of the coating layer 345 may be exposed at the bottom of the opening 362H.

Figure 5L:
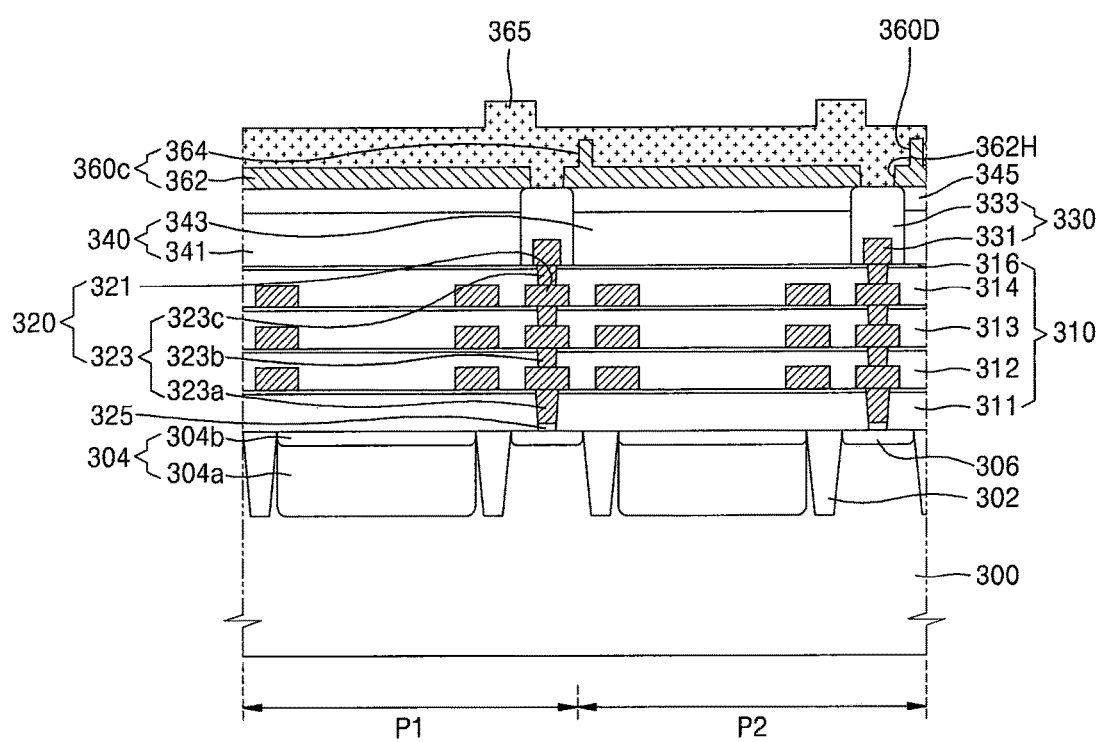

Referring to FIG. 5L, a lower transparent material layer 365 which covers a top of the isolation-insulating layer 360c to fill the isolation space 360D is formed. The lower transparent material layer 365 may be formed of, for example, ITO, IZO, ZnO, $SnO_2$, ATO, AZO, GZO, $TiO_2$, or FTO.

Figure 5M:
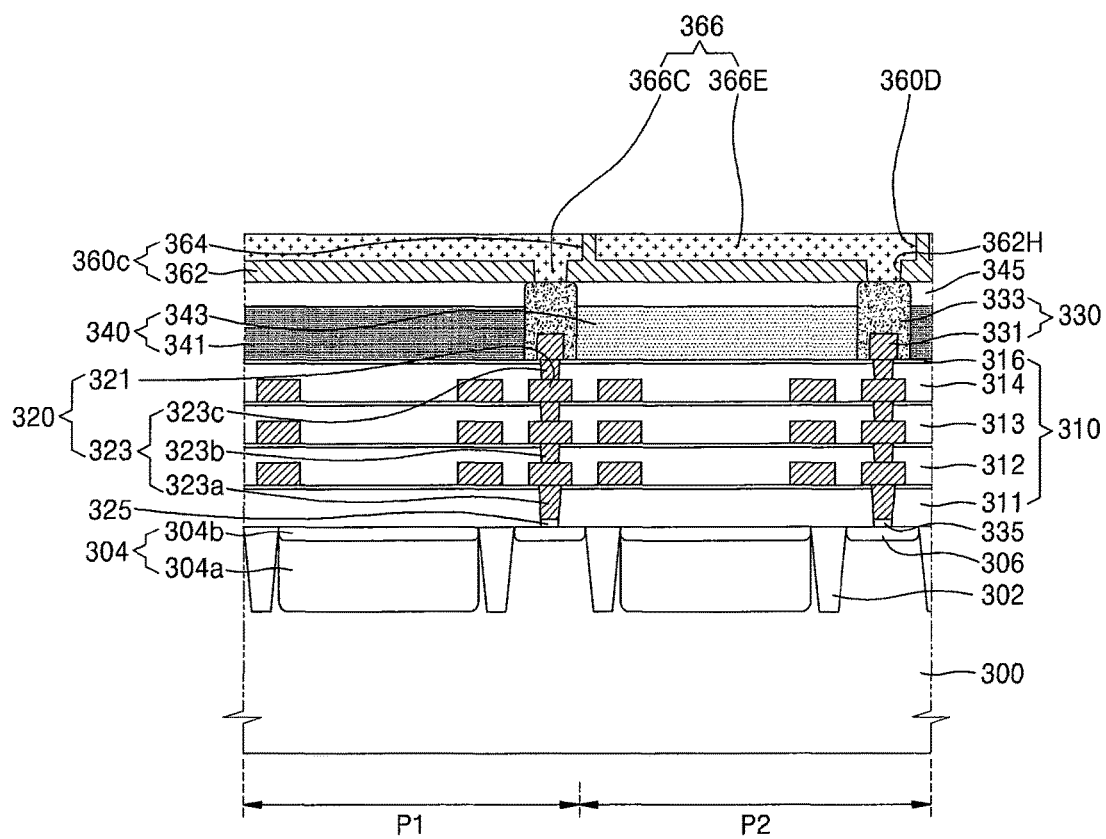

Referring to FIG. 5M, the lower transparent electrode layer 366, which fills the isolation space 360D, may be formed on the isolation-insulating layer 360c by performing a planarization process on the lower transparent material layer 365 in FIG. 5L until the isolation-insulating layer 360c, that is, the isolation layer 364, is exposed. The planarization process for forming the lower transparent electrode layer 366 may be performed by a CMP process.

The lower transparent electrode layer 366 may include the lower contact 366C, which fills an inside of the opening 362H, and the lower electrode 366E, which is connected with the lower contact 366C and disposed on the top surface of the base layer 362.

That is, the lower transparent electrode layer 366 may be formed to fill the isolation space 360D using a dual damascene method. Accordingly, the lower contact 366C and the lower electrode 366E may be integrally formed. A top surface of the lower transparent electrode layer 366 and a topmost end of the isolation-insulating layer 360c may have the same level. In particular, the top surface of the lower transparent electrode layer 366 and the top surface of the isolation layer 364 may have the same level. That is, the top surface of the lower transparent electrode layer 366 and the top surface of the isolation layer 364 may form planes with the same level (i.e., the surfaces may be coplanar).

Due to the isolation layer 364, the lower transparent electrode layer 366 may be separated to correspond to each of the first pixel area P1 and the second pixel area P2. That is, a plurality of such separated lower transparent electrode layers 366 may be formed to correspond to the plurality of pixel areas P1 and P2. In detail, the lower contact 366C and the lower electrode 366E, which form the lower transparent electrode layer 366 filling a single isolation space 360D, may be integrally formed.

When the coating layer 345 is not exposed at the bottom of the opening 362H, the coating layer 345 may be spaced apart to not be in contact with the lower transparent electrode layer 366. However, in some embodiments, when a misalignment occurs during the process of forming the second photoresist layer M2 of FIG. 5H, a part of the coating layer 345 may be in contact with the lower transparent electrode layer 366.

Figure 5N:
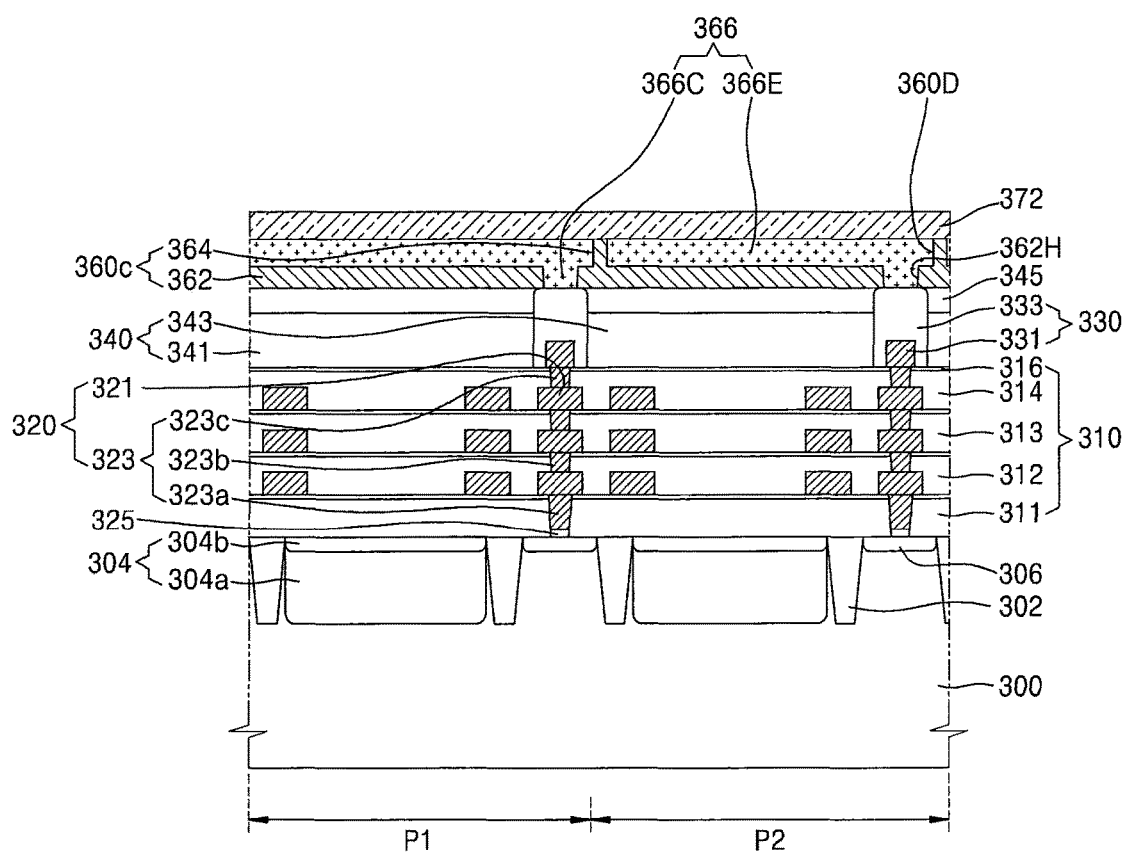
Figure 50:
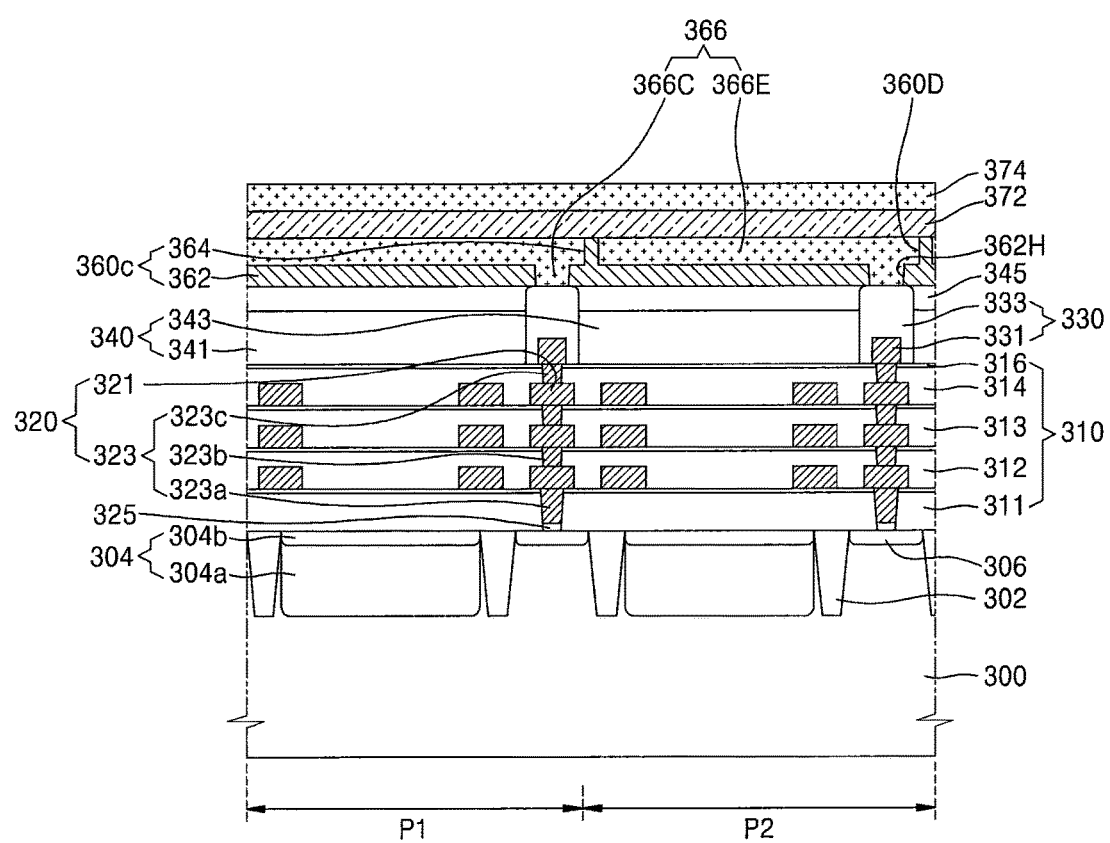

Referring to FIG. 5N, the organic photoelectric layer 372 is formed on the lower transparent electrode layer 366. The organic photoelectric layer 372 may be integrally formed on the plurality of lower transparent electrode layers 366. The organic photoelectric layer 372 may be an organic material which causes a photoelectric change only in light with a particular wavelength. For example, the organic photoelectric layer 372 may cause the photoelectric change only at a wavelength of green light. For example, the organic photoelectric layer 372 may show a maximum absorption wavelength $\lambda$max from about 500 nm to about 600 nm in both of the first and second pixel areas P1 and P2.

The organic photoelectric layer 372 may have, for example, a thickness from about 1 nm to about 500 nm. In some embodiments, the organic photoelectric layer 372 may have a thickness from about 5 nm to about 300 nm. The organic photoelectric layer 372 may have a thickness capable of effectively improving photoelectric conversion efficiency by effectively absorbing light and effectively separating and transferring positive holes and electrons.

Referring to FIG. 5O, the upper transparent electrode layer 374 is formed on the organic photoelectric layer 372. The upper transparent electrode layer 374 may be formed of, for example, ITO, IZO, ZnO, $SnO_2$, ATO, AZO, GZO, $TiO_2$, or FTO. The upper transparent electrode layer 374 may be integrally formed across the first pixel area P1 and the second pixel area P2.

After that, as shown in FIG. 2, the micro lens 380 corresponding to the color filter layer 340 is formed on the upper transparent electrode layer 374, thereby forming the image sensor 2. The micro lens 380 may be formed to overlap the corresponding color filter layer 340. A plurality of such micro lenses 380 may be formed to correspond to respective ones of the plurality of color filter layers 340. The micro lens 380 may change a path of light incident on areas except (e.g., other than) the photoelectric transducer 304, and may concentrate the light on the photoelectric transducer 304.

In some embodiments, the protective layer 378 (illustrated in FIG. 2) may be further formed between the micro lens 380 and the upper transparent electrode layer 374. The protective layer 378 may be formed of a transparent insulating material.

According to the method(s) of manufacturing the image sensor according to FIGS. 5A-5O, even when a misalignment occurs during the process of forming the second photoresist layer M2 in FIG. 5H, it is possible to protect/prevent the coating layer 345 from being damaged, and thereby a reliable image sensor may be formed.

FIGS. 6A to 6E are cross-sectional views illustrating a process of manufacturing an image sensor according to some embodiments of present inventive concepts. In particular, FIGS. 6A to 6E are cross-sectional views illustrating the process of manufacturing the image sensor 2 shown in FIG. 2. In the description of FIGS. 6A to 6E, content/descriptions duplicated with reference to FIGS. 2 and 5A to 5O may be omitted. In detail, FIGS. 6A to 6E are cross-sectional views illustrating a process after the processes shown in FIG. 5D.

Figure 6A:
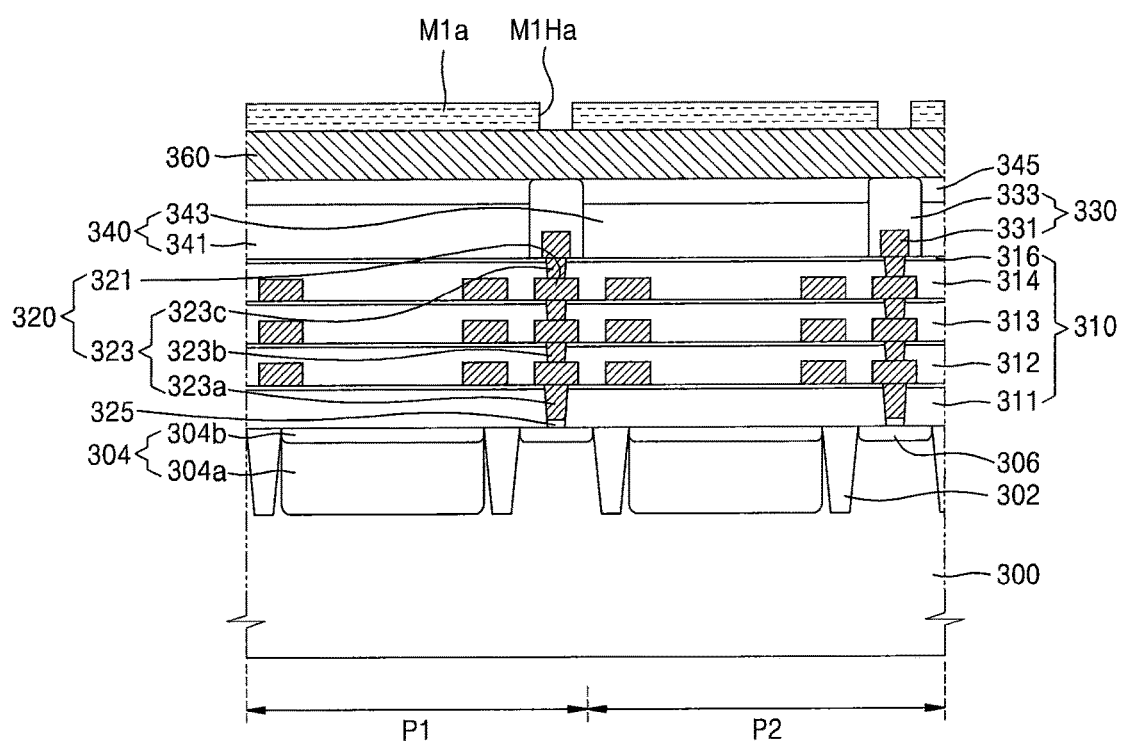
FIGS. 6A to 6E are cross-sectional views illustrating a process of manufacturing the image sensor according to some embodiments of present inventive concepts.

Referring to FIG. 6A, the first photoresist layer M1a with the resist hole M1Ha which exposes a part of the preliminary insulating layer 360 is formed on the preliminary insulating layer 360. The resist hole M1Ha may be disposed at a position corresponding to the opening 362H shown in FIG. 2.

Figure 6B:
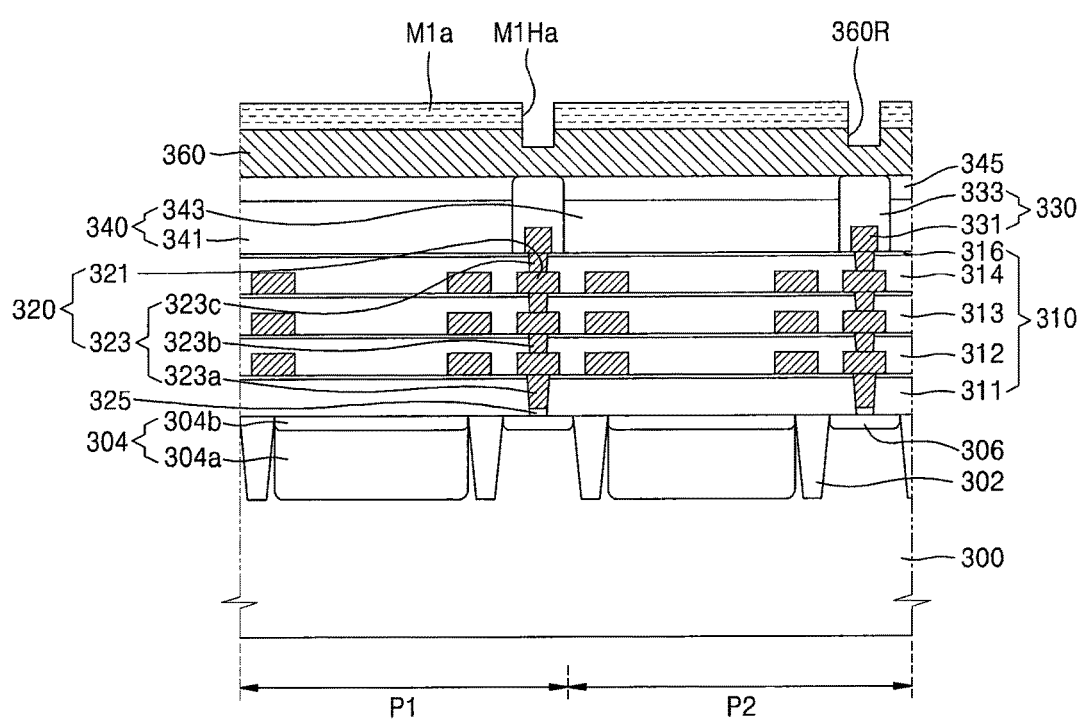

Referring to FIG. 6B, with the first photoresist layer M1a as an etching mask, a plurality of recessed portions 360R are formed by removing a portion of the preliminary insulating layer 360. The plurality of recessed portions 361R may be disposed at positions corresponding to the openings 362H shown in FIG. 2.

The plurality of recessed portions 360R may be formed to not completely pass through the preliminary insulating layer 360.

Figure 6C:
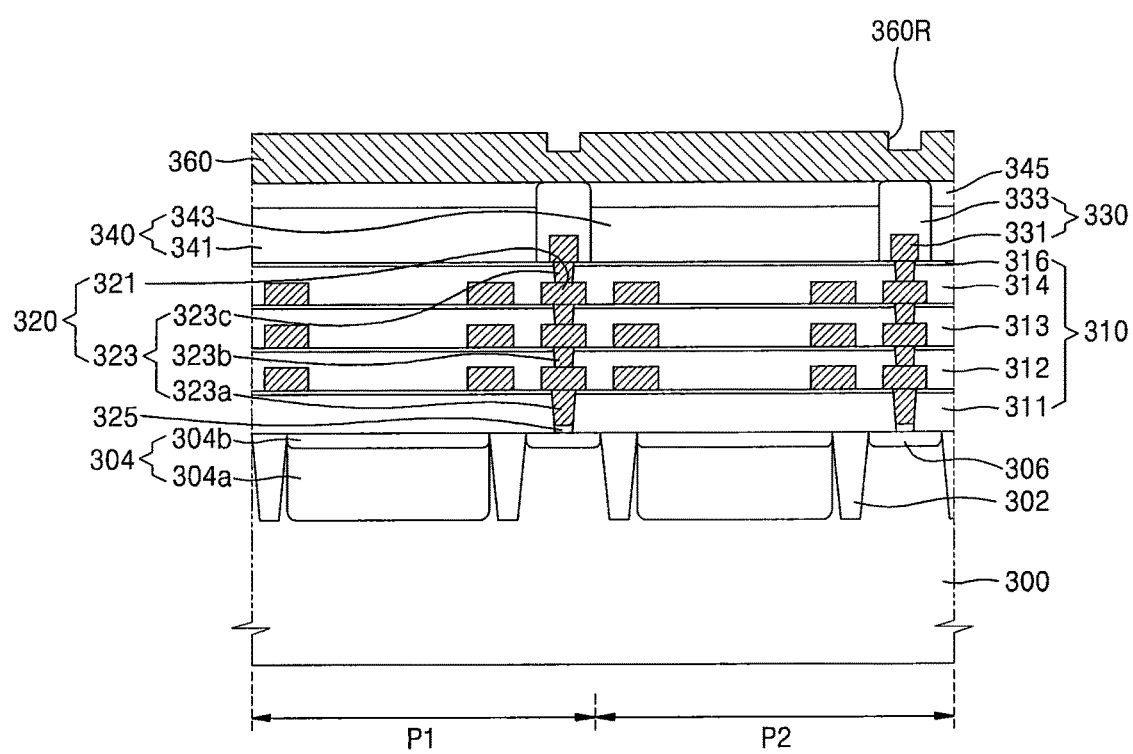

Referring to FIG. 6C, the first photoresist layer M1a in FIG. 6B is removed. The first photoresist layer M1a may be removed by an ashing process.

Figure 6D:
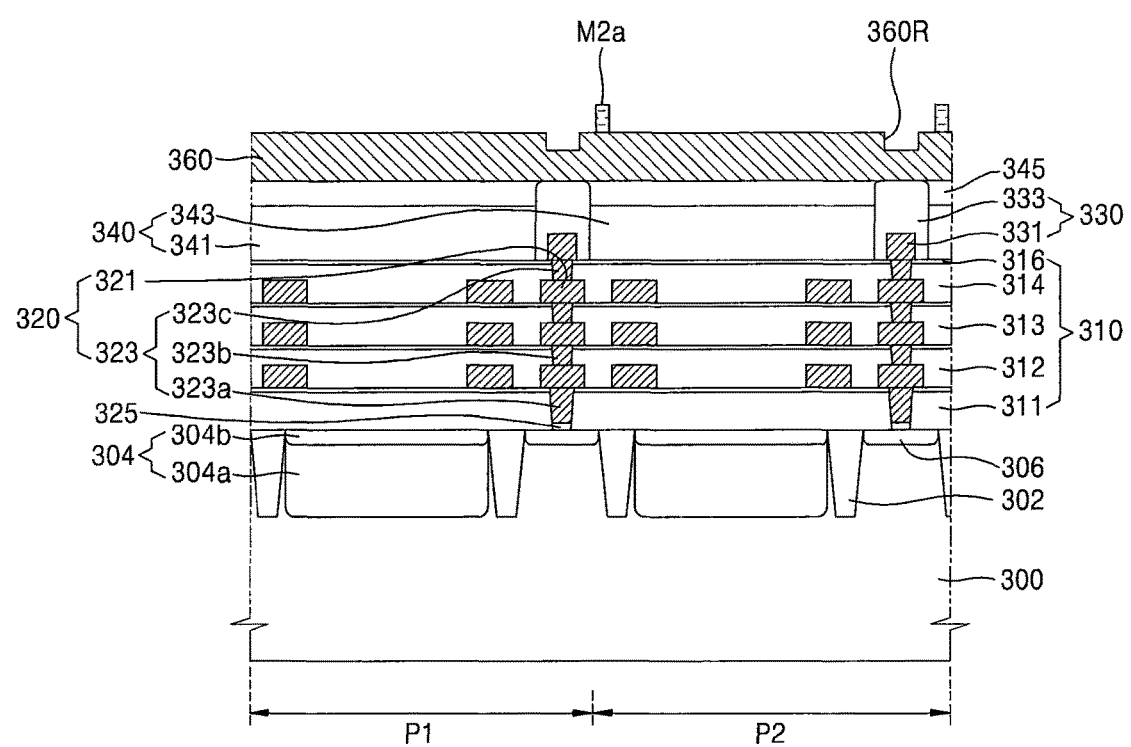

Referring to FIG. 6D, the second photoresist layer M2a is formed on the preliminary insulating layer 360. The second photoresist layer M2a may be formed at a position corresponding to the isolation layer 364 shown in FIG. 2.

Figure 6E:
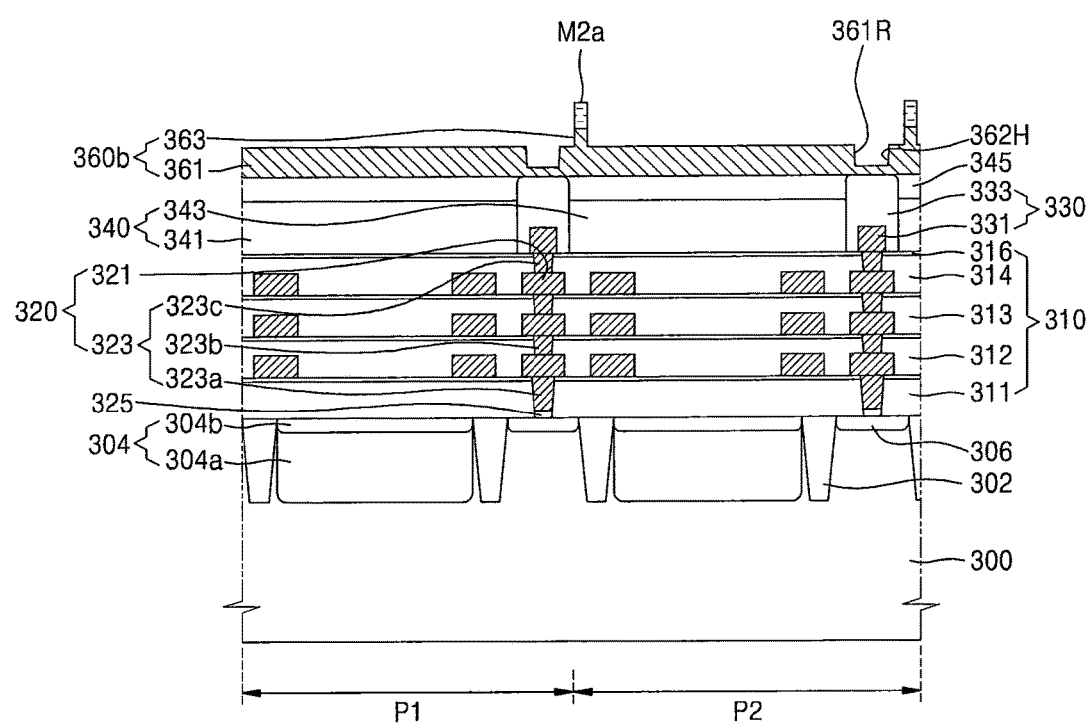

Referring to FIG. 6E, with the second photoresist layer M2a as an etching mask, the preliminary insulating layer 360b having the protruding portion 363 formed on/as a top thereof is formed by partially removing a top surface of the preliminary insulating layer 360 in FIG. 6D. The preliminary insulating layer 360b may include the base portion 361, which covers the coating layer 345 and the stud layer 330, and the protruding portion 363, which protrudes from the base portion 361. During a process of forming the protruding portion 363, the plurality of recessed portions 361R may increase in depth to be deeper than the plurality of recessed portions 360R shown in FIG. 6D.

After that, the second photoresist layer M2a is removed, and thereby the result shown in FIG. 5K may be obtained. The plurality of recessed portions 361R may be formed to not completely pass through the preliminary insulating layer 360b. Accordingly, even if a misalignment occurs during the process of forming the first photoresist layer Mia in FIG. 6A, the coating layer 345 may not be exposed at bottoms of the plurality of recessed portions 361R.

After that, the image sensor 2 shown in FIG. 2 may be formed through the processes shown in FIGS. 5L to 5O.

Figure 7:
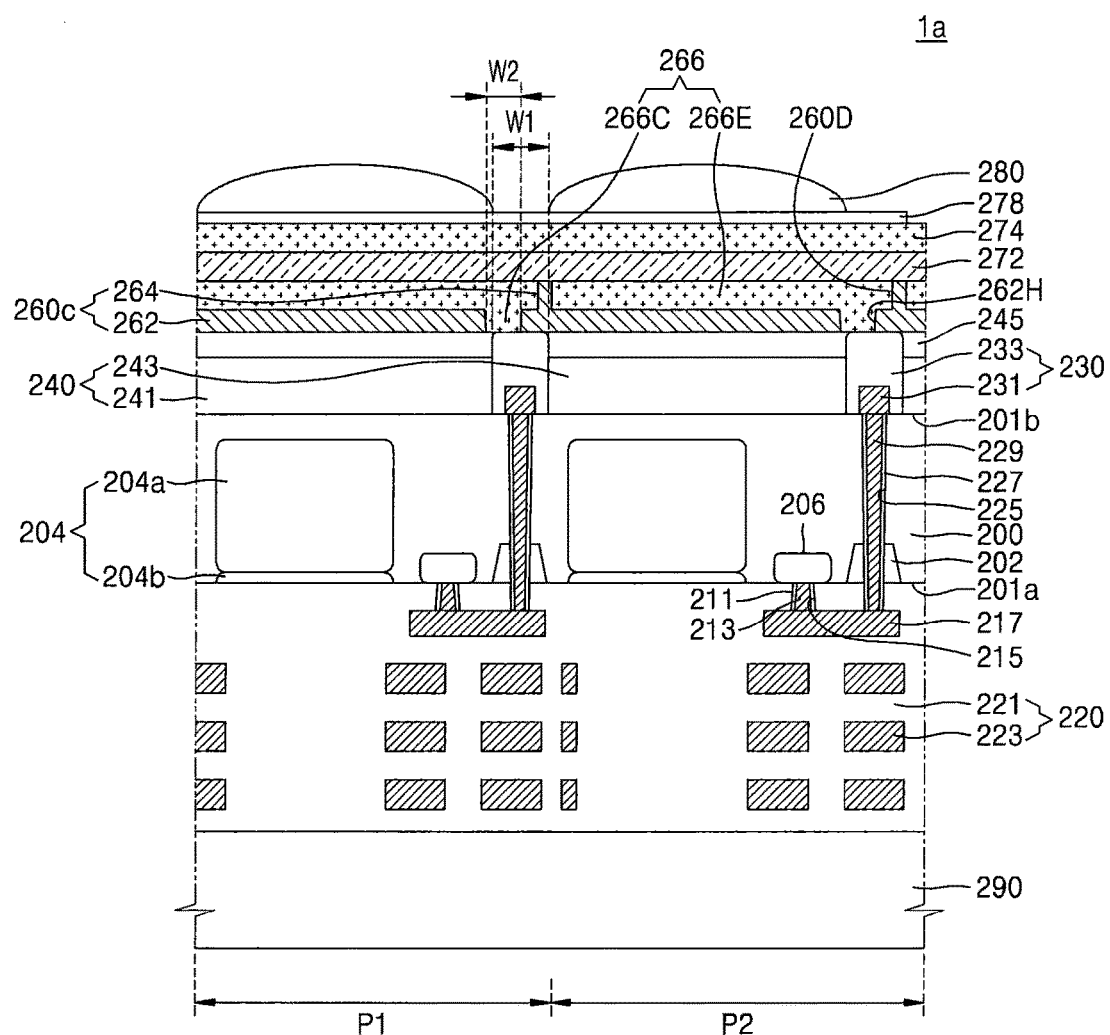
FIG. 7 is a cross-sectional view illustrating a main portion of an image sensor according to some embodiments of present inventive concepts.

FIG. 7 is a cross-sectional view illustrating a main portion of an image sensor 1a according to some embodiments of present inventive concepts. In the description of FIG. 7, content/descriptions duplicated with reference to FIG. 1 may be omitted.

Referring to FIG. 7, in the image sensor 1a, unlike the image sensor 1 shown in FIG. 1, a portion of the coating layer 245 may be in contact with the lower transparent electrode layer 266.

Like the image sensor 1 described with reference to FIGS. 3A to 4E, with the image sensor 1a according to some embodiments of present inventive concepts, even when a misalignment occurs during a process of forming a photoresist layer used for forming the isolation-insulating layer 260c, it is possible to protect/prevent the coating layer 245 from being damaged. For example, at least a portion of an oxide layer may remain on a portion of the coating layer 245 that would otherwise be exposed when a misalignment occurs when using the photoresist layer. (See, e.g., FIGS. 3K-3M.)

Figure 8:
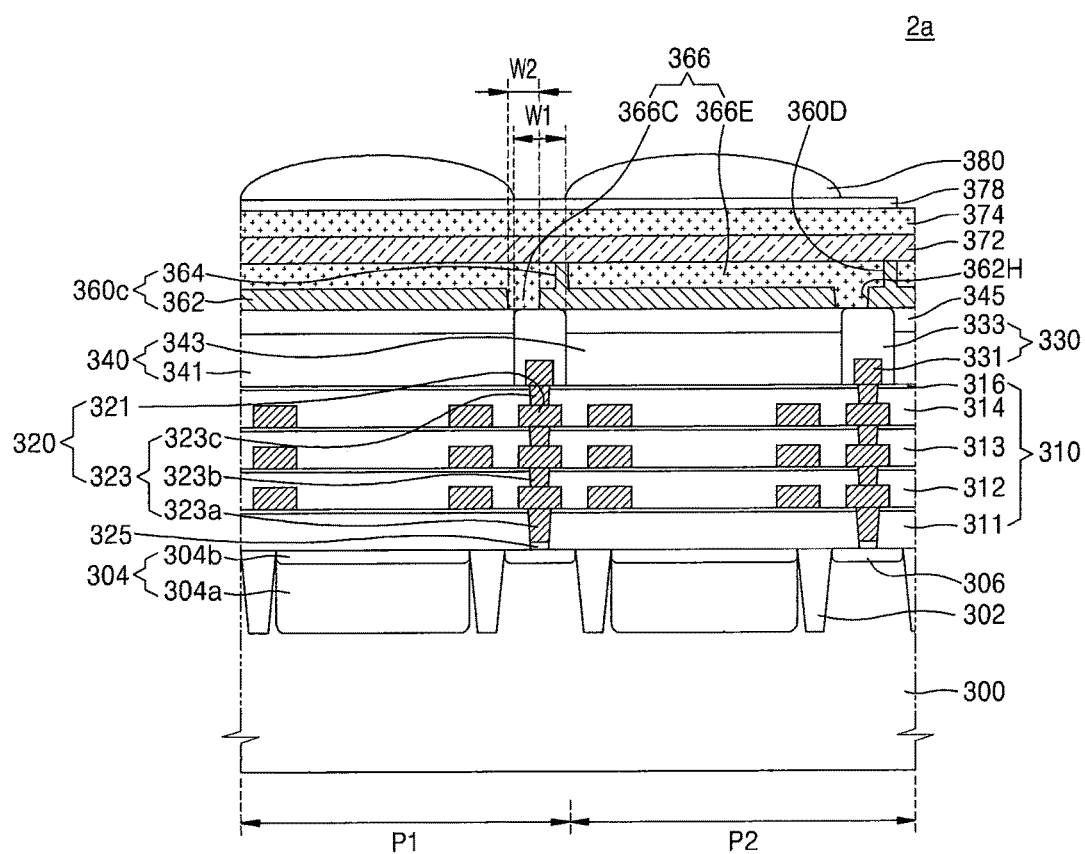
FIG. 8 is a cross-sectional view illustrating a main portion of an image sensor according to some embodiments of present inventive concepts.

FIG. 8 is a cross-sectional view illustrating a main portion of an image sensor 2a according to some embodiments of present inventive concepts. In the description of FIG. 8, content/descriptions duplicated with reference to FIG. 2 may be omitted.

Referring to FIG. 8, in the image sensor 2a, unlike the image sensor 2 shown in FIG. 2, a portion of the coating layer 345 may be in contact with the lower transparent electrode layer 366.

Like the image sensor 2 described with reference to FIGS. 5A to 6E, according to the image sensor 2a according to some embodiments of present inventive concepts, even when a misalignment occurs during a process of forming a photoresist layer used for forming the isolation-insulating layer 360c, it is possible to protect/prevent the coating layer 345 from being damaged.

Figure 9:
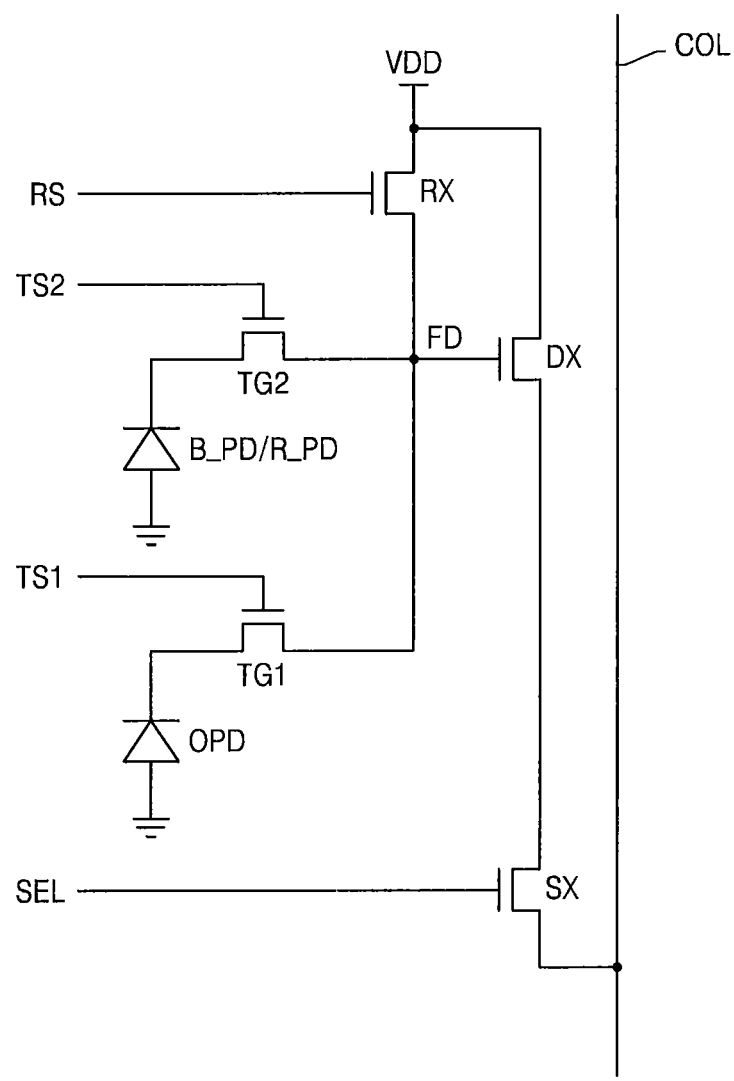
FIG. 9 illustrates a readout circuit of an image sensor according to some embodiments of present inventive concepts.

FIG. 9 is a cross-sectional view illustrating a readout circuit of an image sensor according to some embodiments of present inventive concepts. In detail, FIG. 9 illustrates the readout circuit which includes a green pixel and a red pixel of an image sensor according to some embodiments of present inventive concepts.

Referring to FIG. 9, OPD and R_PD share a single floating diffusion area FD. Also, in another example, OPD and B_PD share a single floating diffusion area FD. The floating diffusion area FD may be referred to as a floating diffusion node. When viewed from a pixel, a green pixel and a red pixel share a single floating diffusion area FD.

The readout circuit includes two transmission transistors TG1 and TG2, the floating diffusion area FD, a reset transistor RX, a drive transistor DX, and a selection transistor SX.

A first transmission transistor TG1 operates in response to a first transmission control signal TS1. A second transmission transistor TG2 operates in response to a second transmission control signal TS2. The reset transistor RX operates in response to a reset control signal RS. The selection transistor SX operates in response to a selection signal SEL.

When an activation time of the first transmission control signal TS1 and an activation time of the second transmission control signal TS2 are appropriately controlled, a signal corresponding to electrical charges generated by OPD and a signal corresponding to electrical charges generated by R_PD may be transmitted to a column line COL according to operations of the respective transistors DX and SX.

Here, OPD, R_PD, or B_PD may be embodied as a photo transistor, a photo gate, a pinned photo diode (PPD), or a combination thereof.

Figure 10:
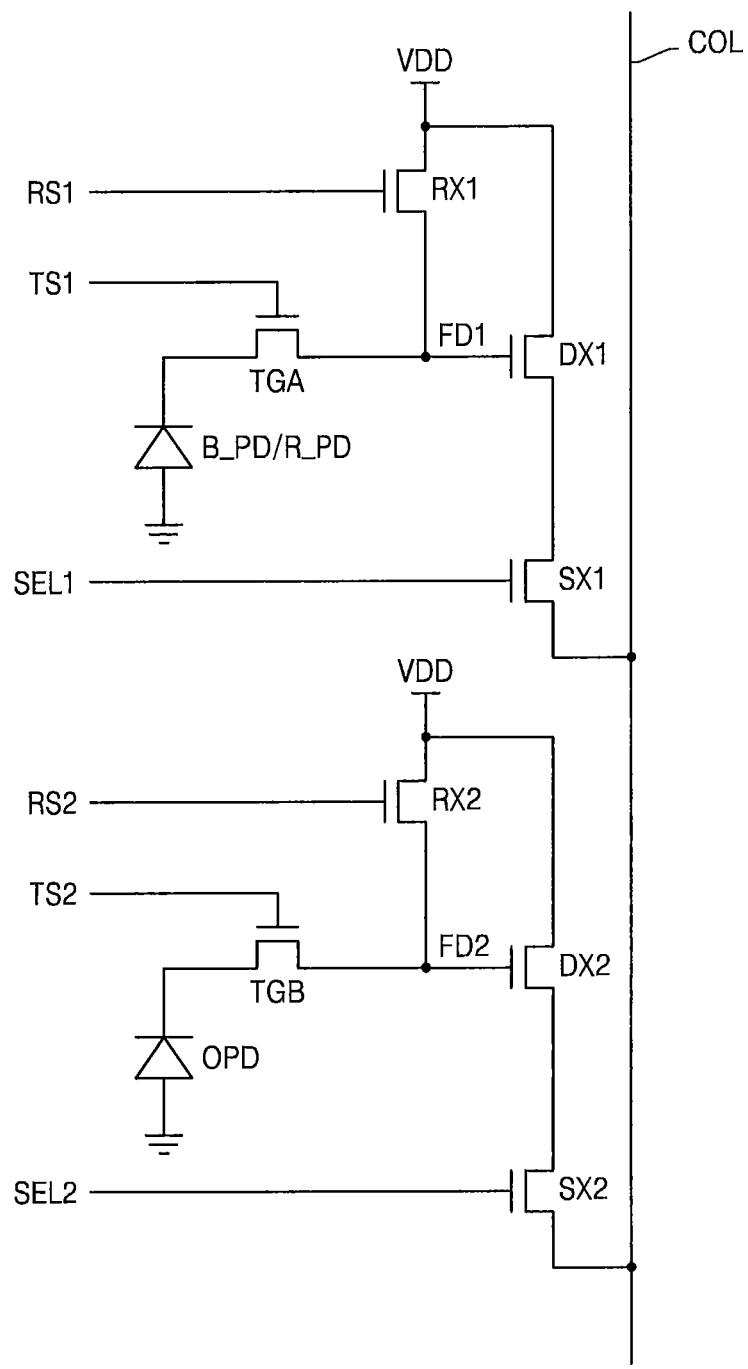
FIG. 10 illustrates a readout circuit of an image sensor according to some embodiments of present inventive concepts.

FIG. 10 is a cross-sectional view illustrating a readout circuit of an image sensor according to some embodiments of present inventive concepts. In detail, FIG. 10 illustrates the readout circuit which includes a green pixel and a red pixel of an image sensor according to some embodiments of present inventive concepts.

Referring to FIG. 10, a first readout circuit, which reads out electrical charges generated by R_PD, and a second readout circuit, which reads out electrical charges generated by OPD, are mutually separated. When viewed from a pixel, a green pixel and a red pixel are mutually separated.

The first readout circuit includes a first transmission transistor TGA, a first floating diffusion area FD1, a first reset transistor RX1, a first drive transistor DX1, and a first selection transistor SX1.

The first transmission transistor TGA operates in response to a first transmission control signal TS1. The first reset transistor RX1 operates in response to a first reset control signal RS1. The first selection transistor SX1 operates in response to a first selection signal SEL1.

The second readout circuit includes a second transmission transistor TGB, a second floating diffusion area FD2, a second reset transistor RX2, a second drive transistor DX2, and a second selection transistor SX2.

The second transmission transistor TGB operates in response to a second transmission control signal TS2. The second reset transistor RX2 operates in response to a second reset control signal RS2. The second selection transistor SX2 operates in response to a second selection signal SEL2.

When an activation time of the first transmission control signal TS1 and an activation time of the second transmission control signal TS2 are appropriately controlled, a signal corresponding to electric charges generated by OPD and a signal corresponding to electrical charges generated by R_PD may be transmitted to a column line COL according to operations of the respective transistors DX1, SX1, DX2, and SX2.

Figure 11:
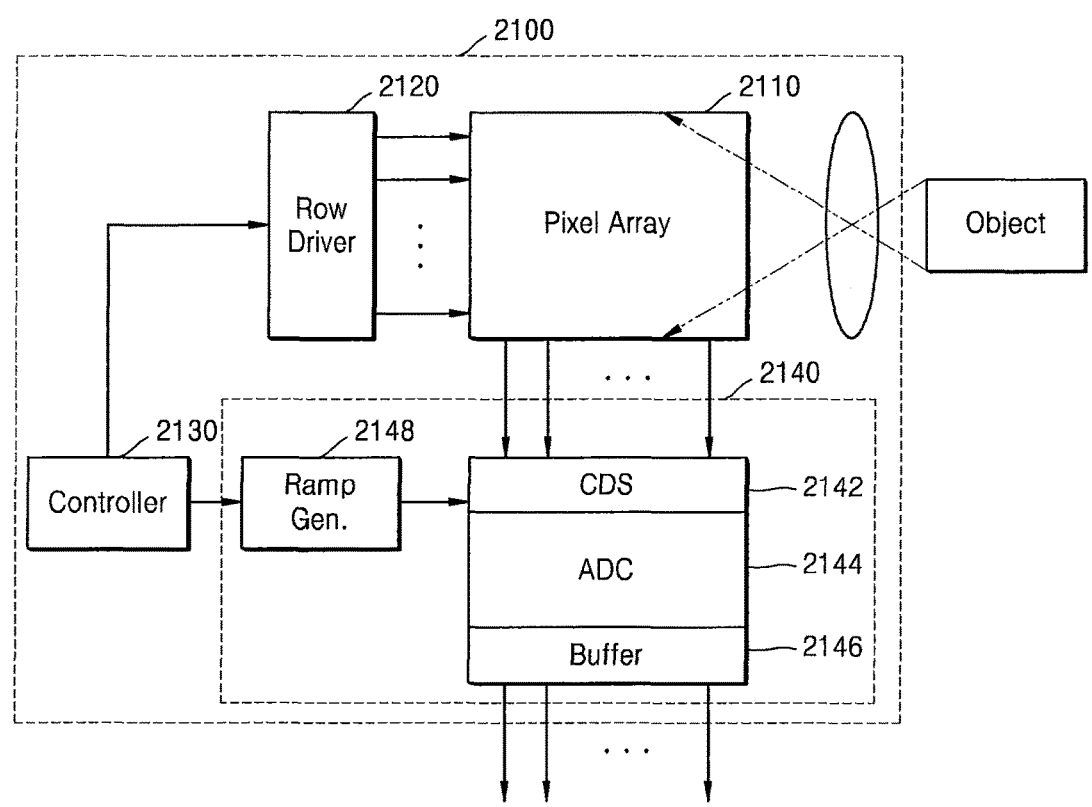
FIG. 11 is a block diagram illustrating a configuration of an image sensor according to some embodiments of present inventive concepts.

FIG. 11 is a block diagram illustrating a configuration of an image sensor 2100 according to some embodiments of present inventive concepts.

Referring to FIG. 11, the image sensor 2100 may include a pixel array 2110, a controller 2130, a row driver 2120, and a pixel signal processor 2140. The image sensor 2100 includes at least one of the image sensors 1, 1a, 2, and 2a described with reference to FIGS. 1 to 8.

The pixel array 2110 may include a plurality of unit pixels two-dimensionally arranged. The unit pixel may include a photoelectric transducer. The photoelectric transducer may generate charges by absorbing light. An electrical signal (an output voltage) according to the generated charges may be provided to the pixel signal processor 2140 through a vertical signal line. The unit pixels included in the pixel array 2110 may provide output voltages one at a time by row. Accordingly, the unit pixels in one row of the pixel array 2110 may be activated at the same time by a selection signal output by the row driver 2120. The unit pixels in a selected row may provide output voltages according to absorbed light to an output line of a corresponding column.

The controller 2130 may control the row driver 2120 to allow the pixel array 2110 to accumulate charges by absorbing light, to temporarily store the accumulated charges, and to output an electrical signal according to the stored charges from the pixel array 2110 to the outside (e.g., external to the image sensor 2100). Also, the controller 2130 may control the pixel signal processor 2140 to measure the output voltage provided by the pixel array 2110.

The pixel signal processor 2140 may include a correlated double sampler (CDS) 2142, an analog-digital converter (ADC) 2144, and a buffer 2146. The CDS 2142 may sample and hold the output voltage provided by the pixel array 2110. The CDS 2142 may double sample a level of noise and a level according to a generated output voltage, and may output a level corresponding to a difference therebetween. Also, the CDS 2142 may receive a ramp signal generated by a ramp signal generator 2148 and compare the ramp signals, and thereby a comparison result may be output.

The ADC 2144 may convert an analog signal corresponding to the level received from the CDS 2142 into a digital signal. The buffer 2146 may latch the digital signal. The latched signal is sequentially output from the image sensor 2100 to the outside (e.g., external to the image sensor 2100) to be transferred to an image processor.

Figure 12:
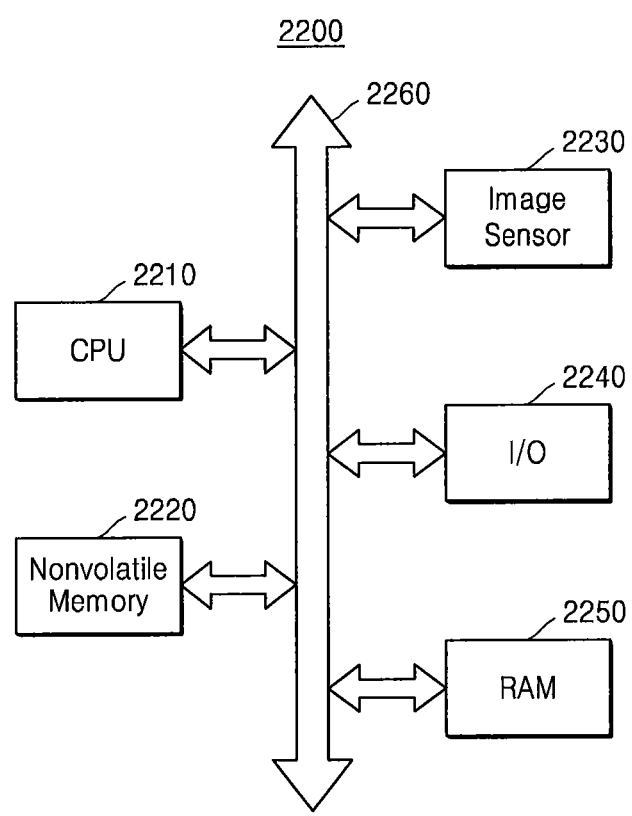
FIG. 12 is a block diagram of a system including an image sensor according to some embodiments of present inventive concepts.

FIG. 12 is a block diagram of a system 2200 including an image sensor according to some embodiments of present inventive concepts.

Referring to FIG. 12, the system 2200 may be one of various systems which need data, such as a computing system, a camera system, a scanner, a vehicular navigation system, a video phone, a security system, and a motion-detection system.

The system 2200 may include a central processing unit (CPU) (or a processor) 2210, a nonvolatile memory 2220, an image sensor 2230, an input/output device 2240, and a random-access memory (RAM) 2250. The CPU 2210 may communicate with the nonvolatile memory 2220, the image sensor 2230, the input/output device 2240, and the RAM 2250 through a bus 2260. The image sensor 2230 may be provided as an independent semiconductor chip or may be integrated with the CPU 2210 to be provided as a single semiconductor chip. The image sensor 2230 includes at least one of the image sensors 1, 1a, 2, and 2a described with reference to FIGS. 1 to 8.

Figure 13:
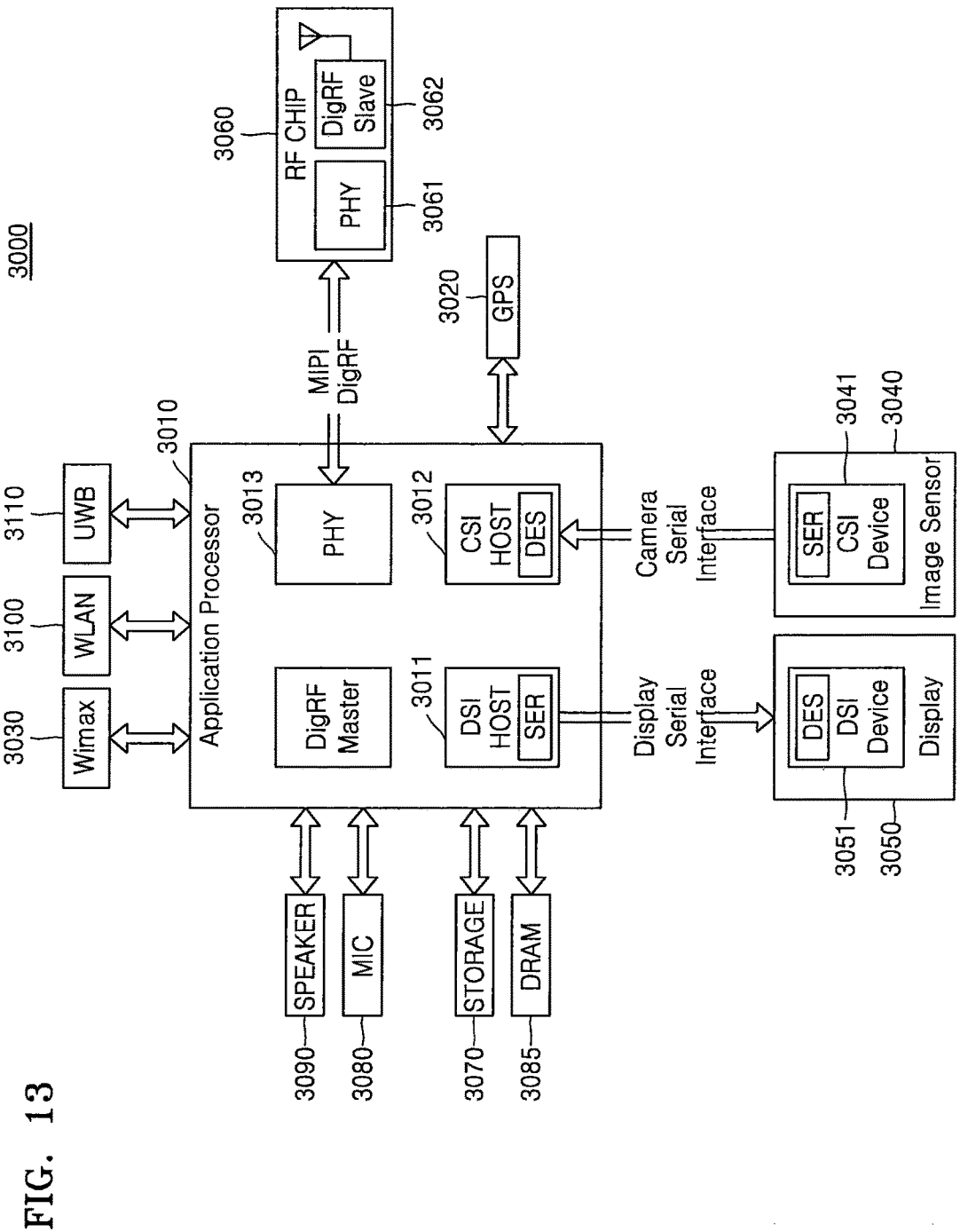
FIG. 13 illustrates an electronic system including an image sensor and an interface according to some embodiments of present inventive concepts.

FIG. 13 illustrates an electronic system 3000 including an image sensor 3040 and an interface according to some embodiments of present inventive concepts.

Referring to FIG. 13, the electronic system 3000 may be provided as a data processor capable of using or supporting a mobile industry processor interface (MIPI), for example, a mobile phone, a personal digital assistant (PDA), a portable multimedia player (PMP), or a smart phone. The electronic system 3000 may include an application processor 3010, the image sensor 3040, and a display 3050. The image sensor 3040 includes at least one of the image sensors 1, 1a, 2, and 2a described with reference to FIGS. 1 to 8.

A camera serial interface (CSI) host 3012 provided in the application processor 3010 may serially communicate with a CSI device 3041 of the image sensor 3040 via a CSI. Here, for example, an optical deserializer (DES) may be provided in the CSI host 3012, and an optical serializer (SER) may be provided in the CSI device 3041.

A display serial interface (DSI) host 3011 provided in the application processor 3010 may serially communicate with a DSI device 3051 of the display 3050 via a DSI. Here, for example, an optical serializer may be provided in the DSI host 3011, and an optical deserializer may be provided in the DSI device 3051.

The electronic system 3000 may further include a radio frequency (RF) chip 3060 capable of communicating with the application processor 3010. A physical layer (PHY) 3013 of the electronic system 3000 and a PHY 3061 of the RF chip 3060 may transmit and receive data according to a MIPI DigRF.

The electronic system 3000 may further include a global positioning system (GPS) 3020, a storage 3070, a microphone (MIC) 3080, a dynamic RAM (DRAM) 3085, and a speaker 3090. The electronic system 3000 may communicate using Wimax 3030, a wireless local area network (WLAN) 3100, ultra wideband (UWB) 3110, etc.

Figure 14:
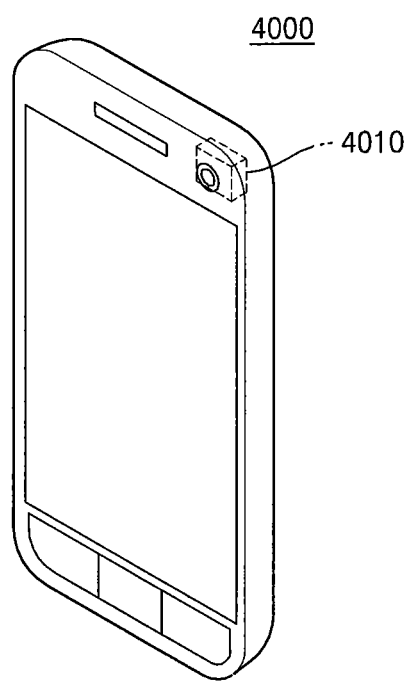
FIG. 14 is a perspective view schematically illustrating an electronic system to which an image sensor is applied according to some embodiments of present inventive concepts.

FIG. 14 is a perspective view schematically illustrating an electronic system to which an image sensor 4010 is applied according to some embodiments of present inventive concepts.

FIG. 14 illustrates an example of applying the electronic system 3000 to a mobile phone 4000. The mobile phone 4000 may include the image sensor 4010. The image sensor 4010 includes at least one of the image sensors 1, 1a, 2, and 2a described with reference to FIGS. 1 to 8.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. An image sensor comprising:
    a semiconductor substrate comprising a photoelectric transducer;
    a color filter layer on the semiconductor substrate;
    a metal structure on the semiconductor substrate and adjacent a sidewall of the color filter layer;
    an insulating layer on the color filter layer; and
    a transparent electrode layer on a first surface of the insulating layer, in an opening of a second surface of the insulating layer that is opposite the first surface and closer than the first surface to the semiconductor substrate, and connected to the metal structure through the opening of the insulating layer.

2. The image sensor of claim 1, further comprising a transparent layer on the color filter layer, wherein the insulating layer is between respective portions of the transparent layer and the transparent electrode layer, and wherein the opening of the insulating layer is free of the metal structure.

3. The image sensor of claim 2, wherein the respective portion of the transparent layer comprises a first portion, and wherein the transparent electrode layer contacts a second portion of the transparent layer through the opening of the insulating layer.

4. The image sensor of claim 1, further comprising an organic photoelectric layer on the transparent electrode layer, wherein the insulating layer comprises a protruding portion thereof that protrudes toward the organic photoelectric layer.

5. The image sensor of claim 4, wherein the second surface of the insulating layer comprises a lowermost surface of the insulating layer, and wherein the protruding portion of the insulating layer:
comprises an uppermost, third surface of the insulating layer that is coplanar with an uppermost surface of the transparent electrode layer; and
overlaps the color filter layer.

6. The image sensor of claim 1, wherein the metal structure comprises:
a tungsten portion; and
an aluminum portion on the tungsten portion, wherein the transparent electrode layer contacts the aluminum portion.

7. The image sensor of claim 6, wherein sidewalls of the aluminum portion of the metal structure are tapered toward the transparent electrode layer.

8. The image sensor of claim 1, wherein the metal structure comprises tungsten that contacts the transparent electrode layer.

9. The image sensor of claim 1, wherein the insulating layer overlaps at least one sidewall of the metal structure, and wherein a first width of the metal structure is wider than a second width of the opening through which the transparent electrode layer connects to the metal structure.

10. The image sensor of claim 1, further comprising a metal contact in the semiconductor substrate, wherein:
the metal structure contacts the metal contact;
the metal structure comprises different first and second metallic materials;
the first metallic material contacts the metal contact; and
the second metallic material:
is between the first metallic material and the transparent electrode layer; and
is wider than the first metallic material.

11. The image sensor of claim 10, wherein the second metallic material is on opposing first and second sidewalls of the first metallic material, and wherein the metal contact and/or the metal structure comprises a tapered width.

12. The image sensor of claim 1, wherein:

the color filter layer and the photoelectric transducer comprise a first color filter layer and a first photoelectric transducer, respectively;

the image sensor further comprises a second color filter layer on a second photoelectric transducer;

the metal structure is between the first and second color filter layers; and the image sensor further comprises a transparent organic layer between the first color filter layer and a first portion of the insulating layer and between the second color filter layer and a second portion of the insulating layer.

13. The image sensor of claim 12, wherein a surface of the transparent organic layer is coplanar with a surface of the metal structure that contacts the transparent electrode layer.

14. The image sensor of claim 12, further comprising an organic photoelectric layer on the transparent electrode layer, wherein the second portion of the insulating layer comprises a protruding portion thereof that protrudes toward the organic photoelectric layer and isolates a first portion of the transparent electrode layer that is on the first color filter layer from a second portion of the transparent electrode layer that is on the second color filter layer.

15. The image sensor of claim 12, wherein the transparent electrode layer contacts a portion of the transparent organic layer through the opening of the insulating layer.

16. The image sensor of claim 1, wherein the insulating layer overlaps opposing first and second sidewalls of the metal structure.

17. An image sensor comprising:
a color filter layer;
a metal structure adjacent a sidewall of the color filter layer;
a transparent layer on the color filter layer;
an insulating layer on the transparent layer, wherein the transparent layer is between the color filter layer and the insulating layer, and wherein the insulating layer overlaps at least one sidewall of the metal structure; and
an electrode layer on the insulating layer, wherein the insulating layer is between respective portions of the transparent layer and the electrode layer.

18. The image sensor of claim 17, wherein:
a surface of the transparent layer facing the insulating layer is coplanar with a surface of the metal structure;
the image sensor further comprises an organic photoelectric layer on the electrode layer;
the electrode layer is connected to the metal structure through an opening of the insulating layer; and
a first width of the metal structure is wider than a second width of the opening through which the electrode layer connects to the metal structure.

19. An image sensor comprising:
first and second color filter layers;
a metal structure between respective sidewalls of the first and second color filter layers;
an insulating layer on the first and second color filter layers;
an electrode layer on the insulating layer; and
an organic photoelectric layer on the electrode layer,
wherein the insulating layer comprises a base portion and a protruding portion that protrudes from the base portion toward the organic photoelectric layer,
wherein the electrode layer is connected to the metal structure through an opening of the base portion of the insulating layer, and
wherein the electrode layer is on:
a sidewall of the base portion of the insulating layer; and
a sidewall of the protruding portion of the insulating layer.

20. The image sensor of claim 19, wherein:
the image sensor further comprises a transparent organic layer between the first color filter layer and the insulating layer and between the second color filter layer and the insulating layer;
the insulating layer is on a portion of the metal structure;
the protruding portion of the insulating layer isolates a first portion of the electrode layer that is on the first color filter layer from a second portion of the electrode layer that is on the second color filter layer;
a first width of the metal structure is wider than a second width of the opening through which the electrode layer connects to the metal structure; and
a continuous portion of the electrode layer contacts:
the organic photoelectric layer;
the sidewall of the protruding portion of the insulating layer; and
the metal structure.

* * * * *